(12) United States Patent
Kusumi et al.

(10) Patent No.: US 6,784,040 B2
(45) Date of Patent: Aug. 31, 2004

(54) NONVOLATILE SEMICONDUCTOR MEMORY DEVICE AND METHOD FOR FABRICATING THE SAME

(75) Inventors: Masataka Kusumi, Osaka (JP); Fumihiko Noro, Kyoto (JP); Hiromasa Fujimoto, Kyoto (JP); Akihiro Kamada, Osaka (JP); Shinji Odanaka, Osaka (JP); Seiki Ogura, Wappingers Falls, NY (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/382,508

(22) Filed: Mar. 7, 2003

(65) Prior Publication Data

US 2003/0173616 A1 Sep. 18, 2003

Related U.S. Application Data

(62) Division of application No. 09/897,417, filed on Jul. 3, 2001, now Pat. No. 6,545,312.

(30) Foreign Application Priority Data

Jul. 3, 2000 (JP) ........................................ 2000-200579

(51) Int. Cl.$^7$ .............................................. H01L 29/788
(52) U.S. Cl. ...................... 438/201; 438/211; 438/260
(58) Field of Search ................................. 438/201, 216, 438/260, 261, 266, 257, 591, 593; 439/211

(56) References Cited

U.S. PATENT DOCUMENTS 5,278,087 A    1/1994    Jenq

| 6,242,774 | B1 | 6/2001 | Sung |
|---|---|---|---|
| 6,358,799 | B2 | 3/2002 | Odanaka et al. |
| 6,365,459 | B1 | 4/2002 | Leu |
| 6,462,374 | B2 | 10/2002 | Usuki et al. |
| 6,545,312 | B2 * | 4/2003 | Kusumi et al. ............. 257/315 |
| 6,642,572 | B2 * | 11/2003 | Kusumi et al. ............. 257/315 |

FOREIGN PATENT DOCUMENTS

| EP | 0 718 895 | 6/1996 |
|---|---|---|
| EP | 0 935 293 | 8/1999 |
| JP | 3033748 | 2/2000 |
| JP | 2001-057394 | 2/2001 |

OTHER PUBLICATIONS

Nobuo Tokai et al., "Oxidation of Silicon by In–situ Steam Generation (ISSG) and Reaction Mechanism", Japan Society of Applied Physics, pp. 127–132, 2000.

* cited by examiner

Primary Examiner—Roy Potter
(74) Attorney, Agent, or Firm—McDermott, Will & Emery

(57) ABSTRACT

A nonvolatile semiconductor memory device has a protective insulating film deposited on each of the side surfaces of a control gate electrode to protect the control gate electrode during the formation of a floating gate electrode, the floating gate electrode opposed to one of the side surfaces of the control gate electrode with the protective insulating film interposed therebetween so as to be capacitively coupled to the control gate electrode, a tunnel insulating film formed between the floating gate electrode and the semiconductor substrate, a drain region formed in a region of the semiconductor substrate containing a portion underlying the floating gate electrode, and a source region formed in a region of the semiconductor substrate opposite to the drain region relative to the control gate electrode.

59 Claims, 52 Drawing Sheets

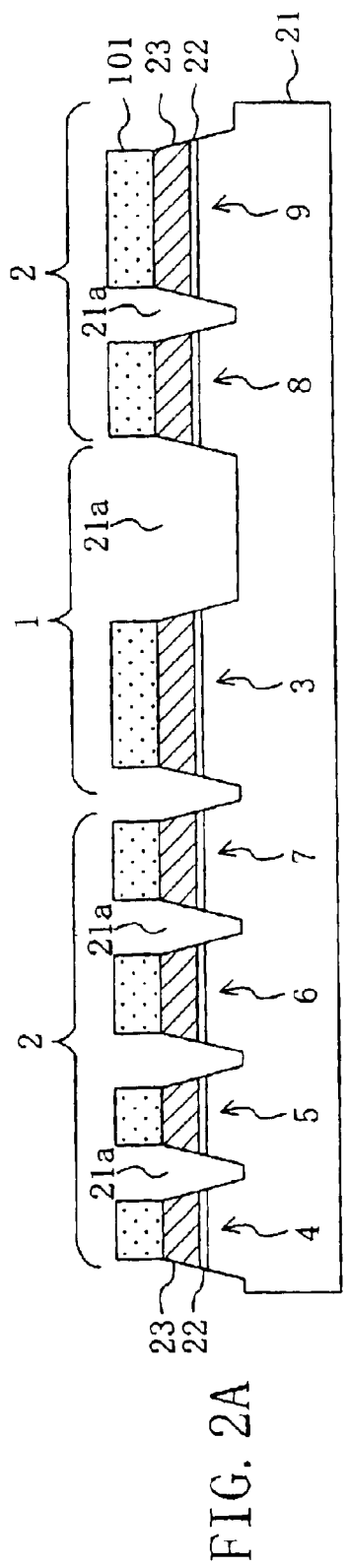
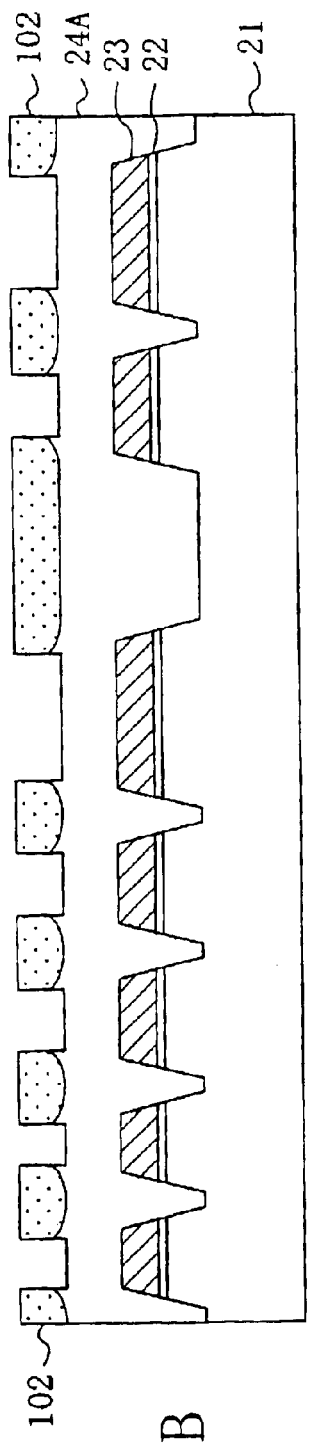
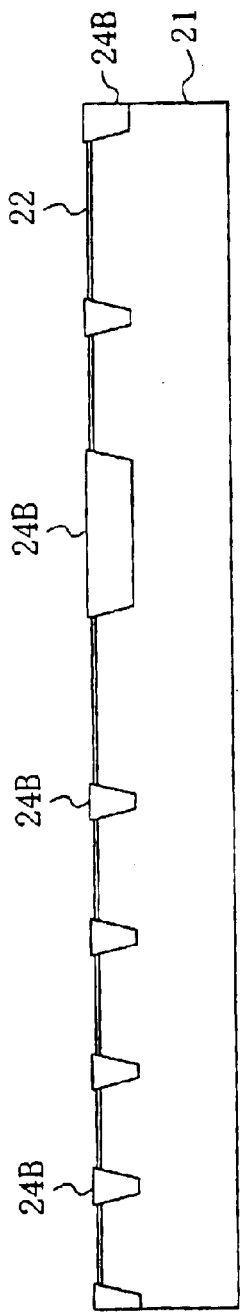
FIG. 2A
FIG. 2B
FIG. 2C

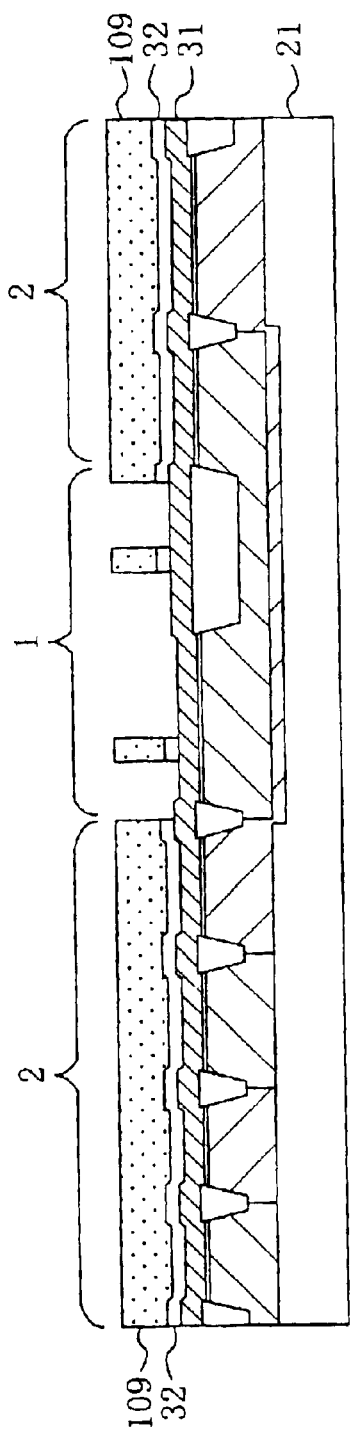
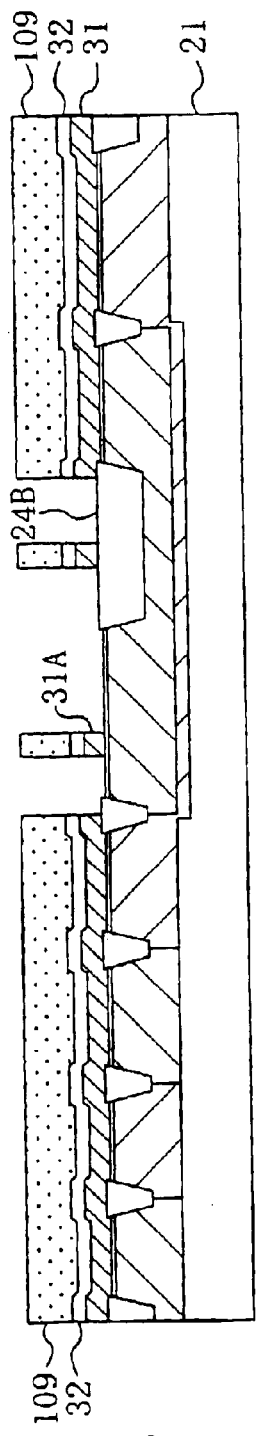
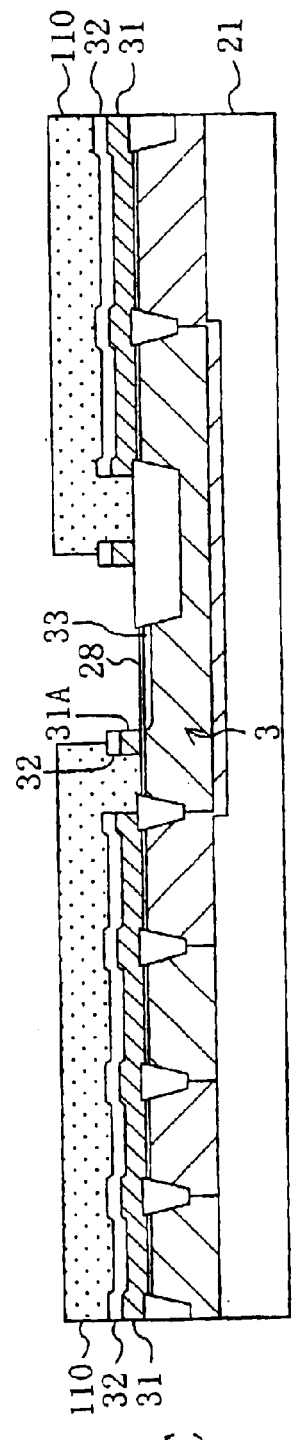
FIG. 6A
FIG. 6B
FIG. 6C

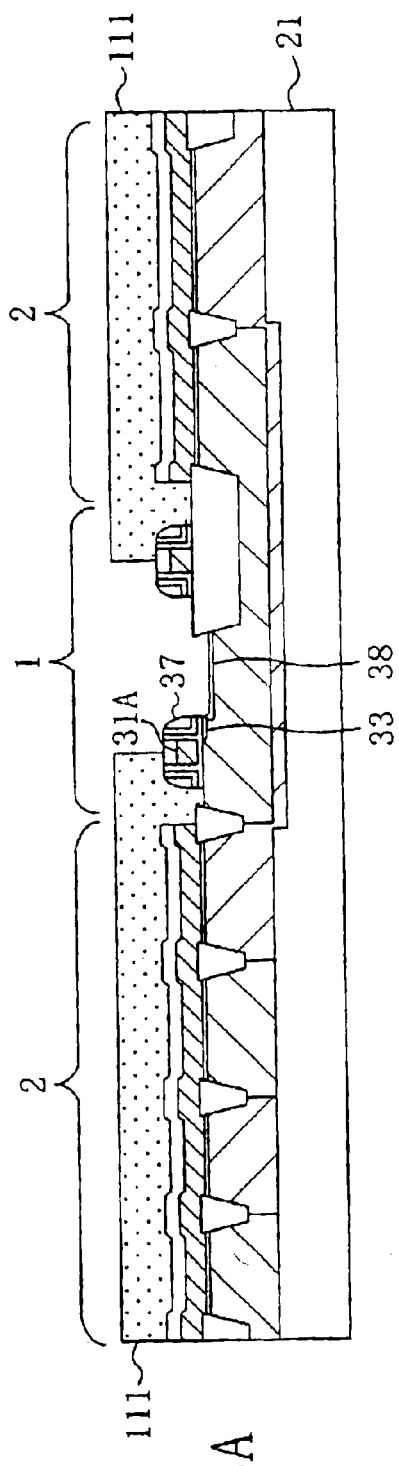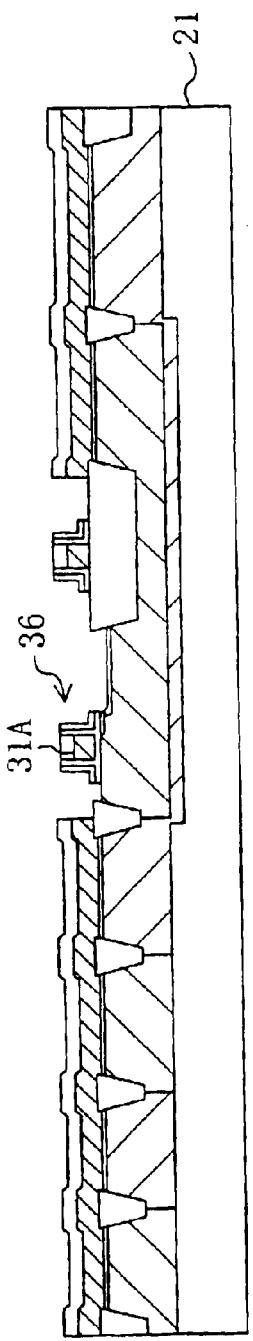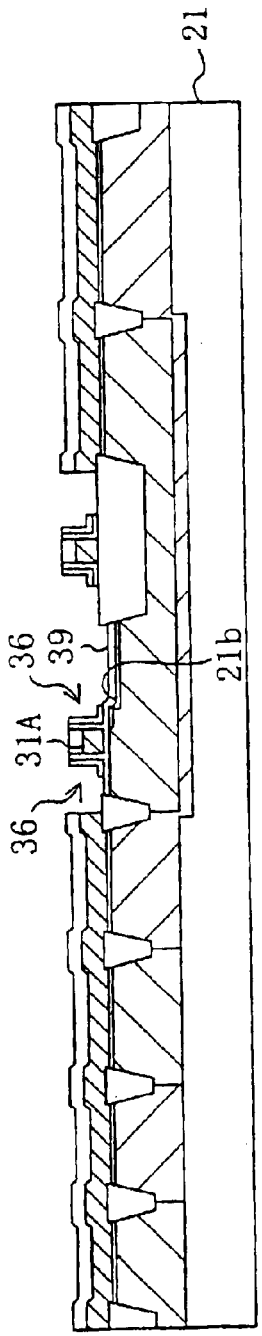
FIG. 8A
FIG. 8B
FIG. 8C

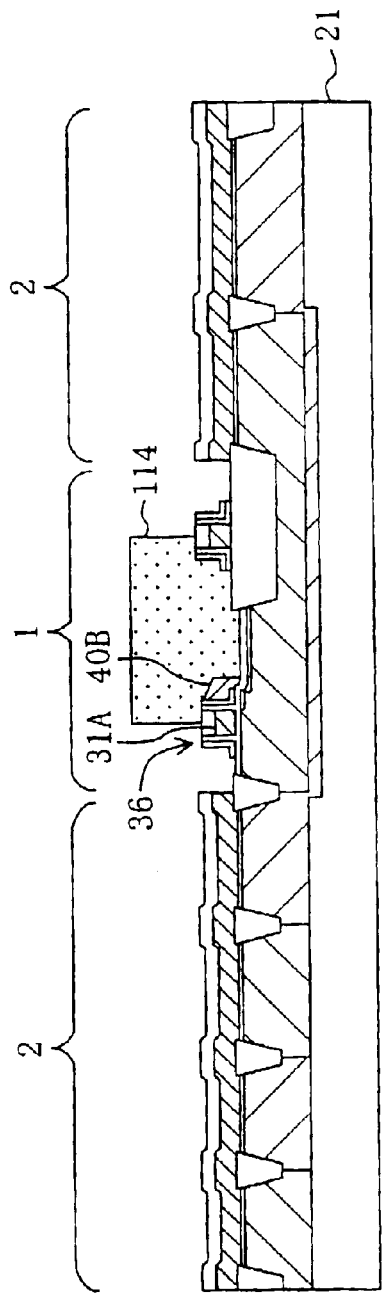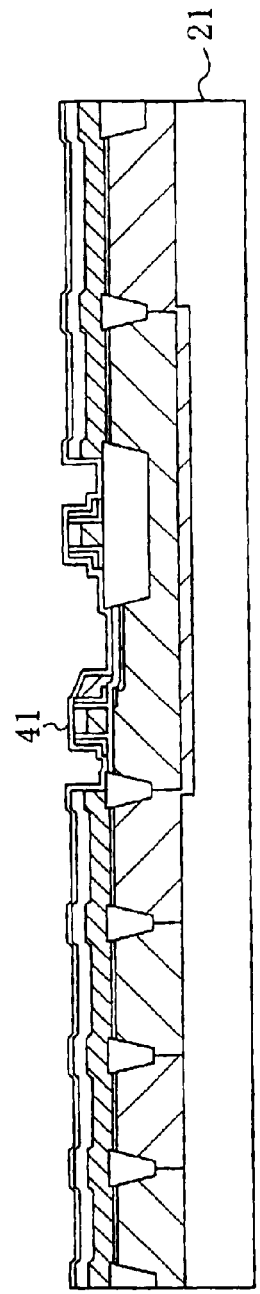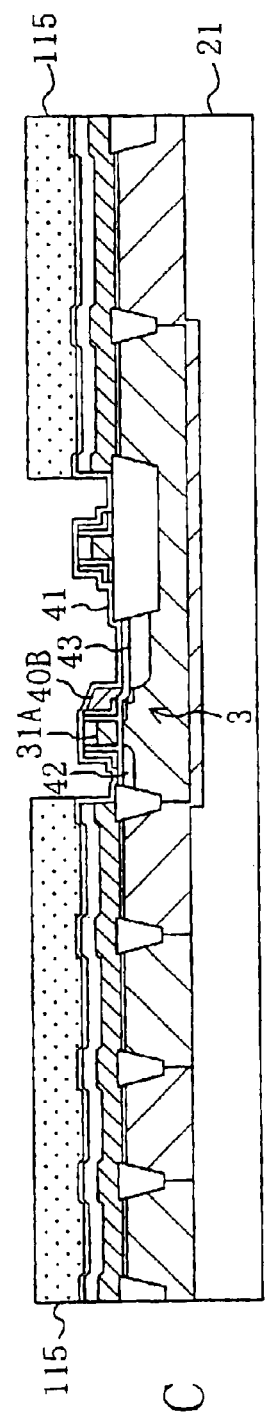
FIG. 10A
FIG. 10B
FIG. 10C

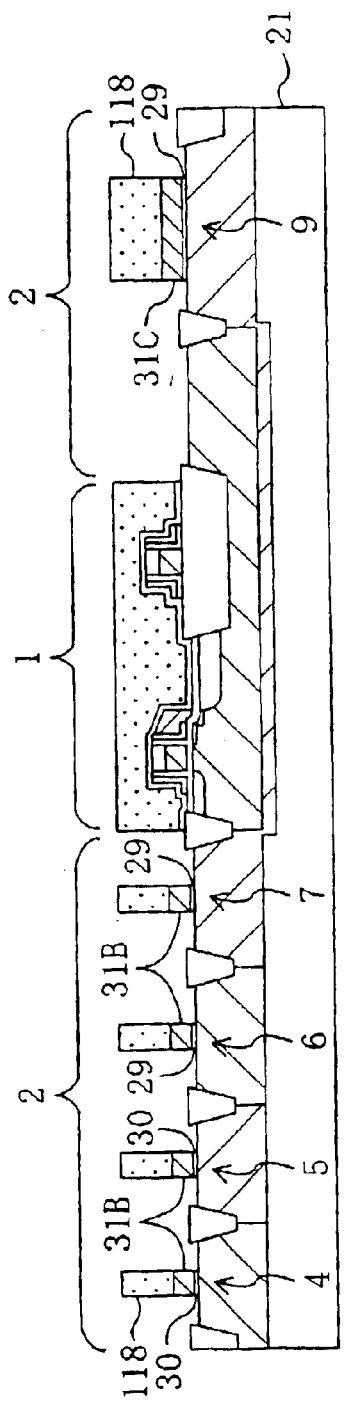
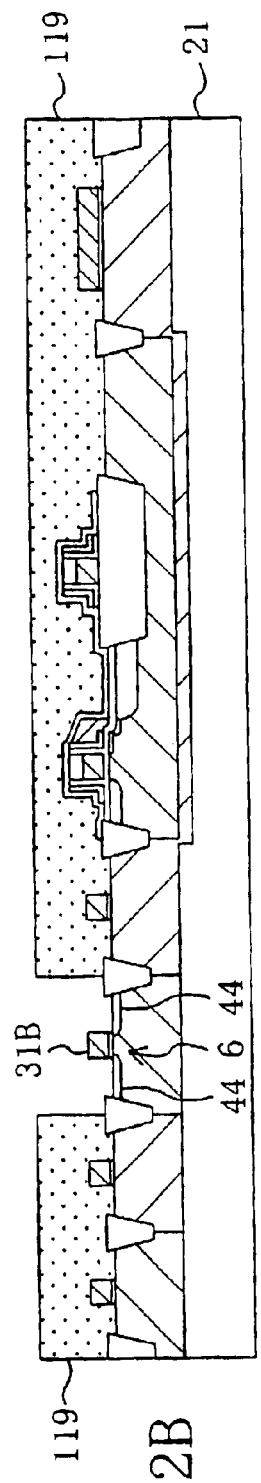
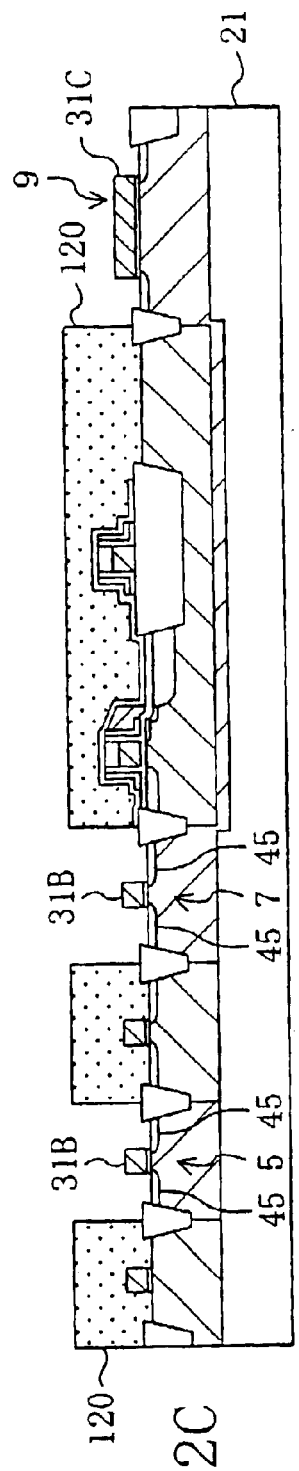
FIG. 12A
FIG. 12B
FIG. 12C

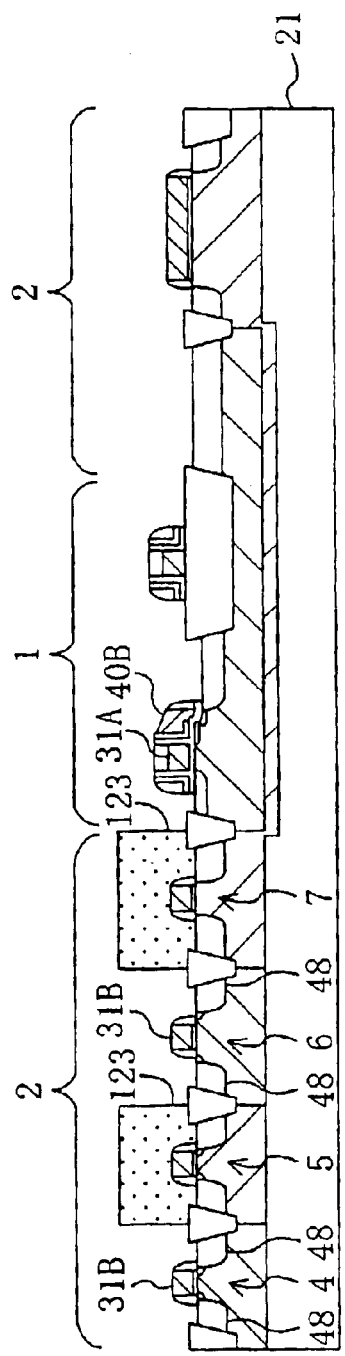
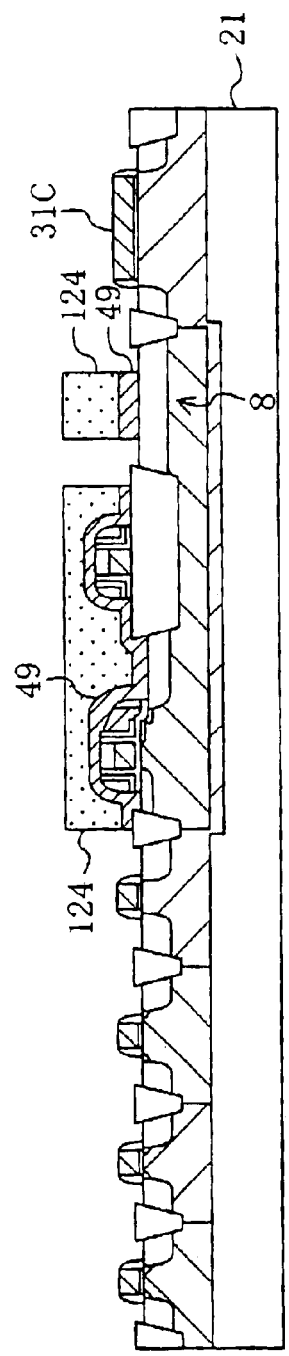
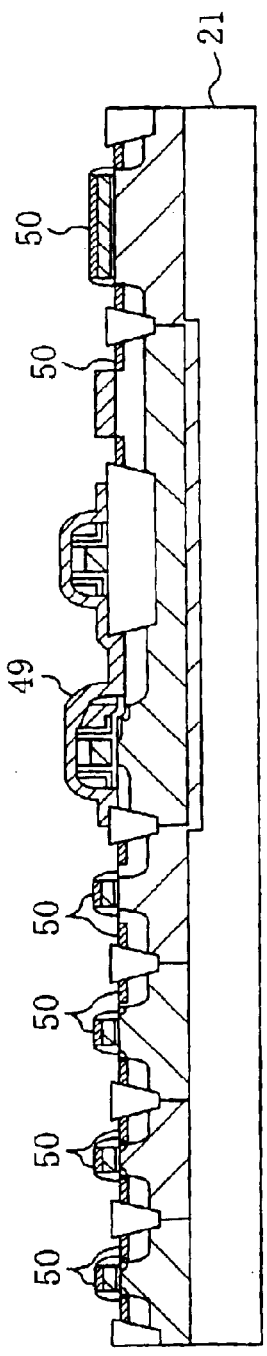
FIG. 14A
FIG. 14B
FIG. 14C

NONVOLATILE SEMICONDUCTOR MEMORY DEVICE AND METHOD FOR FABRICATING THE SAME

This is a divisional of application Ser. No. 09/897,417, filed Jul. 3, 2001, now U.S. Pat. No. 6,545,312.

BACKGROUND OF THE INVENTION

The present invention relates to a nonvolatile semiconductor memory device and to a method for fabricating the same. In particular, it relates to a nonvolatile semiconductor memory device having memory elements and peripheral circuits for inputting and outputting data to and from the memory elements formed on a single semiconductor substrate and to a method for fabricating the same.

At present, flash EEPROM (Electrically Erasable Programmable ROM) devices (hereinafter referred to as FEEPROM devices) have been used widely in electronic equipment as nonvolatile semiconductor memory devices which allow for electrical write and erase operations. The structures of memory cells in a nonvolatile semiconductor memory element can be divided roughly into two types, which are a stacked-gate type having a multilayer electrode structure composed of a floating gate electrode and a control gate electrode stacked on a semiconductor substrate and a split-gate type having an electrode structure composed of a floating gate electrode and a control gate electrode each opposed to a channel region in a semiconductor substrate.

The memory cells of the split-gate type are larger in size than those of the stacked-gate type because of the floating gate electrode and the control gate electrode disposed adjacent to each other on the semiconductor substrate. In addition, the floating gate electrode and the control gate electrode adjacent to each other are formed by individual lithographic steps, which requires a margin for the alignment of respective masks used to form the floating gate electrode and the control gate electrode. With the margin, the memory cells tend to be further increased in size.

FIGS. 58A to 58H show the cross-sectional structures of a conventional split-gate FEEPROM device in the individual process steps.

First, as shown in FIG. 58A, an insulating film 202 is formed on a semiconductor substrate 201 composed of silicon. Then, control gate electrodes 203 are formed selectively on the insulating film 202.

Next, as shown in FIG. 58B, the portion of the insulating film 202 on the region of the semiconductor substrate 201 to be formed with drains is removed therefrom by wet etching by using a first mask pattern 251 having an opening corresponding to the drain formation region and the gate electrodes 203 as a mask. Then, boron (B) ions at a relatively low dose are implanted into the semiconductor substrate 201 such that a lightly doped p-type region 204 is formed in the drain formation region.

Next, as shown in FIG. 58C, a silicon dioxide film having a thickness of about 100 nm and doped with boran (B) and phosphorus (P) (BPSG (Boran Phosphorus Silicate Glass)) film is deposited over the entire surface of the semiconductor substrate 201. The deposited BPSG film is etched back by anisotropic etching to form sidewalls 205 composed of the BPSG film on the both side surfaces of each of the control gate electrodes 203.

Next, as shown in FIG. 58D, dry etching is performed with respect to the semiconductor substrate 201 by using a second mask pattern 252 having an opening corresponding to the drain formation region of the semiconductor substrate 201, the gate electrode 203, and the side walls 205 as a mask, thereby forming a recessed portion 201a having a stepped portion composed of the portion of the semiconductor substrate 201 underlying the sidewall 205 as the upper stage and the drain formation region as the lower stage.

Next, as shown in FIG. 58E, arsenic (As) ions at a relatively low dose are implanted into the semiconductor substrate 201 by using the second mask pattern 252, the gate electrode 203, and the sidewall 205 as a mask, whereby an LDD region 206 as a lightly doped n-type region is formed in the drain formation region.

Next, as shown in FIG. 58F, the sidewalls 205 are removed by using vapor-phase hydrofluoric acid and the semiconductor substrate 201 is thermally oxidized in an oxygen atmosphere at about 850° C., whereby a thermal oxide film 207 with a thickness of about 9 nm is formed over the entire surface of the semiconductor substrate 201 including the gate electrodes 203. The portion of the thermal oxide film 207 overlying the drain formation region serves as a tunnel oxide film for each of floating gate electrodes.

Next, a polysilicon film doped with phosphorus (P) is deposited over the entire surface of the semiconductor substrate 201 and etched back to form sidewalls composed of the polysilicon film on the both side surfaces of the control gate electrodes 203. Then, as shown in FIG. 58G, the sidewall closer to a region to be formed with sources is removed, while the sidewall closer to the drain formation region of the semiconductor substrate 201 is divided into parts corresponding to individual memory cells on a one-by-one basis, thereby forming floating gate electrodes 208 composed of the polysilicon film in the drain formation region.

Next, as shown in FIG. 58H, arsenic (As) ions are implanted into the semiconductor substrate 201 by using the gate electrodes 203 and the floating gate electrodes 208 as a mask such that source and drain regions 209 and 210 are formed in the source formation region and in the drain formation region, respectively, whereby memory cells in the FEEPROM device are completed.

Since the floating gate electrodes 208 each opposed to the control gate electrode 203 via the thermal oxide film 208 serving as a capacitance insulating film is thus formed by self alignment relative to the control gate electrode 203, it is sufficient to perform only one lithographic step for forming the gate electrode 203 and a displacement does not occur between the control gate electrode 203 and the floating gate electrode 208 during the alignment thereof.

In a typical method for fabricating the conventional FEEPROM device, however, the floating gate electrode 208, the thermal oxide film 207, and the control gate electrode 203 covered with the thermal oxide film 207 which are shown in FIG. 58G are mostly composed of polysilicon, a silicon dioxide, and polysilicon, respectively. This causes the problem that, if the floating gate electrode 208 is to be formed selectively by etching, the control gate electrode 203 composed of the same material composing the floating gate electrode 208 may be damaged unless the etching speed is controlled with high precision.

Although the thermal oxide film 207 serving as the capacitance insulating film between the control gate electrode 203 and the floating gate electrode 208 and serving as the tunnel insulating film between the floating gate electrode 208 and the semiconductor substrate 201 is formed in the single step illustrated in FIG. 58F, if the tunnel film is formed after the formation of the capacitance insulating film, the interface between the control gate electrode 203 and the capacitance insulating film is oxidized or a bird's beak occurs at the interface, which causes the problem that the thickness of the capacitance insulating film is increased locally and the capacitance insulating film does not have a specified capacitance value.

In the split-gate or stacked-gate FEEPROM device, if not only the memory cells but also other elements, particularly active elements such as MOS transistors each of which controls carriers implanted from the source region by using the gate electrode, are formed on a single semiconductor substrate, it is typical to simultaneously form the control gate electrodes of the FEEPROM device and the gate electrodes of the MOS transistors.

In terms of reducing the number of fabrication process steps, the conventional fabrication method is desirable since it simultaneously forms the control gate electrodes of the memory cells and the gate electrodes of the MOS transistors contained in, e.g., peripheral circuits or the like for controlling the memory cells. However, the memory cells of a FEEPROM device are larger in element size than MOS transistors whether the FEEPROM device is of the split-gate type or stacked-gate type. If the memory cells and the MOS transistors are formed simultaneously, each of the memory cells and the MOS transistors cannot be formed as an element with an optimum structure. If the diffusion region of each of the memory cells and the MOS transistors is provided with an LDD (Lightly Doped Drain) structure, the concentration of a diffused impurity differs from one region to another so that it is difficult to provide an optimum structure by forming each of the elements simultaneously.

If a method for fabricating a semiconductor device composed only of existing MOS transistors has been established, it is not easy to form, on a single substrate, the semiconductor device containing the existing MOS transistors and the memory cells of a FEEPROM device as shown in FIG. 58.

If a method for fabricating a semiconductor device by forming, on a single substrate, other memory cells different in structure from those shown in FIG. 58 and MOS transistors has been established, it is also not easy to form the other memory cells as a replacement for the memory cells shown in FIG. 58. This is because the fabrication process for the memory cells of the FEEPROM, in particular, adversely affects the fabrication of the MOS transistors.

Since the method for fabricating the split-gate FEEPROM device shown in FIG. 58 forms the floating gate electrodes 208 after forming the control gate electrodes 203 on the semiconductor substrate 201, the floating gate electrodes 208 can be formed by self alignment relative to the control gate electrode 203 so that the memory cells are reduced in size.

As a method for fabricating such memory cells and MOS transistors on a single semiconductor substrate, the following process steps can be considered.

First, the gate electrodes of the MOS transistors to be formed in the other regions of the semiconductor substrate 201 are formed by simultaneous patterning during the formation of the control gate electrodes 203 shown in FIG. 58A.

Next, as shown in FIGS. 58B to 58G, the process steps for fabricating the memory cells are performed. If the implant conditions for the LDD region 206 coincide with the implant conditions for the LDD region of each of the MOS transistors, the impurity is implanted simultaneously into the LDD region of the MOS transistor.

Next, as shown in FIG. 58H, the source and drain regions of each of the MOS transistors are formed simultaneously with the formation of the source and drain regions 209 and 210 of each of the memory cells.

Thereafter, a specified interlayer insulating film and a specified multilayer interconnect are formed by a normal fabrication process, whereby a semiconductor device composed of the memory cells and the MOS transistors formed on the single semiconductor substrate 201 is implemented.

In accordance with the fabrication method, however, the thermal oxide film 207 serving as the tunnel oxide film between the semiconductor substrate 201 and each of the floating gate electrodes 208 is formed also on the upper and side surfaces of the gate electrode of each of the MOS transistors, which causes the necessity to remove the portion of the thermal oxide film 207 covering the gate electrode.

It is to be noted that the gate electrode of each of the MOS transistors is typically composed of polysilicon and each of the gate oxide film and the film protecting the source and drain regions of the MOS transistor is a silicon dioxide film. To selectively remove the thermal oxide film 207 from the gate electrode composed of polysilicon, therefore, the etching speed for the MOS transistor should also be controlled with high precision, which renders the fabrication of the semiconductor device more difficult.

If the thermal oxide film 207 of the gate electrode of each of the MOS transistors is removed by wet etching using hydrofluoric acid, e.g., the thermal oxide film 207 covering the upper and side surfaces of each of the control gate electrodes in the memory cell portion is also etched. If etching proceeds to the control gate electrode 203, the performance of the control gate electrode 203 may also deteriorate.

In addition, etching may also proceed to the LDD and channel regions of each of the MOS transistors formed in the previous steps after the removal of the thermal oxide film 207. This reduces the depth of a junction in the channel region and increases resistance in the channel region, resulting in a reduced amount of current between the source and drain. As a result, the driving ability of the MOS transistor is lowered.

In the conventional semiconductor device in which the memory cells and the MOS transistors are formed on the single semiconductor substrate, if only the memory cell portion is composed of the split-gate memory cells shown in FIG. 58, the MOS transistors are influenced by thermal hysteresis, which has not been observed previously. This causes the necessity to change the design of the entire semiconductor device. Since the thermal oxide film 207 is formed after the formation of the LDD region 206, e.g., an implant profile in the LDD region of each of the MOS transistors changes to change the operating characteristics of the MOS transistor, which causes the necessity to change process conditions including an amount of ions to be implanted in the LDD region.

SUMMARY OF THE INVENTION

In view of the foregoing problems, it is therefore a first object of the present invention to ensures the formation of memory cells in a split-gate nonvolatile semiconductor memory device. A second object of the present invention is to allow easy replacement of existing memory cells with memory cells according to the present invention by utilizing a fabrication process for a semiconductor memory device in which the existing memory cells and MOS transistors are formed on a single semiconductor substrate and prevent the memory cells according to the present invention from affecting the operating characteristics of the MOS transistors.

To attain the first object, the present invention provides a memory cell having a protective insulating film formed on a side surface of a control gate electrode to protect the control gate electrode from etching.

To attain the second object, the present invention provides a method for fabricating a nonvolatile semiconductor memory device in which the memory cell for attaining the first object of the present invention is formed first and then a transistor is formed, thereby preventing the step of forming the memory cell from affecting the operating characteristics of the transistor.

Specifically, a first nonvolatile semiconductor memory device for attaining the first object of the present invention has a control gate electrode and a floating gate electrode provided on a semiconductor substrate to have their respective side surfaces in opposed relation, the device comprising: a gate insulating film formed on the semiconductor substrate; the control gate electrode formed on the gate insulating film; a protective insulating film deposited on each of the side surfaces of the control gate electrode to protect the control gate electrode during formation of the floating gate electrode; the floating gate electrode opposed to one of the side surfaces of the control gate electrode with the protective insulating film interposed therebetween so as to be capacitively coupled to the control gate electrode; a tunnel insulating film formed between the floating gate electrode and the semiconductor substrate; a drain region formed in a region of the semiconductor substrate containing a portion underlying the floating gate electrode; and a source region formed in a region of the semiconductor substrate opposite to the drain region relative to the control gate electrode.

Since the first nonvolatile semiconductor memory device has the protective insulating film deposited on each of the side surfaces of the control gate electrode to protect the control gate electrode during the formation of the floating gate electrode, the configuration of the control gate electrode is not impaired by etching or the like during the formation of the floating gate electrode. This ensures the formation of a memory cell in the nonvolatile semiconductor memory device.

A second nonvolatile semiconductor memory device for attaining the first object of the present invention has a control gate electrode and a floating gate electrode provided on a semiconductor substrate to have their respective side surfaces in opposed relation, the device comprising: a gate insulating film formed on the semiconductor substrate; the control gate electrode formed on the gate insulating film; a protective insulating film deposited only on that one of the side surfaces of the control gate electrode opposed to the floating gate electrode to protect the control gate electrode during formation of the floating gate electrode; the floating gate electrode opposed to the side surface of the control gate electrode with the protective insulating film interposed therebetween so as to be capacitively coupled to the control gate electrode; a tunnel insulating film formed between the floating gate electrode and the semiconductor substrate; a drain region formed in a region of the semiconductor substrate containing a portion underlying the floating gate electrode; and a source region formed in a region of the semiconductor substrate opposite to the drain region relative to the control gate electrode.

Since the second nonvolatile semiconductor memory device has the protective insulating film deposited only on the side surface of the control gate electrode opposed to the floating gate electrode to protect the control gate electrode during the formation of the floating gate electrode, the configuration of the control gate electrode is not impaired during the formation of the floating gate electrode. This ensures the formation of a memory cell in the nonvolatile semiconductor memory device.

A third nonvolatile semiconductor memory device for attaining the first object of the present invention has a control gate electrode and a floating gate electrode provided on a semiconductor substrate to have their respective side surfaces in opposed relation, the device comprising: a gate insulating film formed on the semiconductor substrate; the control gate electrode formed on the gate insulating film; a protective insulating film deposited on that one of the side surfaces of the control gate electrode opposite to the side surface opposed to the floating gate electrode to protect the control gate electrode during formation of the floating gate electrode; a capacitance insulating film formed on the side surface of the control gate electrode opposed to the floating gate electrode; the floating gate electrode opposed to the side surface of the control gate electrode with the capacitance insulating film interposed therebetween so as to be capacitively coupled to the control gate electrode; a tunnel insulating film formed between the floating gate electrode and the semiconductor substrate; a drain region formed in a region of the semiconductor substrate containing a portion underlying the floating gate electrode; and a source region formed in a region of the semiconductor substrate opposite to the drain region relative to the control gate electrode.

Since the third nonvolatile semiconductor memory device has the protective insulating film deposited on the side surface of the control gate electrode opposite to the floating gate electrode to protect the control gate electrode during the formation of the floating gate electrode, the configuration of the control gate electrode is not impaired during the formation of the floating gate electrode. This ensures the formation of a memory cell in the nonvolatile semiconductor memory device.

In the third nonvolatile semiconductor memory device, the capacitance insulating film preferably has a uniform thickness.

In each of the first to third nonvolatile semiconductor memory devices, the protective insulating film preferably has a uniform thickness.

In each of the first to third nonvolatile semiconductor memory devices, the gate insulating film preferably has a uniform thickness.

In each of the first to third nonvolatile semiconductor memory devices, the tunnel insulating film preferably has a uniform thickness.

Preferably, each of the first to third nonvolatile semiconductor memory devices further comprises an insulating film formed between the control gate electrode and the protective insulating film.

In each of the first to third nonvolatile semiconductor memory devices, the protective insulating film is preferably a multilayer structure composed of a plurality of stacked insulating films having different compositions.

In each of the first to third nonvolatile semiconductor memory devices, the semiconductor substrate preferably has a stepped portion formed to be covered up with the floating gate electrode.

A first method for fabricating a nonvolatile semiconductor memory device, which is for attaining the first object of the present invention, comprises: a control-gate-electrode forming step of forming a first insulating film on a semiconductor substrate, patterning a conductor film formed on the first insulating film, and thereby forming a control gate electrode from the conductor film; a second-insulating-film depositing step of depositing a second insulating film over the entire surface of the semiconductor substrate including the control gate electrode; a protective-insulating-film depositing step of selectively removing the second insulating film so as to leave a portion of the second insulating film located on each of side surfaces of the control gate electrode and thereby forming, from the second insulating film, a protective insulating film for protecting the control gate electrode; a gate-insulating-film forming step of selectively removing the first insulating film so as to leave a portion of the first insulating film underlying the control gate electrode and thereby forming a gate insulating film from the first insulating film; a tunnel-insulating-film forming step of forming, on the semiconductor substrate, a third insulating film serving as a tunnel insulating film; a floating-gate-electrode forming step of forming by self alignment a floating gate electrode capacitively coupled to one of side surfaces of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

In accordance with the first method for fabricating a nonvolatile semiconductor memory device, each of the side surfaces of the control gate electrode is covered with the protective insulating film also serving as the capacitance insulating film when the floating gate electrode capacitively coupled to one of the side surfaces of the control gate electrode with the protective insulating film interposed therebetween and opposed to the semiconductor substrate with the tunnel insulating film interposed therebetween is formed by self alignment. The arrangement prevents damage caused by etching to the control gate electrode and ensures the formation of a memory cell in the nonvolatile semiconductor memory device.

A second method for fabricating a nonvolatile semiconductor memory device, which is for attaining the first object of the present invention, comprises: a control-gate-electrode forming step of forming a first insulating film on a semiconductor substrate, patterning a conductor film formed on the first insulating film, and thereby forming a control gate electrode from the conductor film; a second-insulating-film depositing step of depositing a second insulating film over the entire surface of the semiconductor substrate including the control gate electrode; a sidewall forming step of forming sidewalls over the first insulating film and on portions of the second insulating film located on side surfaces of the control gate electrode; a protective-insulating-film forming step of performing etching with respect to the first and second insulating films by using the sidewalls and the control gate electrode as a mask and thereby forming, from the second insulating film, a protective insulating film for protecting the control gate electrode on each of the side surfaces of the control gate electrode, while forming, from the first insulating film, a gate insulating film under the control gate electrode; a tunnel-insulating-film forming step of removing the sidewalls and then forming, in a region in which the semiconductor substrate is exposed, a third insulating film serving as a tunnel-insulating film; a floating-gate-electrode forming step of forming by self alignment a floating gate electrode capacitively coupled to one of the side surfaces of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

In accordance with the second method for fabricating a nonvolatile semiconductor memory device, each of the side surfaces of the control gate electrode is covered with the protective insulating film when the floating gate electrode capacitively coupled to one of the side surfaces of the control gate electrode with the protective insulating film interposed therebetween and opposed to the semiconductor substrate with the tunnel insulating film interposed therebetween is formed by self alignment. The arrangement prevents damage caused by etching to the control gate electrode and ensures the formation of a memory cell in the nonvolatile semiconductor memory device.

In the second method for fabricating a nonvolatile semiconductor memory device, the tunnel-insulating-film forming step preferably includes removing the sidewalls and then selectively removing respective portions of the protective insulating film covered with bottom surfaces of the sidewalls. The arrangement suppresses the trapping of electrons or holes in the portions of the protective insulating film covered with the bottom surfaces of the sidewalls and thereby suppresses the degradation of a memory element due to an increase in the number of write or erase operations performed with respect to the memory clement.

In this case, the tunnel-insulating-film forming step preferably includes the step of selectively removing the respective portions of the protective insulating film covered with the bottom surfaces of the sidewalls and then selectively removing respective portions of the gate insulating film covered with the bottom surfaces of the sidewalls. The arrangement suppresses the trapping of electrons or holes in the portions of the gate insulating film covered with the bottom surfaces of the sidewalls and thereby reduces the degradation of the write and erase characteristics of a memory element.

Preferably, the second method for fabricating a nonvolatile-semiconductor memory device further comprises, between the protective-insulating-film forming step and the tunnel-insulating-film forming step, the step of: performing etching with respect to the semiconductor substrate by using the sidewalls as a mask and thereby forming a stepped portion to be covered up with the floating gate electrode in a region of the semiconductor substrate to be formed with the floating gate electrode. The arrangement increases the efficiency with which electrons are implanted into the floating gate electrode.

In the first or second method for fabricating a nonvolatile semiconductor memory device, the tunnel-insulating-film forming step preferably includes the step of forming the third insulating film also on the protective insulating film.

A third method for fabricating a nonvolatile semiconductor memory device, which is for attaining the first object of the present invention, comprises: a control-gate-electrode forming step of forming a first insulating film on a semiconductor substrate, patterning a conductor film formed on the first insulating film, and thereby forming a control gate electrode from the conductor film; a second-insulating-film depositing step of depositing a second insulating film over the entire surface of the semiconductor substrate including the control gate electrode; a protective-insulating-film forming step of selectively removing the second insulating film so as to leave a portion of the second insulating film located on one of side surfaces of the control gate electrode and thereby forming, from the second insulating film, a protective insulating film for protecting the one of the side surfaces of the control gate electrode; a gate-insulating-film forming step of selectively removing the first insulating film so as to leave a portion of the first insulating film underlying the control gate electrode and thereby forming a gate insulating film from the first insulating film; a tunnel-insulating-film forming step of forming, on the semiconductor substrate, a third insulating film serving as a tunnel insulating film; a floating-gate-electrode forming step of forming by self alignment a floating gate electrode capacitively coupled to the side surface of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

In accordance with the third method for fabricating a nonvolatile semiconductor memory device, one of the side surfaces of the control gate electrode is covered with the protective insulating film also serving as the capacitance insulating film when the floating gate electrode capacitively coupled to the side surface of the control gate electrode with the protective insulating film interposed therebetween and opposed to the semiconductor substrate with the tunnel insulating film interposed therebetween is formed by self alignment. The arrangement reduces damage caused by etching to the control gate electrode and ensures the formation of a memory cell in the nonvolatile semiconductor memory device.

A fourth method for fabricating a nonvolatile semiconductor memory device, which is for attaining the first object of the present invention, comprises: a control-gate-electrode forming step of forming a first insulating film on a semiconductor substrate, patterning a conductor film formed on the first insulating film, and thereby forming a control gate electrode from the conductor film; a second-insulating-film depositing step of depositing a second insulating film over the entire surface of the semiconductor substrate including the control gate electrode; a sidewall forming step of forming sidewalls over the first insulating film and on portions of the second insulating film located on side surfaces of the control gate electrode; a protective-insulating-film forming step of performing etching with respect to the first and second insulating films by using the sidewalls and the control gate electrode as a mask and thereby forming, from the second insulating film, a protective insulating film for protecting the control gate electrode on each of the side surfaces of the control gate electrode, while forming, from the first insulating film, a gate insulating film under the control gate electrode; a protective-insulating-film removing step of removing the sidewalls and then selectively removing the protective insulating film so as to leave a portion of the protective insulating film located on one of the side surfaces of the control gate electrode; a tunnel-insulating-film forming step of forming, in a region in which the semiconductor substrate is exposed, a third insulating film serving as a tunnel insulating film; a floating-gate-electrode forming step of forming by self alignment a floating gate electrode capacitively coupled to the side surface of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

In accordance with the fourth method for fabricating a nonvolatile semiconductor memory device, one of the side surfaces of the control gate electrode is covered with the protective insulating film also serving as the capacitance insulating film when the floating gate electrode capacitively coupled to the side surface of the control gate electrode with the protective insulating film interposed therebetween and opposed to the semiconductor substrate with the tunnel insulating film interposed therebetween is formed by self alignment. The arrangement reduces damage caused by etching to the control gate electrode and ensures the formation of a memory cell in the nonvolatile semiconductor memory device.

In the fourth method for fabricating a nonvolatile semiconductor memory device, the protective-insulating-film removing step preferably includes the step of removing the sidewalls and then selectively removing respective portions of the protective insulating film covered with bottom surfaces of the sidewalls.

In this case, the protective-insulating-film removing step preferably includes the step of selectively removing the respective portions of the protective insulating film covered with the bottom surfaces of the sidewalls and then selectively removing respective portions of the gate insulating film covered with the bottom surfaces of the sidewalls.

Preferably, the third or fourth method for fabricating a nonvolatile semiconductor memory device further comprises, between the protective-insulating-film forming step and the protective-insulating-film removing step, the step of: performing etching with respect to the semiconductor substrate by using the sidewalls as a mask and thereby forming a stepped portion to be covered up with the floating gate electrode in a region of the semiconductor substrate to be formed with the floating gate electrode.

In the third or fourth method for fabricating a nonvolatile semiconductor memory device, the tunnel-insulating-film forming step preferably includes the step of forming the third insulating film also on the protective insulating film.

Preferably, the third or fourth method for fabricating a nonvolatile semiconductor memory device further comprises, between the control-gate-electrode forming step and the second-insulating-film depositing step, the step of: introducing hydrogen and oxygen into a space over the heated semiconductor substrate, generating water vapor from the introduced hydrogen and oxygen over the semiconductor substrate, and thereby forming an insulating film on each of side portions of the control gate electrode.

In this case, the protective-insulating-film forming step preferably includes forming the protective insulating film by stacking a plurality of insulating films having different compositions.

In the third or fourth method for fabricating a nonvolatile semiconductor memory device, the tunnel-insulating-film forming step preferably includes the step of introducing hydrogen and oxygen into a space over the heated semiconductor substrate, generating water vapor from the introduced hydrogen and oxygen over the semiconductor substrate, and thereby forming the tunnel insulating film, while forming an insulating film having a composition different from a composition of the protective insulating film on a surface of the protective insulating film.

A fifth method for fabricating a nonvolatile semiconductor memory device, which is for attaining the first object of the present invention, comprises: a control-gate-electrode forming step of forming a first insulating film on a semiconductor substrate, patterning a conductor film formed on the first insulating film, and thereby forming a control gate electrode from the conductor film; a second-insulating-film depositing step of depositing a second insulating film over the entire surface of the semiconductor substrate including the control gate electrode; a protective-insulating-film forming step of selectively removing the second insulating film so as to leave a portion of the second insulating film located on that one of the side surfaces of the control gate electrode opposite to the side surface to be formed with a floating gate electrode and thereby forming, from the second insulating film, a protective insulating film for protecting the control gate electrode; a gate-insulating-film forming step of selectively removing the first insulating film so as to remove a portion of the first insulating film underlying the control gate electrode and thereby forming a gate insulating film from the first insulating film; a capacitance-insulating-film forming step of forming a capacitance insulating film on that one of the side surfaces of the control gate electrode to be formed with the floating gate electrode; a tunnel-insulating-film forming step of forming a tunnel insulating film on the semiconductor substrate; a floating-gate-electrode forming step of forming by self alignment the floating gate electrode capacitively coupled to the side surface of the control gate electrode with the capacitance insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

In accordance with the fifth method for fabricating a nonvolatile semiconductor memory device, the side surface of the control gate electrode opposite to the floating gate electrode is covered with the protective insulating film when the floating gate electrode capacitively coupled to the side surface of the control gate electrode with the capacitance insulating film interposed therebetween and opposed to the semiconductor substrate with the tunnel insulating film interposed therebetween is formed by self alignment. The arrangement prevents damage caused by etching to the control gate electrode and ensures the formation of a memory cell in the nonvolatile semiconductor memory device.

A sixth method for fabricating a nonvolatile semiconductor memory device, which is for attaining the first object of the present invention, comprises: a control-gate-electrode forming step of forming a first insulating film on a semiconductor substrate, patterning a conductor film formed on the first insulating film, and thereby forming a control gate electrode from the conductor film; a second-insulating-film depositing step of depositing a second insulating film over the entire surface of the semiconductor substrate including the control gate electrode; a sidewall forming step of forming sidewalls over the first insulating film and on portions of the second insulating film located on side surfaces of the control gate electrode; a protective-insulating-film forming step of performing etching with respect to the first and second insulating films by using the sidewalls and the control gate electrode as a mask and thereby forming, from the second insulating film, a protective insulating film for protecting the control gate electrode on each of the side surfaces of the control gate electrode, while forming, from the first insulating film, a gate insulating film under the control gate electrode; a protective-insulating-film removing step of removing the sidewalls and then selectively removing a portion of the protective insulating film located on that one of the side surfaces of the control gate electrode to be formed with a floating gate electrode; a capacitance-insulating-film forming step of forming a capacitance insulating film on the side surface of the control gate electrode to be formed with the floating gate electrode; a tunnel-insulating-film forming step of forming a tunnel insulating film in a region in which the semiconductor substrate is exposed; a floating-gate-electrode forming step of forming by self alignment the floating gate electrode capacitively coupled to the side surface of the control gate electrode with the capacitance insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

In accordance with the sixth method for fabricating a nonvolatile semiconductor memory device, the side surface of the control gate electrode opposite to the floating gate electrode is covered with the protective insulating film when the floating gate electrode capacitively coupled to the side surface of the control gate electrode with the capacitance insulating film interposed therebetween and opposed to the semiconductor substrate with the tunnel insulating film interposed therebetween is formed by self alignment. The arrangement reduces damage caused by etching to the control gate electrode and ensures the formation of a memory cell in the nonvolatile semiconductor memory device.

In the sixth method for fabricating a nonvolatile semiconductor memory device, the protective-insulating-film removing step preferably includes the step of removing the sidewalls and then selectively removing respective portions of the protective insulating film covered with bottom surfaces of the sidewalls.

In this case, the protective-insulating-film removing step preferably includes the step of selectively removing the respective portions of the protective insulating film covered with the bottom surfaces of the sidewalls and then selectively removing respective portions of the gate insulating film covered with the bottom surfaces of the sidewalls.

Preferably, the sixth method for fabricating a nonvolatile semiconductor memory device further comprises, between the protective-insulating-film forming step and the protective-insulating-film removing step, the step of: performing etching with respect to the semiconductor substrate by using the sidewalls as a mask and thereby forming a stepped portion to be covered up with the floating gate electrode in a region of the semiconductor substrate to be formed with the floating gate electrode.

In the fifth or sixth method for fabricating a nonvolatile semiconductor memory device, the capacitance-insulating-film forming step and the tunnel-insulating-film forming step are preferably composed of identical steps proceeding concurrently.

In the fifth or sixth method for fabricating a nonvolatile semiconductor memory device, the capacitance-insulating-film forming step or the tunnel-insulating-film forming step preferably includes the step of introducing hydrogen and oxygen into a space over the heated semiconductor substrate, generating water vapor from the introduced hydrogen and oxygen over the semiconductor substrate, and thereby forming the capacitance insulating film or the tunnel insulating film.

In each of the first to sixth methods for fabricating a nonvolatile semiconductor memory device, the second insulating film is preferably a multilayer structure composed of a plurality of stacked insulating films having different compositions.

To attain the second object, in each of the first to sixth methods for fabricating a nonvolatile semiconductor memory device, the semiconductor substrate preferably has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of: forming the field-effect transistor in the peripheral circuit formation region after forming the source region and the drain region in the memory circuit formation region.

The arrangement prevents the memory cell of the present invention from affecting the operating characteristics of a field-effect transistor composing the peripheral circuit and thereby implements a nonvolatile semiconductor memory device having desired characteristics.

In this case, the step of forming the control gate electrode in the memory circuit formation region preferably includes the step of forming also a conductor film for forming a gate electrode of the field-effect transistor simultaneously with the formation of the conductor film on the first insulating film. Although the step of completing a field-effect transistor in the peripheral circuit is performed subsequently to the step of producing a memory cell, the conductor film on the first insulating film is formed simultaneously with the formation of the conductor film for forming the gate electrode in the memory circuit formation region. Accordingly, the arrangement omits the step of forming the conductor film for the field-effect transistor without affecting the operating characteristics of the field-effect transistor and thereby reduces the number of process steps.

In this case, the step of forming the control gate electrode in the memory circuit formation region preferably includes the step of patterning also a conductor film for forming a gate electrode of the field-effect transistor simultaneously with the patterning of the conductor film. The arrangement omits the patterning step for the gate electrode of a field-effect transistor without affecting the operating characteristics of the field-effect transistor and thereby reduces the number of process steps.

BRIEF DESCRIPTION OF THE DRAWINGS

FIGS. 2A to 2C are structural cross-sectional views illustrating the individual process steps of a method for fabricating the nonvolatile semiconductor memory device according to the first embodiment;

FIGS. 6A to 6C are structural cross-sectional views illustrating the individual process steps of the method for fabricating the nonvolatile semiconductor memory device according to the first embodiment;

FIGS. 8A to 8C are structural cross-sectional views illustrating the individual process steps of the method for fabricating the nonvolatile semiconductor memory device according to the first embodiment;

FIGS. 10A to 10C are structural cross-sectional views illustrating the individual process steps of the method for fabricating the nonvolatile semiconductor memory device according to the first embodiment;

FIGS. 12A to 12C are structural cross-sectional views illustrating the individual process steps of the method for fabricating the nonvolatile semiconductor memory device according to the first embodiment;

FIGS. 14A to 14C are structural cross-sectional views illustrating the individual process steps of the method for fabricating the nonvolatile semiconductor memory device according to the first embodiment;

DETAILED DESCRIPTION OF THE INVENTION

Embodiment 1

A nonvolatile semiconductor memory device according to a first embodiment of the present invention and a method for fabricating the same will be described with reference to the drawings.

The description will be given first to a memory element (memory cell) in the nonvolatile semiconductor memory device.

Figure 1:
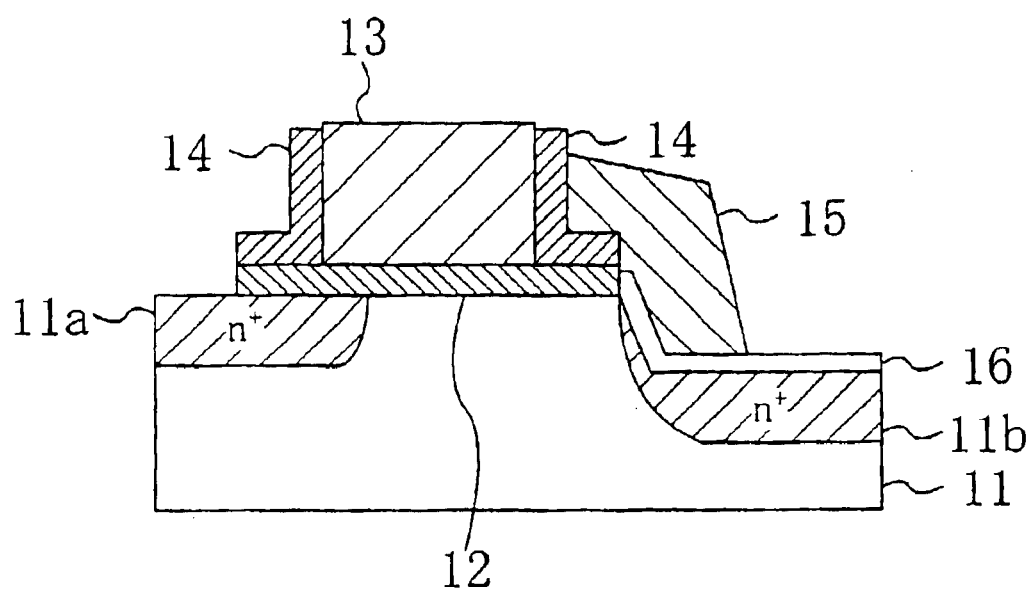
FIG. 1 is a structural cross-sectional view of a memory element in a nonvolatile semiconductor memory device according to a first embodiment of the present invention.

FIG. 1 shows a cross-sectional structure of the memory element in the nonvolatile semiconductor memory device according to the first embodiment. As shown in FIG. 1, a control gate electrode 13 composed of n-type polysilicon is formed on a semiconductor substrate 11 composed of p-type silicon via a gate oxide film 12 with a thickness of about 13.5 nm. A protective insulating film 14 for protecting the control gate electrode 13 during the formation of a floating gate electrode 15 is formed on each of the side surfaces of the control gate electrode 13. The protective insulating, film 14 is composed of a silicon dioxide film or a silicon nitride film deposited thereon and having a thickness of about 7 nm or of a multilayer structure thereof. The floating gate electrode 15 is formed on one of the side surfaces of the control gate electrode 13 in opposing and capacitively coupled relation to the control gate electrode 13 with the protective insulating film 14 interposed therebetween. The portion of the protective insulating film 14 opposed to the floating gate electrode 15 functions as a capacitance insulating film.

A tunnel insulating film 16 with a thickness of about 9 nm is formed between the semiconductor substrate 11 and the floating gate electrode 15.

An n-type drain region 11b is formed in a region of the semiconductor substrate 11 including a lower part of the floating gate electrode 15, while an n-type source region 11a is formed in a region of the semiconductor substrate 11 opposite to the drain region 11b relative to the control gate electrode 13.

Referring to the drawing, a detailed description will be given to a method for fabricating the nonvolatile semiconductor memory device including the memory element thus constituted, a MOS transistor in a peripheral circuit for driving the memory element, a resistor element in the peripheral circuit, and the like.

FIGS. 2A to 14C show cross-sectional structures of the nonvolatile semiconductor memory device according to the first embodiment in the individual process steps of the fabrication method therefor.

By way of example, a semiconductor substrate 21 composed of single-crystal silicon and including a p-type semiconductor region containing a p-type impurity at a concentration of about $5 \times 10^{15}$ cm$^{-3}$ to $5 \times 10^{16}$ cm$^{-3}$ is used herein below.

(1) Formation of Isolation Regions

First, isolation regions for dielectrically isolating elements including the memory element, the MOS transistor, and the like are formed in upper portion of the semiconductor substrate 21.

Specifically, the semiconductor substrate 21 is thermally oxidized in an oxygen atmosphere at a temperature of about 900° C., whereby a first thermal oxide film 22 with a thickness of about 10 nm is formed on a principal surface of the semiconductor substrate 21. Subsequently, monosilane $(SiH_4)_1$ ammonia $(NH_3)$, and nitrogen $(N_2)$ are caused to react at a temperature of about 760° C. by plasma vapor deposition (plasma CVD (Plasma Chemical Vapor Deposition)) so that a first silicon nitride $(Si_xN_y)$ film 23 with a thickness of about 150 nm is deposited on the first thermal oxide film 22.

Next, as shown in FIG. 2A, a mask pattern 101 composed of a resist film patterned with openings over a plurality of isolation regions is formed by photolithography on the deposited first silicon nitride film 23. By using the formed mask pattern 101, anisotropic dry etching is performed with respect to the first silicon nitride film 23, the first thermal oxide film 23, and the semiconductor substrate 21, thereby forming a plurality of isolation trenches 21a each at a depth of about 400 nm measured from the upper surface of the first silicon nitride film 23. By forming the plurality of isolation trenches 21a, a memory element portion 3 is formed in a memory circuit formation region 1, while a low-voltage n-type channel transistor portion 4, a low-voltage p-type channel transistor portion 5, a high-voltage n-type channel transistor portion 6, a high-voltage p-type channel transistor portion 7, a resistor element portion 8, and a capacitor element portion 9 are formed in a peripheral circuit formation region 2. In the low-voltage transistor portions 4 and 5, logic transistors each driven at a voltage of about 1.8 V are formed. In the high-voltage transistor portions 6 and 7, on the other hand, high breakdown voltage transistors each driven at a voltage of about 6 V are formed. It is to be noted that the memory circuit formation region 1 and the peripheral circuit formation region 2 exist mixedly in the region shown in FIG. 2A. After the mask pattern 101 is removed, the semiconductor substrate 21 is thermally oxidized in an oxygen atmosphere at a temperature of about 900° C., whereby a thermal oxide film (not shown) with a thickness of about 25 nm is formed on an exposed surface of each of the isolation trenches 21a. This covers the interface between the semiconductor substrate 21 and each of the isolation trenches 21a with a highest-quality oxide film and improves the operation and long-term reliability of each of the elements.

Next, as shown in FIG. 2B, monosilane $(SiH_4)$ is thermally decomposed by vacuum vapor deposition (vacuum CVD) performed at a temperature of about 760° C. and under a pressure of about 20×133.3 mPa, whereby a first silicon dioxide film 24A with a thickness of about 700 nm is deposited over the entire surface of the first silicon nitride film 23 to fill in the isolation trenches 21a. At this time, the regions of the upper surface of the first silicon dioxide film 24 located above the first silicon nitride film 23 protrude convexly from the other regions, though they are not depicted. Subsequently, a mask pattern 102 for masking the regions located above the respective isolation trenches 21a is formed on the deposited first silicon dioxide film 24A. By using the formed mask pattern 102, isotropic etching using hydrofluoric acid is performed with respect to the first silicon dioxide film 24A. The isotropic etching is performed continuously till the protruding portions of the first silicon dioxide film 24A are removed and the upper surface of the first silicon dioxide film 24A is substantially planarized.

Next, as shown in FIG. 2C, the mask pattern 102 is removed and the upper surface of the first silicon dioxide film 24A is polished by chemical mechanical polishing (CMP) such that the portions of the first silicon dioxide film 24A filled in the isolation trenches 21a are left, whereby isolation regions 24B are formed in the individual isolation trenches 21a.

(2) Formation of Well Regions

Next, a well region is formed for each of the elements.

Figure 3A:
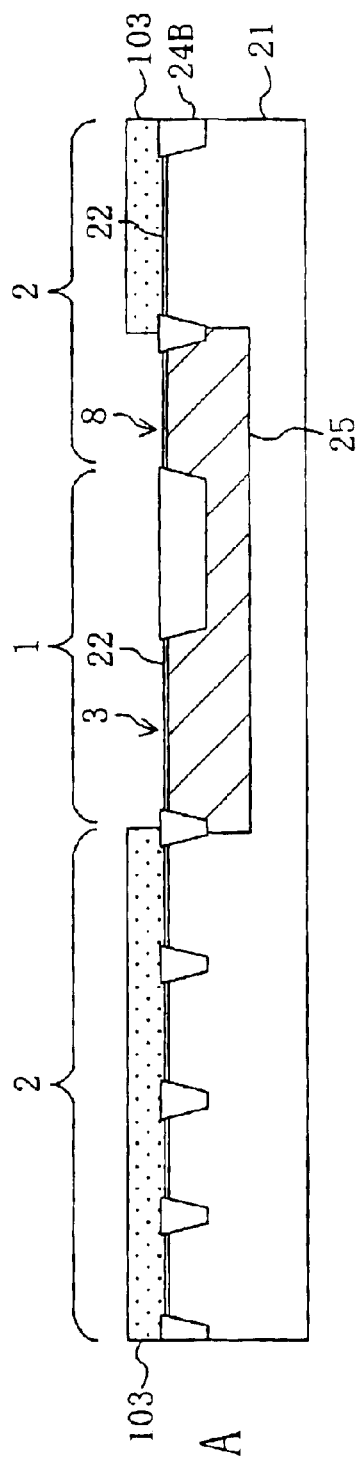
FIGS. 3A to 3C are structural cross-sectional views illustrating the individual process steps of the method for fabricating the, nonvolatile semiconductor memory device according to the first embodiment.

First, to increase the isolation breakdown voltage of the memory circuit formation region 1, a deep n-type well region 25 is formed in the memory element portion 3 of the memory circuit formation region 1 and in the resistor element portion 8 of the peripheral circuit formation region 2. Specifically, as shown in FIG. 3A, a mask pattern 103 having openings over the memory element portion 3 and the resistor element portion 8 is formed on the first thermal oxide film 22. By using the formed mask pattern 103, arsenic (As) or phosphorus (P) ions at a dose of about $0.5 \times 10^{13}$ cm$^{-2}$ to $1 \times 10^{13}$ cm$^{-2}$ are implanted into the semiconductor substrate 21 with an implant energy of about 1200 keV, whereby the deep n-type well region 25 is formed in the memory element portion 3 and resistor element portion 8 of the semiconductor substrate 21.

Figure 3B:
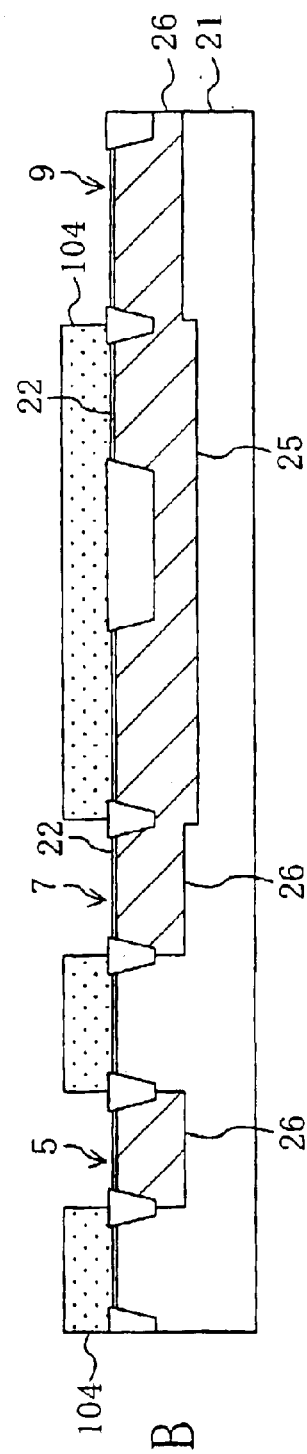

Next, as shown in FIG. 3B, the mask pattern 103 is removed and a mask pattern 104 having openings over the low-voltage p-type channel transistor portion 5, the high-voltage p-type channel transistor portion 7, and the capacitor element portion 9 is formed on the first thermal oxide film 22. By using the formed mask pattern 104, phosphorus (P) ions at a dose of about $0.5 \times 10^{13}$ cm$^{-2}$ to $1 \times 10^{14}$ cm$^{-2}$ are implanted into the semiconductor substrate 21 with an implant energy of about 300 keV, whereby an n-type well region 26 is formed in each of the low-voltage p-type channel transistor portion 5, high-voltage p-type channel transistor portion 7, and capacitor element portion 9 of the semiconductor substrate 21.

Figure 3C:
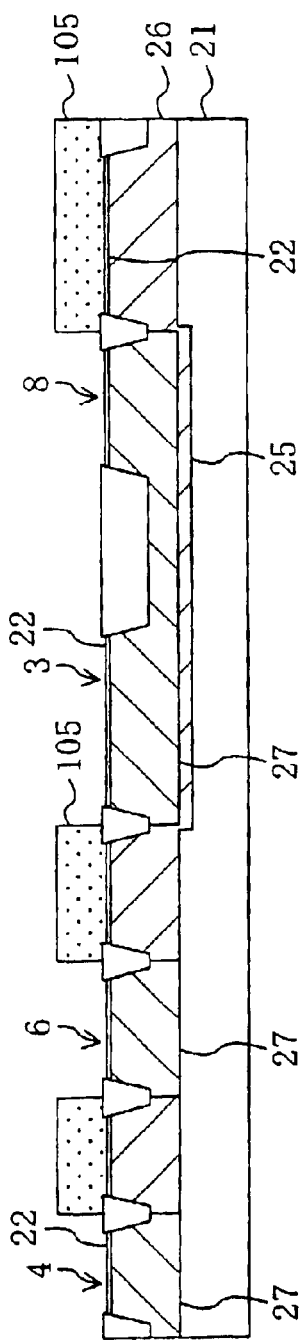

Next, as shown in FIG. 3C, the mask pattern 104 is removed and a mask pattern 105 having openings over the memory element portion 3, the low-voltage n-type channel transistor portion 4, the high-voltage n-type channel transistor portion 6, and the resistor element portion 8 is formed on the first thermal oxide film 22. By using the formed mask pattern 105, boron (B) ions at a dose of about $0.5 \times 10^{13}$ cm$^{-2}$ to $1 \times 10^{14}$ $^{cm-2}$ are implanted into the semiconductor substrate 21 with an implant energy of about 300 kev, whereby a p-type well region 27 is formed in each of the memory element portion 3, low-voltage n-type channel transistor portion 4, high-voltage n-type channel transistor portion 6, and resistor element portion 8 of the semiconductor substrate 21.

(3) Formation of Gate Oxide Films

Then, gate oxide films having different breakdown voltages for the individual elements including, the memory element and the transistor are formed.

Specifically, the mask pattern 105 is removed first and then the first thermal oxide film 22 on the principal surface of the semiconductor substrate 21 is removed by wet etching using hydrofluoric acid. Subsequently, the semiconductor substrate 21 is thermally oxidized in an oxygen atmosphere at a temperature of about 850° C., whereby a second thermal oxide film 28 with a thickness of about 15 nm is formed on the principal surface of the semiconductor substrate 21.

Figure 4A:
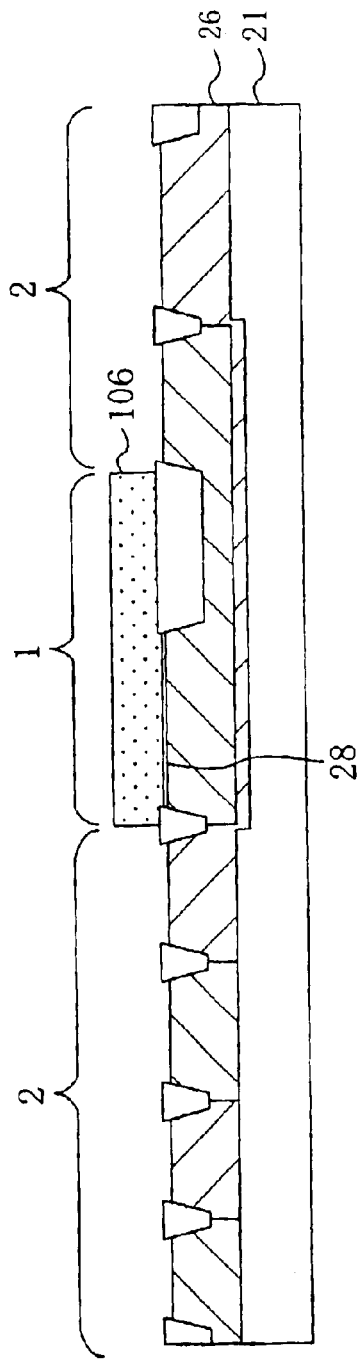
FIGS. 4A to 4C are structural cross-sectional views illustrating the individual process steps of the method for fabricating the nonvolatile semiconductor memory device according to the first embodiment.

Next, as shown in FIG. 4A, the portion of the second thermal oxide film 28 on the peripheral circuit formation region 2 of the semiconductor substrate 21 is removed therefrom by wet etching using hydrofluoric acid and the mask pattern 106 for masking the memory circuit formation region 1 of the second thermal oxide film 28.

Figure 4B:
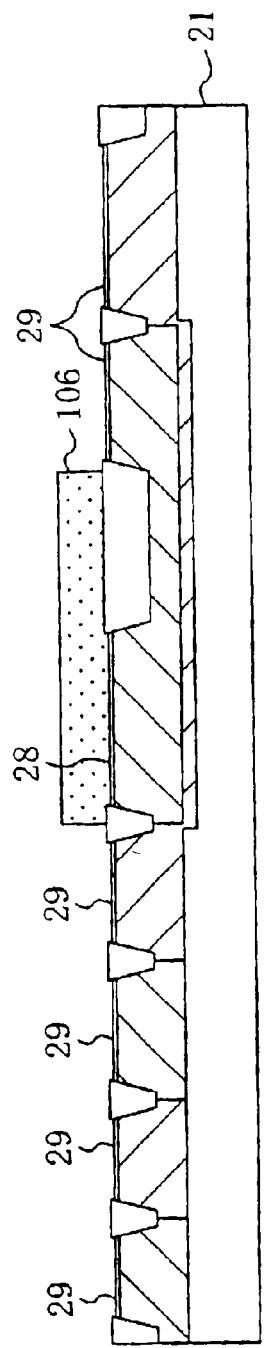

Next, as shown in FIG. 4B, the semiconductor substrate 21 is thermally oxidized in an oxygen atmosphere at a temperature of about 850° C. by using the mask pattern 106, whereby a third thermal oxide film 29 with a thickness of about 7.5 nm is formed on the peripheral circuit formation region 2 of the semiconductor substrate 21.

Figure 4C:
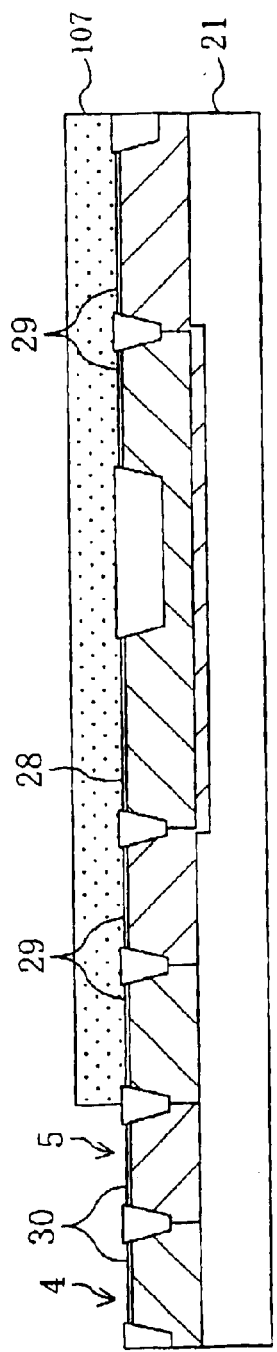

Next, as shown in FIG. 4C, the mask pattern 106 is removed and then a mask pattern 107 having openings over the low-voltage n-type channel transistor portion 4 and the low-voltage p-type channel transistor portion 5 is formed over the second thermal oxide film 28 and the third thermal oxide film 29. By using the formed mask pattern 107, the portions of the third thermal oxide film 29 on the semiconductor substrate 21 are removed therefrom by wet etching using a hydrofluoric acid. By subsequently using the mask pattern 107, the semiconductor substrate 21 is thermally oxidized in an oxygen atmosphere at a temperature of about 850° C., whereby a fourth thermal oxide film 30 with a thickness of about 3.5 nm is formed over the low-voltage n-type channel transistor portion 4 and the low-voltage p-type channel transistor portion 5 of the semiconductor substrate 21.

By the foregoing process steps, the second thermal oxide film 28 which is a gate oxide film for the memory element having a thickness of about 13.5 nm and a breakdown voltage of about 10 V is formed on the memory element portion 3 of the semiconductor substrate 21, the third thermal oxide film 29 which is a high-breakdown-voltage gate oxide film having a thickness of about 8.5 nm and a high breakdown voltage of about 7V is formed on each of the high-voltage n-type channel transistor portion 6 and high-voltage p-type channel transistor portion 7 of the semiconductor substrate 21, and the fourth thermal oxide film 30 which is a low-breakdown-voltage gate oxide film having a thickness of about 3.5 nm and a low breakdown voltage of about 4 V is formed on each of the low-voltage n-type channel transistor portion 4 and low-voltage p-type channel transistor portion 5 of the semiconductor substrate 21.

(4) Formation of Memory Element

Figure 5A:
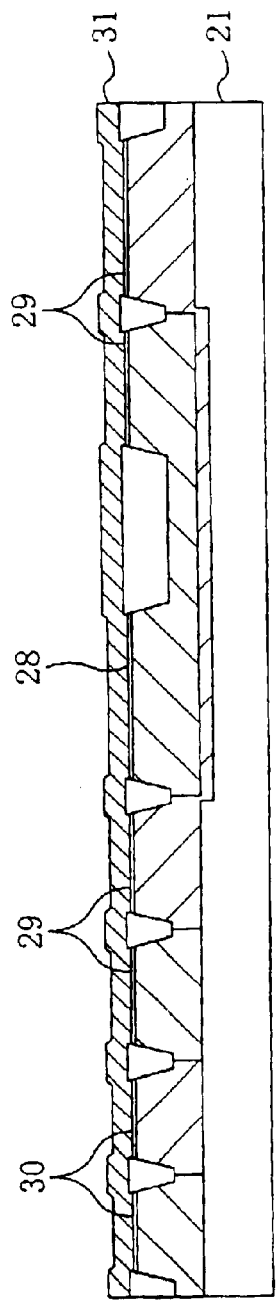
FIGS. 5A to 5C are structural cross-sectional views illustrating the individual process steps of the method for fabricating the nonvolatile semiconductor memory device according to the first embodiment.

First, as shown in FIG. 5A, the mask pattern 107 is removed and then a non-doped polysilicon film 31 with a thickness of about 200 nm is deposited by, e.g., CVD entirely over the first, second, and third thermal oxide films 28, 29, and 30.

Figure 5B:
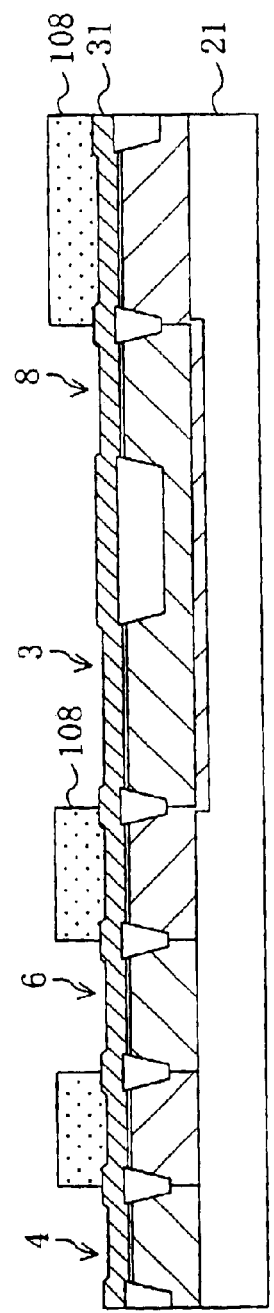

Next, as shown in FIG. 5B, a mask pattern 108 having openings over the memory element portion 3, the low-voltage n-type channel transistor portion 4, the high-voltage n-type channel transistor portion 6, and the resistor element portion 8 is formed on the polysilicon film 31. By using the formed mask pattern 108, phosphorus (P) ions at a dose of about $0.5 \times 10^{15}$ cm$^{-2}$ to $5 \times 10^{15}$ cm$^{-2}$ are implanted into the polysilicon film 31 with an implant energy of about 10 keV, thereby changing the conductivity type of the polysilicon film 31 in each of the memory element portion 3, the low-voltage n-type channel transistor portion 4, the high-voltage n-type channel transistor portion 6, and the resistor element portion 8 into the n-type.

Figure 5C:
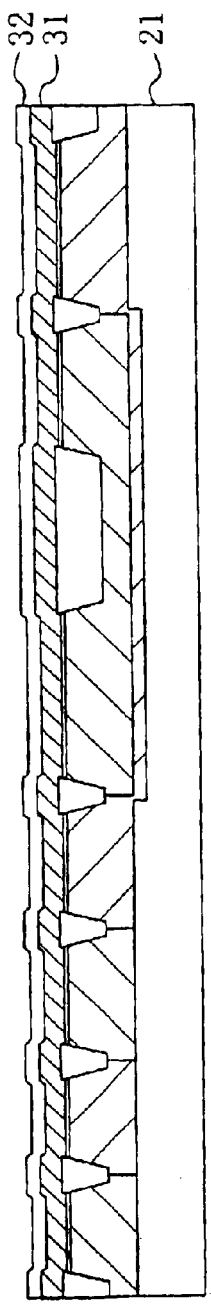

Next, as shown in FIG. 5C, the mask pattern 108 is removed and then a second silicon nitride film 32 with a thickness of about 100 nm is deposited by plasma CVD over the entire surface of the polysilicon film 31.

Next, as shown in FIGS. 6A and 6B, dry etching is performed sequentially with respect to the second silicon nitride film 32 and the polysilicon film 31 by using a mask pattern 109 on the second silicon nitride film 32 which is a pattern for forming the control gate electrode of the memory element, thereby forming a control gate electrode 31A composed of the n-type polysilicon film having an upper surface covered with the second silicon nitride film 32.

Next, as shown in FIG. 6C, the mask pattern 109 is removed and then a mask pattern 110 having an opening over the drain formation region of the memory element portion 3 and the side of the control gate electrode 31A closer to the drain region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 keV, whereby a first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and then implant the boron (B) ions under the implant conditions described above.

Figure 7A:
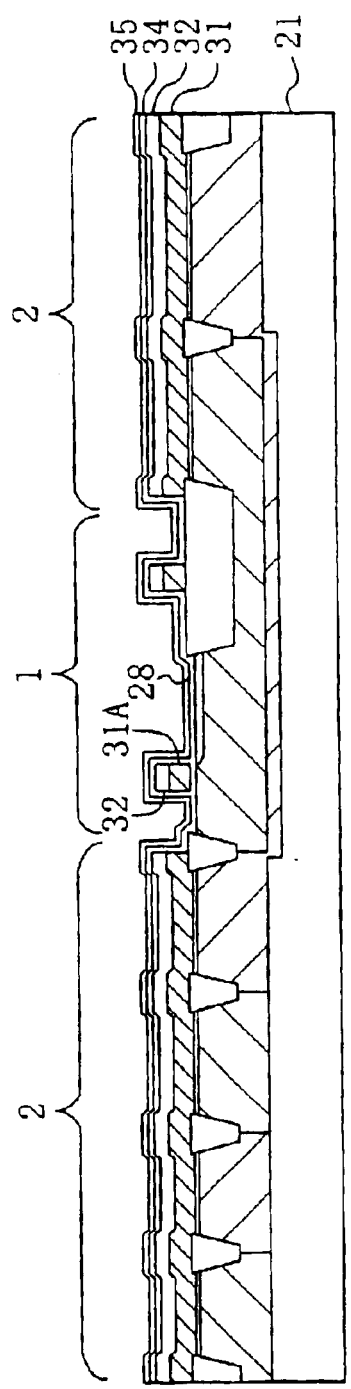
FIGS. 7A to 7C are structural cross-sectional views illustrating the individual process steps of the method for fabricating the nonvolatile semiconductor memory device according to the first embodiment.

Next, as shown in FIG. 7A, the mask pattern 110 is removed and then a second silicon dioxide film 34 and a third silicon nitride film 35 each having a thickness of about 5 nm to 10 nm are deposited successively by CVD over the entire surface of the semiconductor substrate 21 including the second silicon nitride film 32 and the control gate electrode 31A.

Figure 7B:
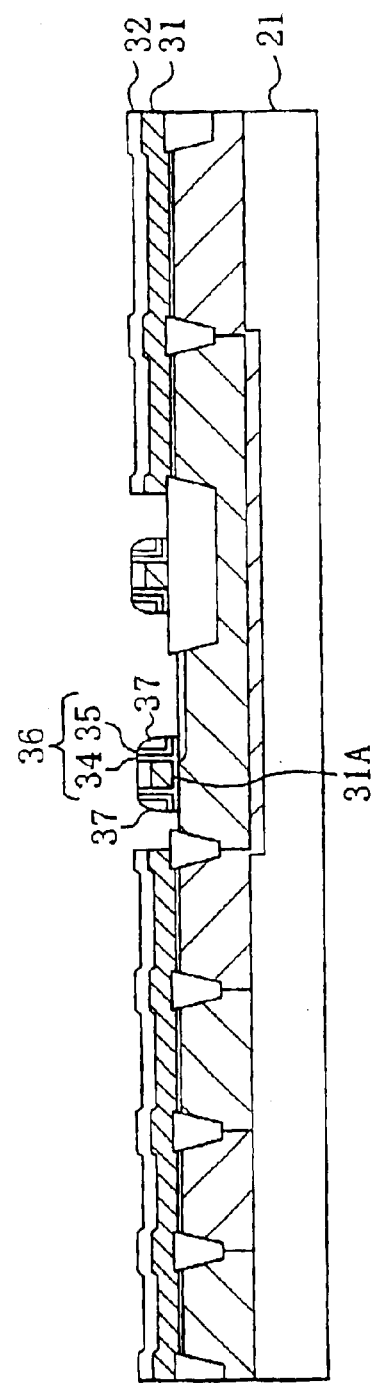

Next, an insulating film with a thickness of about 40 nm to 100 nm and composed of BPSG is deposited by CVD over the entire surface of the third silicon nitride film 35. Then, as shown in FIG. 7B, anisotropic etching is performed to etch back the deposited insulating film and further remove the third silicon nitride film 35, the second silicon dioxide film 34, and the second thermal oxide film 28, thereby exposing the semiconductor substrate 21 and forming sidewalls 37 on the side surfaces of the control gate electrode 31A via a protective insulating film 36 composed of the second silicon dioxide film 34 and the third silicon nitride film 35.

Figure 7C:
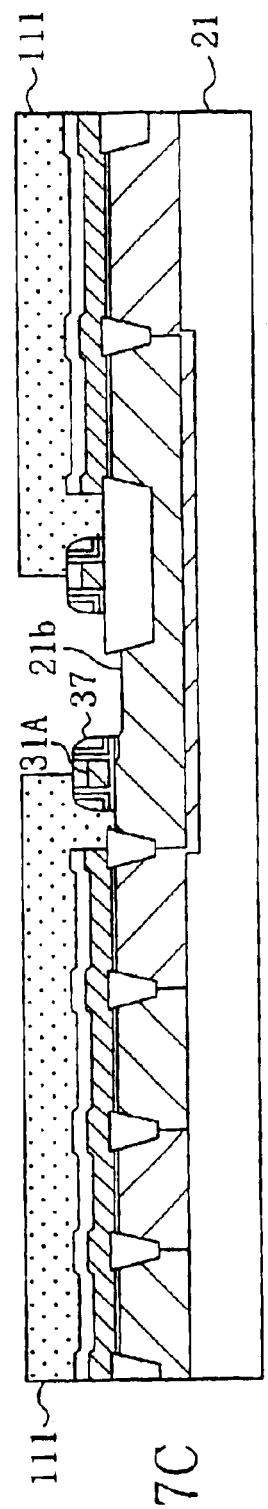

Next, as shown in FIG. 7C, a mask pattern 111 having openings over a drain region and the side of the control gate electrode 31A closer to the drain region in the memory circuit formation region 1 is formed on the semiconductor substrate 21. By using the formed mask pattern 111, the control gate electrode 31A, and the sidewalls 37, dry etching is performed with respect to the semiconductor substrate 21 by reactive-ion etching (RIE), thereby forming a recessed portion 21b at a depth of about 25 nm to 75 nm in an upper portion of the semiconductor substrate 21. The etching may also be performed by CDE (Chemical Dry Etching) instead of RIE.

Next, as shown in FIG. 8A, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 keV by using the mask pattern 111, whereby a second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 keV to 50 keV by using the mask pattern 111, whereby a shallow lightly doped n-type impurity diffusion region 38 having a near-surface impurity concentration of about $5 \times 10^{16}$ cm$^{-3}$ to $1 \times 10^{19}$ cm$^{-3}$ and a junction depth of about 40 nm is formed.

Next, as shown in FIG. 8B, the mask pattern 111 is removed and the sidewalls 37 are further removed by using vapor-phase hydrofluoric acid. Then, as shown in FIG. 8C, the semiconductor substrate 21 is thermally oxidized in an oxygen atmosphere at a temperature of about 850° C., whereby a tunnel insulating film 39 with a thickness of about 9 nm is formed on the exposed surface of the recessed portion 21b of the semiconductor substrate 21.

Figure 9A:
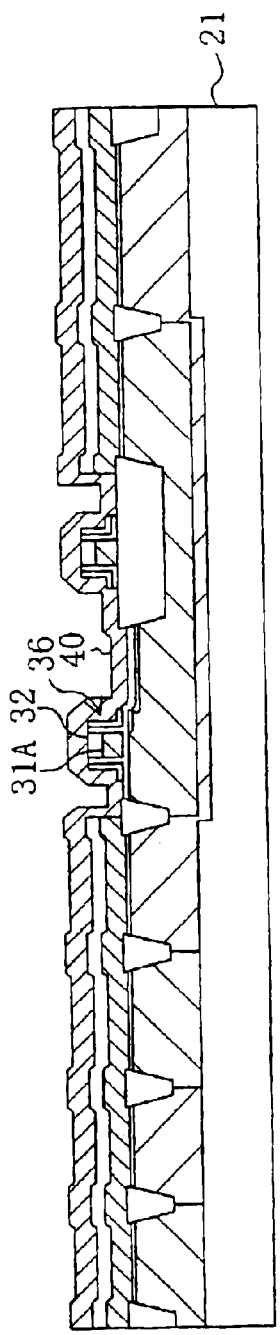
FIGS. 9A to 9C are structural cross-sectional views illustrating the individual process steps of the method for fabricating the nonvolatile semiconductor memory device according to the first embodiment.

Next, as shown in FIG. 9A, a polysilicon film 40 doped with phosphorus (P) (hereinafter referred to as DP (Doped Poly Silicon)) and having a thickness of about 120 nm to 200 nm is formed by CVD over the entire surface of the semiconductor substrate 21 including the gate electrode 31A and the protective insulating film 36.

Figure 9B:
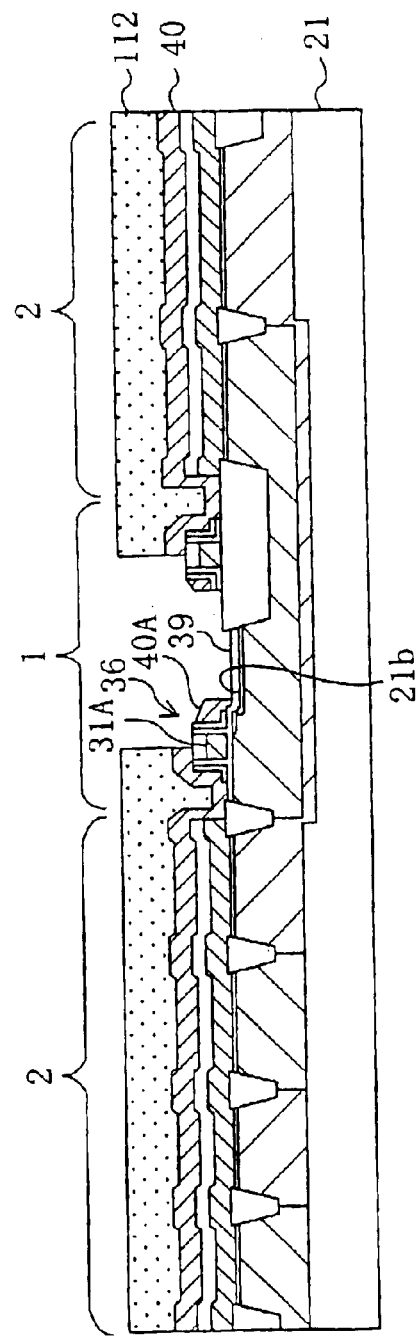

Next, as shown in FIG. 9B, a mask pattern 112 having an opening over the drain region and the side of the control gate electrode 31A closer to the drain region in the memory circuit formation region 1 is formed on the semiconductor substrate 21. By using the formed mask pattern 112, the DP film 40 is etched back by anisotropic dry etching to form a sidewall-like DP film 40A on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21.

Figure 9C:
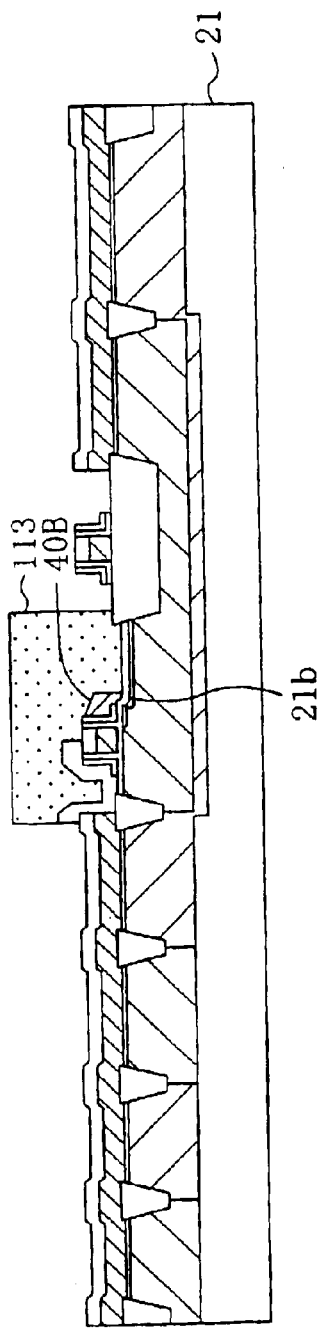

Next, as shown in FIG. 9C, the mask pattern 112 is removed and then a mask pattern 113 for masking the sidewall-like DP film 40A is formed for each of the memory elements in the memory circuit formation region 1. By performing dry etching using the formed mask pattern 113, floating gate electrodes 40B are formed by self alignment from the sidewall-like DP film 40A such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, as shown in FIG. 10A, the mask pattern 113 is removed and then a mask pattern 114 for masking the floating gate electrode 40B is formed such that the DP film 40 except for the portion forming the floating gate electrode 40B is removed by CDE using CF$_4$ gas and oxygen gas.

Next, as shown in FIG. 10B, a protective oxide film 41 composed of a silicon dioxide and having a thickness of about 20 nm to 40 m to protect the memory elements is deposited over the entire surface of the semiconductor substrate 21 including the control gate electrode 31A and the floating gate electrode 40B.

Next, as shown in FIG. 10C, a mask pattern 115 having an opening over the memory circuit formation region 1 is formed on the semiconductor substrate 21. By using the formed mask pattern 115, the control gate electrode 31A, and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 keV. As a result, a source region 42 and a drain region 43 in each of which the near-surface impurity concentration of arsenic is about $5\times10^{19}$ cm$^{-3}$ to $1\times10^{21}$ cm$^{-3}$ are formed in the memory element portion 3 of the semiconductor substrate 21, whereby the nonvolatile semiconductor memory element is completed.

Although the stepped portion covered up with the floating gate electrode 40B is provided under the floating gate electrode 40B in the memory element portion 3 of the semiconductor substrate 21 in the first embodiment such that hot electrons are implanted with high efficiency into the floating gate electrode 40B, the stepped portion may not be provided.

(5) Formation of Elements in Peripheral Circuit Formation Region

Figure 11A:
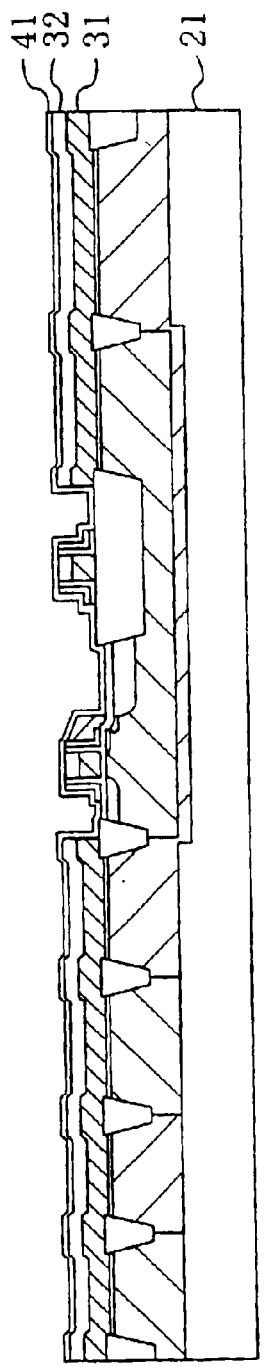
FIGS. 11A to 11C are structural cross-sectional views illustrating the individual process steps of the method for fabricating the nonvolatile semiconductor memory device according to the first embodiment.
Figure 11B:
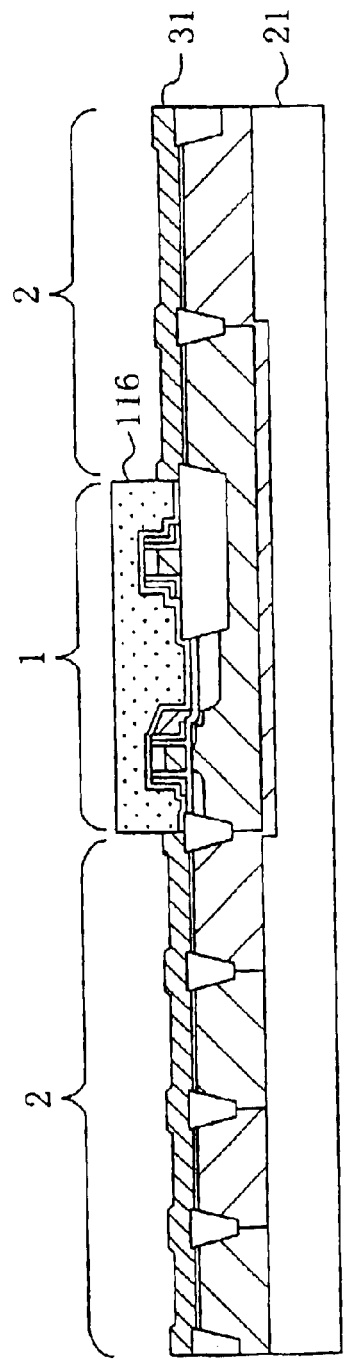

Next, as shown in FIG. 11A, the mask pattern 115 is removed. Then, as shown in FIG. 11B, the protective oxide film 41 and the second silicon nitride film 32 are removed by dry etching using a mask pattern 114 for masking the memory circuit formation region 1 of the semiconductor substrate 21.

Figure 11C:
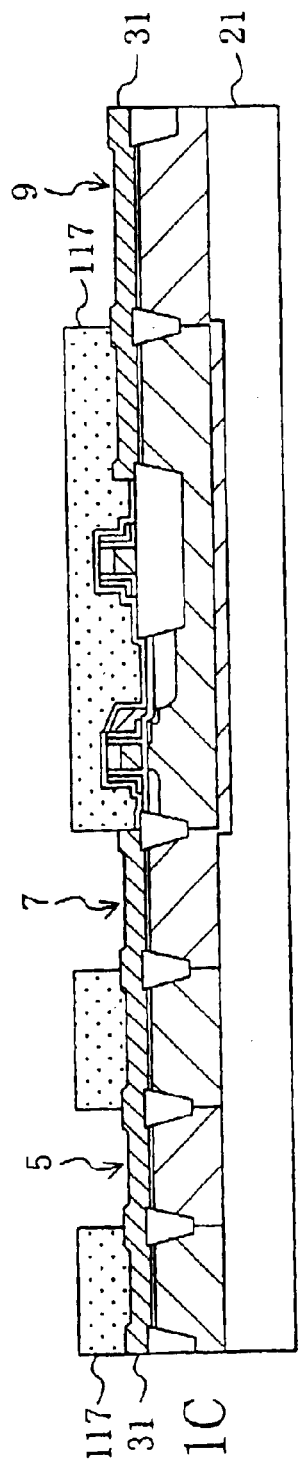

Next, as shown in FIG. 11C, the mask pattern 116 is removed and then a mask pattern 117 having openings over the low-voltage p-type channel transistor portion 5, the high-voltage p-type channel transistor portion 7, and the capacitor element portion 9 is formed on the polysilicon film 31. By using the formed mask pattern 117, boron (B) ions at a dose of about $0.5\times10^{15}$ cm$^{-2}$ to $5\times10^{15}$ cm$^{-2}$ are implanted into the polysilicon film 31 with an implant energy of about 10 keV, thereby changing the conductivity type of the polysilicon film 31 in each of the low-voltage p-type channel transistor portion 5, the high-voltage p-type channel transistor portion 7, and the capacitor element portion 9 into the p-type.

Next, as shown in FIG. 12A, the mask pattern 117 is removed. Then, anisotropic dry etching is performed with respect to the polysilicon film 31 by using a mask pattern 118 for masking the portions of the polysilicon film 31 located in the memory circuit formation region 1, the gate electrode formation portion of the polysilicon film 31 located in the peripheral circuit formation region 2, and the portion of the polysilicon film 31 to be formed with the upper electrode of the capacitor element, which is located in the peripheral circuit formation region 2. As a result, gate electrodes 31B composed of the n-type polysilicon film 31 and the p-type polysilicon film 31 are formed in the low-voltage n-type channel transistor portion 4 and the low-voltage p-type channel transistor portion 5, respectively, each via a gate oxide film composed of the fourth thermal oxide film 30. Likewise, the gate electrodes 31B composed of the n-type polysilicon film 31 and the p-type polysilicon film 31 are formed in the high-voltage n-type channel transistor portion 6 and the high-voltage p-type channel transistor portion 7, respectively, each via a gate oxide film composed of the third thermal oxide film 29. In the capacitor element portion 9, the capacitor element composed of the semiconductor substrate 21 as the lower electrode, the third thermal oxide film 29 as the capacitance insulating film, and the n-type polysilicon film 31 as the upper electrode 31C is formed.

Next, as shown in FIG. 12B, the mask pattern 118 is removed and then a mask patter 119 having an opening over the high-voltage n-type channel transistor portion 6 is formed on the semiconductor substrate 21. By using the formed mask pattern 119 and the gate electrode 31B as a mask, arsenic (As) ions at a relatively low dose of about $5\times10^{12}$ cm$^{-2}$ to $1\times10^{14}$ cm$^{-2}$ are implanted into the semiconductor substrate 21 with an implant energy of about 20 keV, whereby n-type LDD (Lightly Doped Drain) regions 44 are formed in the high-voltage n-type channel transistor portion 6 of the semiconductor substrate 21.

Next, as shown in FIG. 12C, the mask pattern 119 is removed and then a mask pattern 120 having openings over the low-voltage p-type channel transistor portion 5, the high-voltage p-type channel transistor portion 7, and the capacitor element portion 9 is formed on the semiconductor substrate 21. By using the formed mask pattern 120 and the gate electrodes 31B as a mask, boron (B) ions at a relatively low dose of about $5\times10^{12}$ cm$^{-2}$ to $1\times10^{14}$ cm$^{-2}$ are implanted into the semiconductor substrate 21 with an implant energy of about 20 keV, whereby p-type LDD regions 45 are formed in the low-voltage p-type channel transistor portion 5 and high-voltage p-type channel transistor portion 7 of the semiconductor substrate 21.

Figure 13A:
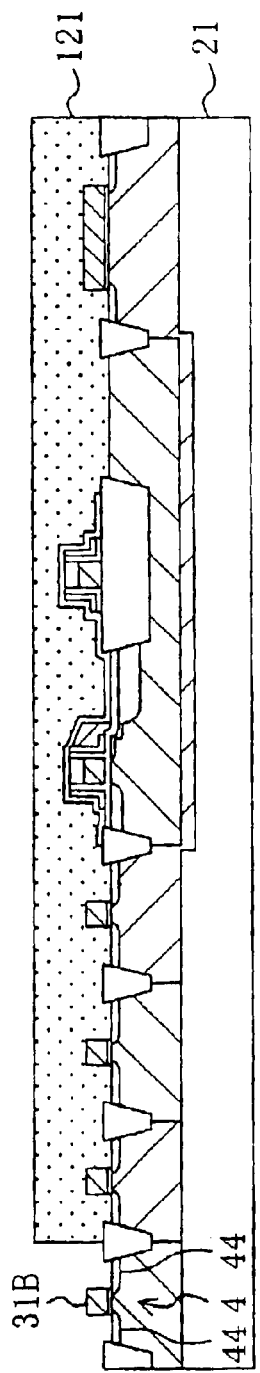
FIGS. 13A to 13C are structural cross-sectional views illustrating the individual process steps of the method for fabricating the nonvolatile semiconductor memory device according to the first embodiment.

Next, as shown in FIG. 13A, the mask pattern 120 is removed and then a mask pattern 121 having an opening over the low-voltage n-type channel transistor portion 4 is formed on the semiconductor substrate 21. By using the formed mask pattern 121 and the gate electrodes 31B as a mask, arsenic (As) ions at a relatively low dose of about $5\times10^{12}$ cm$^{-2}$ to $1\times10^{14}$ cm$^{-2}$ are implanted into the semiconductor substrate 21 with an implant energy of about 20 kev, whereby the n-type LDD regions 44 are formed in the low-voltage n-type channel transistor portion 4 of the semiconductor substrate 21.

Figure 13B:
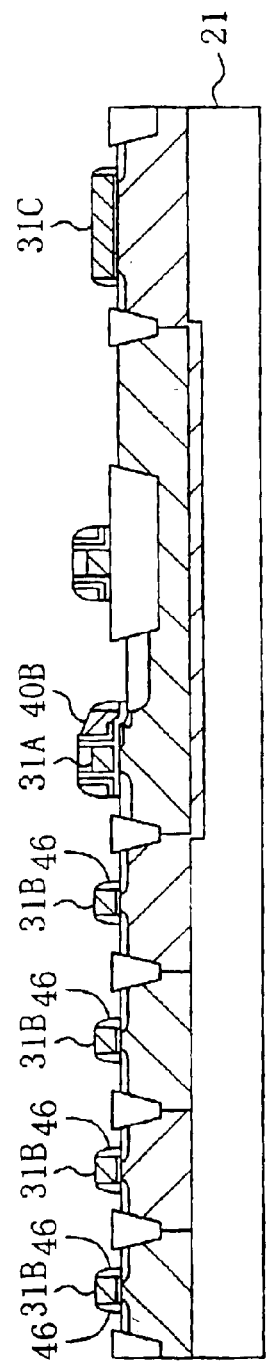

Next, as shown in FIG. 13B, the mask pattern 121 is removed. Then, a silicon dioxide film with a thickness of about 100 nm is deposited by CVD over the entire surface of the semiconductor substrate 21 including the gate electrode 31B, control gate electrode 31A, floating gate electrode 40B, and the like of each of the MOS transistors. The deposited silicon dioxide film is etched back by anisotropic etching to form sidewall spacers 46 composed of the silicon dioxide film on the side surfaces of each of the gate electrodes 31B.

Figure 13C:
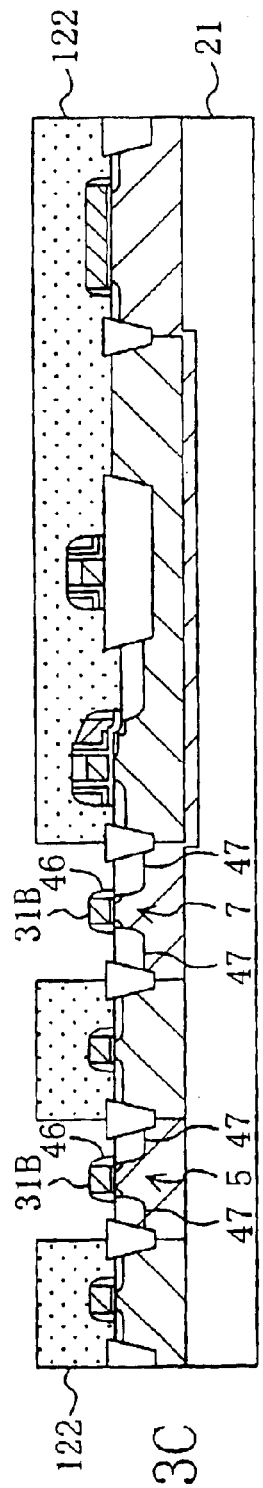

Next, as shown in FIG. 13C, a mask pattern 122 having openings over the low-voltage p-type channel transistor portion 5 and the high-voltage p-type channel transistor portion 7 is formed on the semiconductor substrate 21. By using the formed mask pattern 122 and the gate electrodes 31B as a mask, boron (B) ions at a relatively high dose of about $0.5\times10^{13}$ cm$^{-2}$ to $1\times10^{14}$ cm$^{-2}$ are implanted into the semiconductor substrate 21 with an implant energy of about 100 keV, whereby p-type source/drain regions 47 in each of which the near-surface impurity concentration of boron is about $5\times10^{19}$ cm$^{-3}$ to $1\times10^{21}$ cm$^{-3}$ are formed in the low-voltage p-type channel transistor portion 5 and high-voltage p-type channel transistor portion 7 of the semiconductor substrate 21.

Next, as shown in FIG. 14A, the mask pattern 122 is removed and then a mask pattern 123 for masking the low-voltage p-type channel transistor portion 5 and the high-voltage p-type channel transistor portion 7 is formed on the semiconductor substrate 21. By using the formed mask pattern 123, the gate electrode 31B, the control gate electrode 31A, and the floating gate electrode 40B as a mask, arsenic (As) ions at a relatively high dose of about $5\times10^{13}$ cm$^{-2}$ to $1\times10^{14}$ cm$^{-2}$ are implanted into the semiconductor substrate 21 with an implant energy of about 100 kev, whereby n-type source/drain regions 48 in each of which the near-surface impurity concentration of arsenic is about $5\times10^{19}$ cm$^{-3}$ to $1\times10^{21}$ cm$^{-3}$ are formed in the low-voltage n-type channel transistor portion 4 and high-voltage channel transistor portion 6 of the semiconductor substrate 21.

Although ion implantation has also been performed with respect to the memory circuit formation region 1, it is also possible not to perform implantation of arsenic ions by masking the memory circuit formation region 1.

Next, a third silicon dioxide film 49 with a thickness of 30 nm is deposited over the entire surface of the semiconductor substrate 21 including the individual elements. Then, as shown in FIG. 14B, the third silicon dioxide film 49 is removed by etching using a mask pattern 124 for selectively masking the portion of the third silicon dioxide film 49 located in the memory circuit formation region 1 and the portion of the third silicon dioxide film 49 located in the resistor element portion 8 of the peripheral circuit formation region 2.

Next, as shown in FIG. 14C, the mask pattern 124 is removed. Then, a cobalt film is deposited over the entire surface of the semiconductor substrate 21 including the third silicon dioxide film 49. By performing a heat treatment with respect to the deposited cobalt film, cobalt silicide regions 50 are formed at the interface between the semiconductor substrate 21 and the cobalt film and at the interface between the upper electrode 31C and the cobalt film. Since the portion covered with the third silicon dioxide film 49 does not react with the cobalt film, it can easily be removed.

Finally, the memory element portion 3, each of the transistor portions 4 to 7, the resistor element portion 8, and the capacitor element portion 9 are provided with specified wires which are not depicted, whereby the nonvolatile semiconductor memory device is completed.

Thus, according to the first embodiment, the side surfaces of the control gate electrode 31A are not oxidized in the step of forming the tunnel insulating film 39 shown in FIG. 8C since they are covered with the protective insulating film 36 composed of the second silicon dioxide film 34 and the third silicon nitride film.

In addition, the both side surfaces of the control gate electrode 31A are protected from damage caused by etching in the step of forming the floating gate electrode 40B shown in FIGS. 9B to 10A since they are covered with the protective insulating film 36.

Since the sidewalls 37 composed of BPSG on the control gate electrode 31A have bottom surfaces which are on the protective insulating film 36 and are not in direct contact with the semiconductor substrate 21 as shown in FIG. 7B, the surface of the semiconductor substrate 21 is not damaged when the sidewalls 37 are removed in the subsequent step. This stabilizes the operation of the memory element.

Since the memory circuit formation region 1 is substantially covered with the mask pattern composed of the resist film in the steps of forming the elements in the peripheral circuit formation region 2 shown in FIGS. 11B to 14C, the control gate electrode 31A and the floating gate electrode 40B suffer no etching damage.

Since each of the MOS transistors in the peripheral circuit formation region 2 undergoes no thermal hysteresis different from that undergone during the fabrication process therefor, it is no more necessary to change the design of circuits contained in the peripheral circuit formation region 2. This improves the versatility and compatibility of already designed circuits (design resources).

Although only one memory element is depicted in the memory circuit formation region 1 under constrains placed on the drawing, it will easily be appreciated that a plurality of memory elements are provided in practice and a larger number of MOS transistors and resistor elements are provided in the peripheral circuit formation region 2 as well.

Although the two low-voltage transistor portions 4 and 5 and the two high-voltage transistor portions 6 and 7 have been provided in the first embodiment, it is also possible to provide either the low-voltage transistor portions 4 and 6 or the high-voltage transistor portions 6 and 7 or use other MOS transistors.

Variation of Embodiment 1

A variation of the first embodiment of the present invention will be described with reference to the drawings.

Figure 15:
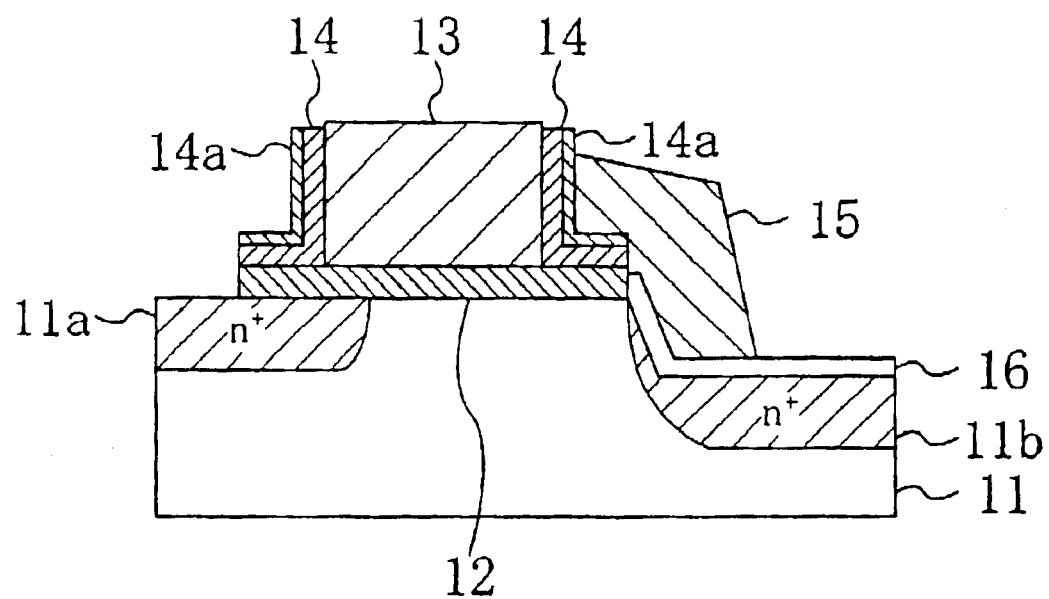
FIG. 15 is a structural cross-sectional view of a memory element in a nonvolatile semiconductor memory device according to a variation of the first embodiment.

FIG. 15 shows a cross-sectional structure of a memory element in a nonvolatile semiconductor memory device according to a variation of the first embodiment. In FIG. 15, the same components as shown in FIG. 1 are designated at the same reference numerals.

The present variation features a protective insulating film 14 which is a multilayer structure composed of a silicon dioxide film and a silicon nitride film formed in this order on each of the side surfaces of the control gate electrode 13.

The present variation also features a tunnel insulating film 16 which is formed by internal-combustion pyrogenic oxidation (hydrogen burning) and a silicon dioxide film 14a which is formed on the side surface of the silicon nitride film of the protective insulating film 14 opposite to the control gate electrode 13 by internal-combustion pyrogenic oxidation.

As disclosed in "Abstract of the 4th Technical Meeting on the Formation, Evaluation, and Reliability of Ultra-Thin Silicon Dioxide Films" under the title of "Oxidation of Silicon by In-Situ Steam Generation (ISSG) and Reaction Mechanism" (Tohkai et al., pp.127–132, Japan Society of Applied Physics, Jan. 21 and 22, 2000), the internal-combustion pyrogenic oxidation is a wet oxidation process in which hydrogen gas and oxygen gas are introduced directly into a chamber to react with each other and generate water vapor over a heated semiconductor substrate, with which a silicon dioxide film is formed on a member composed of silicon.

A description will be given herein below to a specific example of a method for forming the tunnel insulating film 16 and the silicon dioxide film 14a.

In the step of forming the tunnel insulating film 39 shown in FIG. 8C according to the first embodiment, e.g., hydrogen gas and oxygen gas are introduced into the chamber of a rapid thermal oxidation apparatus in which a temperature is set to about 900° C. to 1100° C. and a pressure is set to about 1000 Pa to 2000 Pa such that the introduced hydrogen gas and oxygen gas react with each other to generate water vapor over the heated semiconductor substrate 21. By thermally oxidizing the semiconductor substrate 21 with the generated water vapor, the tunnel insulating film 39 with a thickness of 6 nm to 15 nm is formed on the exposed surface of the recessed portion 21b. Since the internal-combustion thermal oxidation also oxidizes a silicon nitride film, as described in the foregoing report, the exposed surface of the silicon nitride film 35 in the outer portion of the protective insulating film 36 is oxidized during the formation of the tunnel insulating film 39, whereby the tunnel insulating film 16 and the silicon dioxide film 14a shown in FIG. 15 are formed.

According to the present variation, the following various effects are achievable in addition to the effects of the first embodiment.

First, the present inventors have found that, if the tunnel insulating film 38 is formed by the internal-combustion thermal oxidation in the step shown in FIG. 8C, accelerated oxidation of the lightly doped n-type impurity diffusion region 38 doped with the arsenic (As) ions is suppressed and the tunnel insulating film 39 is formed to have a nearly uniform thickness. This prevents an increase in the thickness of the tunnel insulating film 39 and thereby suppresses a reduction in erase speed in the memory element. Since the quality of the tunnel insulating film 39 formed by the internal-combustion thermal oxidation is equal or superior to the quality of a tunnel insulating film formed in an oxygen atmosphere at a temperature of 850° C. or more, the reliability of the memory element is improved.

The present inventors have also found that, if the tunnel insulating film 39 is formed by the internal-combustion thermal oxidation, a bird's beak is less likely to occur in the second thermal oxidation film 28 as the gate oxide film of the control gate electrode 31A and the gate oxide film is formed to have a nearly uniform thickness. This increases a write speed and a driving current in the memory element and the performance thereof.

If the driving current is increased, the size of an active region along the width of the control gate electrode 31A can be reduced, which is suitable for further miniaturization.

Since the use of the internal-combustion thermal oxidation also suppresses a bird's beak occurring in a lower portion of the side surface of the control gate electrode 31A, the protective insulating film 36 serving as a capacitance insulating film is formed to have a nearly uniform thickness. This prevents a reduction in the capacitive coupling ratio between the control gate electrode 31A and the floating gate electrode 40B and increases a write speed and an erase speed in the memory element.

Since the formation of the tunnel insulating film 39 by the internal-combustion thermal oxidation forms the silicon dioxide film 14a through oxidation of the exposed surface of the silicon nitride film located in the outer portion of the protective insulating film 14 as shown in FIG. 15, the effect of suppressing the release of electrons accumulated in the floating gate electrode 15 is improved and the reliability of the memory element is improved.

Embodiment 2

A nonvolatile semiconductor memory device according to a second embodiment of the present invention and a method for fabricating the same will be described with reference to the drawings.

Figure 16:
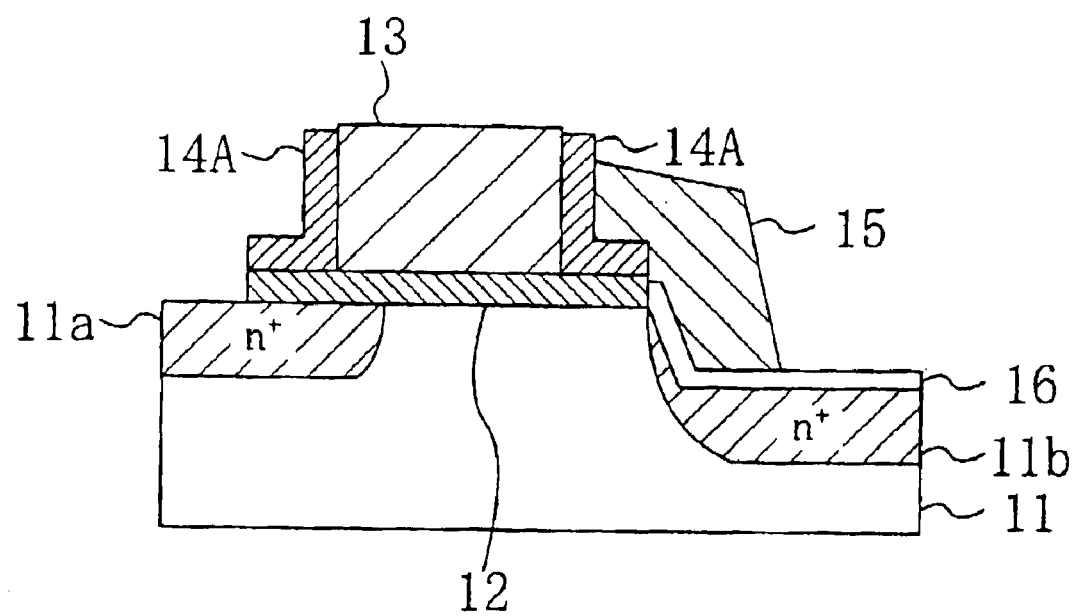
FIG. 16 is a structural cross-sectional view of a memory element in a nonvolatile semiconductor memory device according to a second embodiment of the present invention.

FIG. 16 shows a cross-sectional structure of a memory element in the nonvolatile semiconductor memory device according to the second embodiment. In FIG. 16, the description of the same components as shown in FIG. 1 is omitted by retaining the same reference numerals.

The second embodiment features a protective insulating film 14A which is composed of a single-layer silicon dioxide film.

The description will be given next to a method for fabricating the memory element in the nonvolatile semiconductor memory device according to the second embodiment with reference to FIGS. 17A to 17H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 17A to 17H, the same components as used in the first embodiment are designated at the same reference numerals.

Figure 17A:
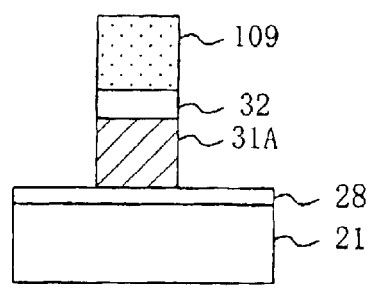
FIGS. 17A to 17H are structural cross-sectional views illustrating the individual process steps of a method for fabricating the memory element in the nonvolatile semiconductor memory device according to the second embodiment.

First, as shown in FIG. 17A, dry etching is performed with respect to the second silicon nitride film 32 and to the polysilicon film 31 by using a mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 17B:
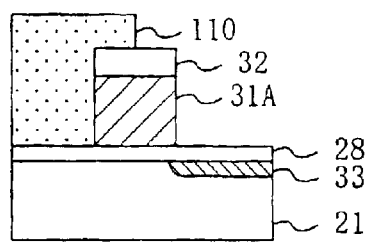

Next, as shown in FIG. 17B, the mask pattern 109 is removed and then a mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 17C:
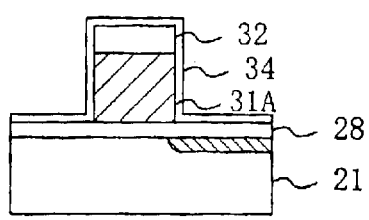

Next, as shown in FIG. 17C, the mask pattern 110 is removed and then the second silicon dioxide film 34 with a thickness of about 5 nm to 15 nm is deposited by CVD over the entire surface of the semiconductor substrate 21 including the second silicon nitride film 32 and the control gate electrode 31A.

Figure 17D:
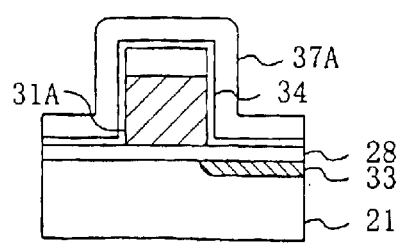

Next, as shown in FIG. 17D, a BPSG film 37A with a thickness of about 40 nm to 100 nm is deposited by CVD over the entire surface of the second silicon dioxide film 34.

Figure 17E:
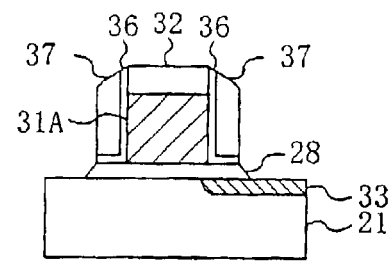

Then, as shown in FIG. 17E, anisotropic etching is performed to etch back the deposited BPSG film 37A and further remove the second silicon dioxide film 34 and the second thermal oxide film 28, thereby exposing the semiconductor substrate 21 and forming the sidewalls 37 on the side surfaces of the control gate electrode 31A via the protective insulating film 36 composed of the second silicon dioxide film 34.

Figure 17F:
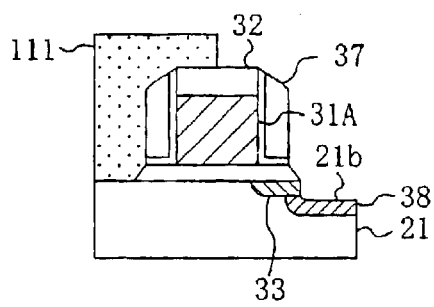

Next, as shown in FIG. 17F, the mask pattern 111 having an opening over the drain region is formed on the semiconductor substrate 21. By using the mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 kev to 30 keV by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having a near-surface impurity concentration of about $5 \times 10^{16}$ cm$^{-3}$ to $1 \times 10^{19}$ cm$^{-3}$ and a junction depth of about 40 nm is formed.

Figure 17G:
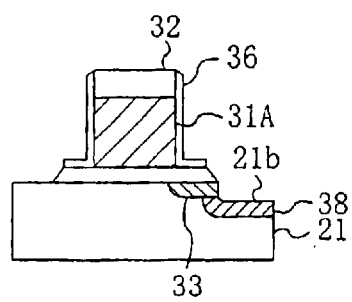
Figure 17H:
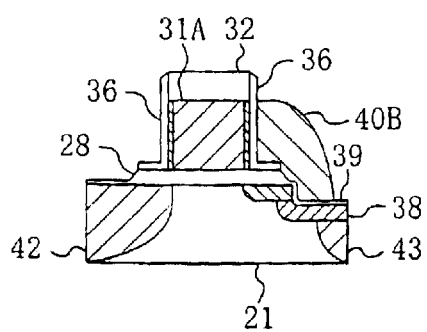

Next, as shown in FIG. 17G, the mask pattern 111 is removed and the sidewalls 37 are further removed by using vapor-phase hydrofluoric acid. Then, as shown in FIG. 17H, the semiconductor substrate 21 is thermally oxidized in an oxygen atmosphere at a temperature of about 850° C., whereby the tunnel insulating film 39 with a thickness of about 9 nm is formed on the exposed surface of the recessed portion 21b of the semiconductor substrate 21. At this time, the thermal oxide film is also formed on each of the side surfaces of the control gate electrode 31A to increase the thickness of the protective insulating film 36. Since each of the protective insulating film 36 and the tunnel insulating film 39 is composed of a silicon dioxide film, a thermal stress therebetween is small.

Next, a polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using a mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using a mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5\times10^{13}$ cm$^{-2}$ to $1\times10^{14}$ cm$^{-2}$ are implanted into the semiconductor substrate 21 with an implant energy of about 50 kev. As a result, the source region 42 and the drain region 43 in each of which the near-surface impurity concentration of arsenic is about $5\times10^{19}$ cm$^{-3}$ to $1\times10^{21}$ cm$^{-3}$ are formed in the semiconductor substrate 21.

Although the stepped portion covered up with the floating gate electrode 40B is provided under the floating gate electrode 40B in the semiconductor substrate 21 in the second embodiment such that hot electrons are implanted with high efficiency into the floating gate electrode 40B, the stepped portion may not be provided.

Thus, according to the second embodiment, each of the side surfaces of the control gate electrode 31A is covered with the protective insulating film 36, which prevents the control gate electrode 31A from being damaged by etching during the formation of the floating gate electrode 40B.

Since the sidewalls 37 composed of BPSG on the control gate electrode 31A have bottom surfaces which are on the protective insulating film 36 and are not in direct contact with the semiconductor substrate 21 as shown in FIG. 17E, the surface of the semiconductor substrate 21 is not damaged when the sidewalls 37 are removed in the subsequent step. This stabilizes the operation of the memory elements.

In the second embodiment also, each of the elements in the peripheral circuit formation region is formed subsequently to the step of forming the memory elements so that the control gate electrode 31A and the floating gate electrode 40B suffer no etching damage.

Variation of Embodiment 2

A variation of the second embodiment of the present invention will be described with reference to the drawings.

Figure 18:
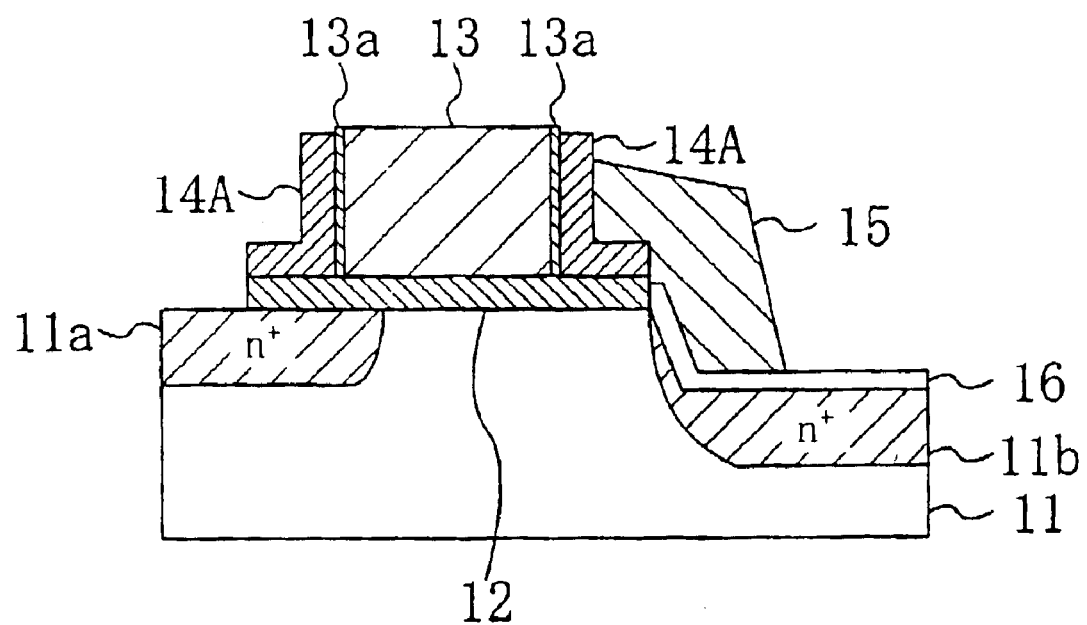
FIG. 18 is a structural cross-sectional view of a memory element in a nonvolatile semiconductor memory device according to a variation of the second embodiment.

FIG. 18 shows a cross-sectional structure of a memory element in a nonvolatile semiconductor memory device according to the variation of the second embodiment. In FIG. 18, the same components as shown in FIG. 16 are designated at the same reference numerals.

The present variation features a tunnel insulating film 16 which is formed by the internal-combustion pyrogenic oxidation and a silicon dioxide film 13a which is formed on each of the side surfaces of the control gate electrode 13 by the internal-combustion pyrogenic oxidation.

A description will be given herein below to a specific example of a method for forming the tunnel insulating film 16 and the silicon dioxide film 13a.

In the step of forming the tunnel insulating film 39 shown in FIG. 17H according to the second embodiment, e.g., hydrogen gas and oxygen gas are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with water vapor generated thereover, whereby the tunnel insulating film 39 with a thickness of 6 nm to 15 nm is formed on the exposed surface of the recessed portion 21b of the semiconductor substrate 21. At this time, the side surfaces of the control gate electrode 31A are also thermally oxidized simultaneously so that the tunnel insulating film 16 and the silicon dioxide film 13a shown in FIG. 18 are formed.

In addition to achieving the same effects as achieved by the second embodiment, the present variation forms the tunnel insulating film 39 with a nearly uniform thickness since the formation of the tunnel insulating film 39 by the internal-combustion thermal oxidation suppresses accelerated oxidation of the lightly doped n-type impurity diffusion region 38. Moreover, the quality of the tunnel insulating film 39 formed by the internal-combustion thermal oxidation is equal or superior to the quality of a tunnel insulating film formed in a normal oxygen atmosphere at a temperature of 850° C. or more.

Furthermore, the use of the internal-combustion thermal oxidation suppresses the occurrence of a bird's beak in the second thermal oxide film 28 as the gate oxide film and the occurrence of a bird's beak in a lower portion of the side surface of the control gate electrode 31A so that each of the gate oxide film and the protective insulating film 36 serving as the capacitance insulating film is formed to have a nearly uniform thickness.

Since the formation of the tunnel insulating film 39 by the internal-combustion thermal oxidation forms a compact silicon dioxide film 13a on each of the side portions of the control gate electrode 13, the release of electrons accumulated in the floating gate electrode 15 is suppressed and the reliability of the memory element is improved.

Although the lower portion of the protective insulating film 14A has a portion protruding along the substrate surface, it is also possible to form the protective insulating film 14A without the protruding portion. Without the protruding portion, trapping of electrons or holes in the protruding portion is suppressed during a write or erase operation so that the degradation of the memory element due to an increase in the number of write or erase operations is suppressed significantly.

Embodiment 3

A nonvolatile semiconductor memory device according to a third embodiment of the present invention and a method for fabricating the same will be described with reference to the drawings.

Figure 19:
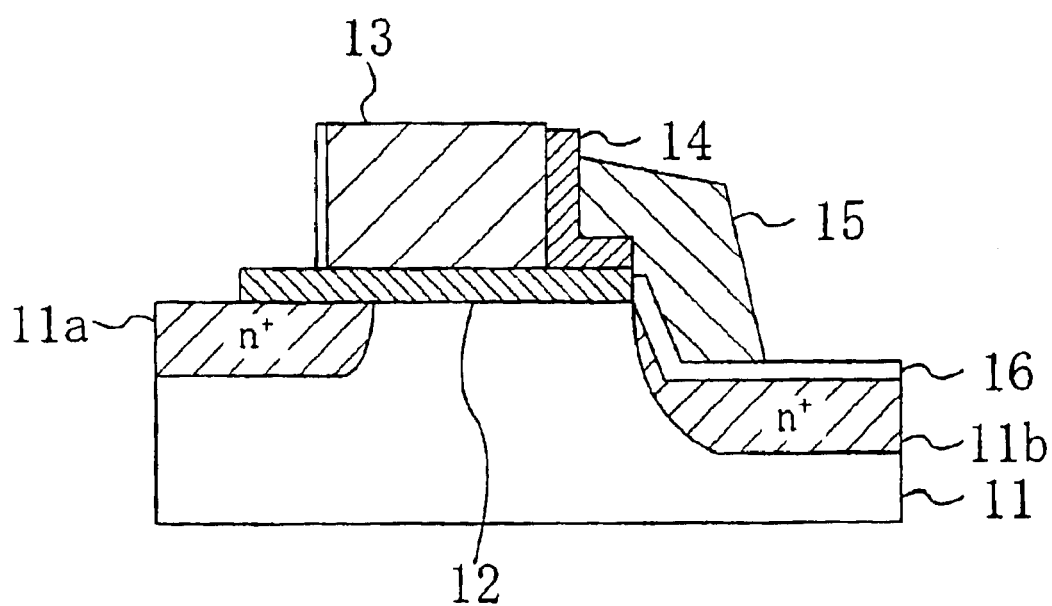
FIG. 19 is a structural cross-sectional view of a memory element in a nonvolatile semiconductor memory device according to a third embodiment of the present invention.

FIG. 19 shows a cross-sectional structure of a memory element in the nonvolatile semiconductor memory device according to the third embodiment. In FIG. 19, the description of the same components as shown in FIG. 1 is omitted by retaining the same reference numerals.

The third embodiment features a protective insulating film 14A which is a multilayer structure composed of a silicon dioxide film and a silicon nitride film and provided only on that one of the side surfaces of the control gate electrode 13 opposed to the floating gate electrode 15.

The description will be given next to a method for fabricating the memory element in the nonvolatile semiconductor memory device according to the third embodiment with reference to FIGS. 20A to 20H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 20A to 20H, the same components as used in the first embodiment are designated at the same reference numerals.

Figure 20A:
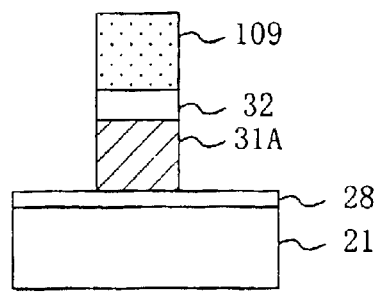
FIGS. 20A to 20H are structural cross-sectional views illustrating the individual process steps of a method for fabricating the memory element in the nonvolatile semiconductor memory device according to the third embodiment.

First, as shown in FIG. 20A, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 20E:
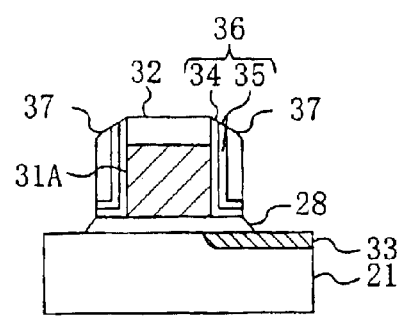
Figure 20B:
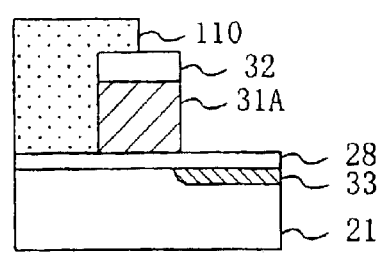

Next, as shown in FIG. 20B, the mask pattern 109 is removed and then the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 20F:
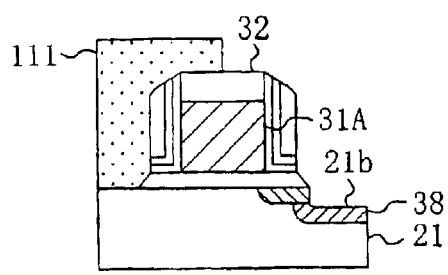
Figure 20C:
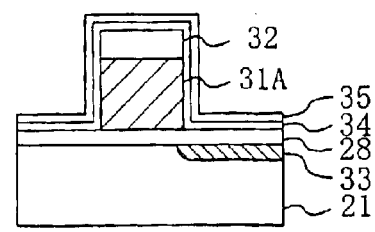

Next, as shown in FIG. 20C, the mask pattern 110 is removed and then the second silicon dioxide film 34 and the third silicon nitride film 35 each having a thickness of about 5 nm to 15 nm are deposited successively by CVD over the entire surface of the semiconductor substrate 21 including the second silicon nitride film 32 and the control gate electrode 31A.

Figure 20G:
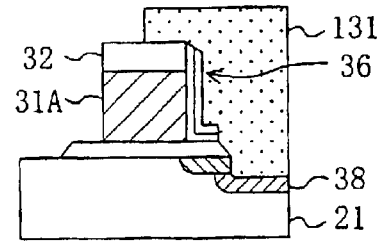
Figure 20D:
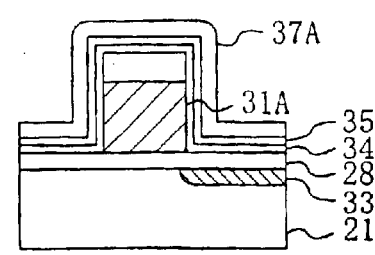

Next, as shown in FIG. 20D, the BPSG film 37A with a thickness of about 40 nm to 100 nm is deposited by CVD over the entire surface of the third silicon nitride film 35.

Then, as shown in FIG. 20E, anisotropic etching is performed to etch back the deposited BPSG film 37A and further remove the third silicon nitride film 35, the second silicon dioxide film 34, and the second thermal oxide film 28, thereby exposing the semiconductor substrate 21 and forming the sidewalls 37 on the side surfaces of the control gate electrode 31A via the protective insulating film 36 composed of the second silicon dioxide film 34.

Next, as shown in FIG. 20F, the mask pattern 111 having an opening over the drain region is formed on the semiconductor substrate 21. By using the mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having a near-surface impurity concentration of about $5 \times 10^{16}$ cm$^{-3}$ to $1 \times 10^{19}$ cm$^{-3}$ and a junction depth of about 40 nm is formed.

Next, as shown in FIG. 20G, the mask pattern 111 is removed and the sidewalls 37 are further removed by using vapor-phase hydrofluoric acid. Then, dry etching is performed with respect to the third silicon nitride film 35 of the protective insulating film 36 and wet etching is performed with respect to the second silicon dioxide film 34 each by using a mask pattern 131 having an opening over the side of the control gate electrode 31A closer to the source region, whereby the protective insulating film 36 on the side surface of the control gate electrode 31A closer to the source region is removed therefrom.

Figure 20H:
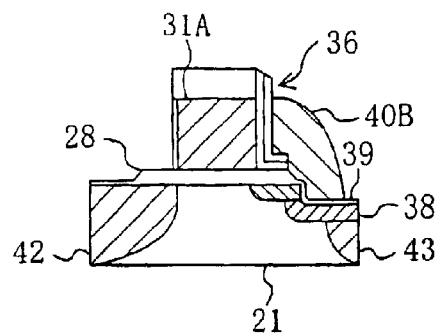

Next, as shown in FIG. 20H, the mask pattern 131 is removed and the semiconductor substrate 21 is thermally oxidized in an oxygen atmosphere at a temperature of about 850° C., whereby the tunnel insulating film 39 with a thickness of about 9 nm is formed on the exposed surface of the recessed portion 21b of the semiconductor substrate 21. Then, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 kev. As a result, the source region 42 and the drain region 43 in each of which the near-surface impurity concentration of arsenic is about $5 \times 10^{19}$ cm$^{-3}$ to $1 \times 10^{21}$ cm$^{-3}$ are formed in the semiconductor substrate 21.

Although the stepped portion covered up with the floating gate electrode 40B is provided under the floating gate electrode 40B in the semiconductor substrate 21 in the third embodiment such that hot electrons are implanted with high efficiency into the floating gate electrode 40B, the stepped portion may not be provided.

Thus, according to the third embodiment, the side surface of the control gate electrode 31A opposed to the floating gate electrode 40B is covered with the protective insulating film 36, which prevents the control gate electrode 31A from being damaged by etching during the formation of the floating gate electrode 40B. In addition, the side surface of the control gate electrode 31A closer to the floating gate electrode 40B is prevented from being oxidized in the step of forming the tunnel insulating film 39.

Since the sidewalls 37 composed of BPSG on the control gate electrode 31A have bottom surfaces which are on the protective insulating film 36 and are not in direct contact with the semiconductor substrate 21 as shown in FIG. 20E, the surface of the semiconductor substrate 21 is not damaged when the sidewalls 37 are removed in the subsequent step. This stabilizes the operation of the memory elements.

In the third embodiment also, each of the elements in the peripheral circuit formation region is formed subsequently to the step of forming the memory elements so that the control gate electrode 31A and the floating gate electrode 40B suffer no etching damage.

Since the protective insulating film 36 is not provided on the side surface of the control gate electrode 31A opposite to the floating gate electrode 40B, the effective channel length of the nonvolatile semiconductor memory element is reduced.

Variation of Embodiment 3

A variation of the third embodiment of the present invention will be described with reference to the drawings.

Figure 21:
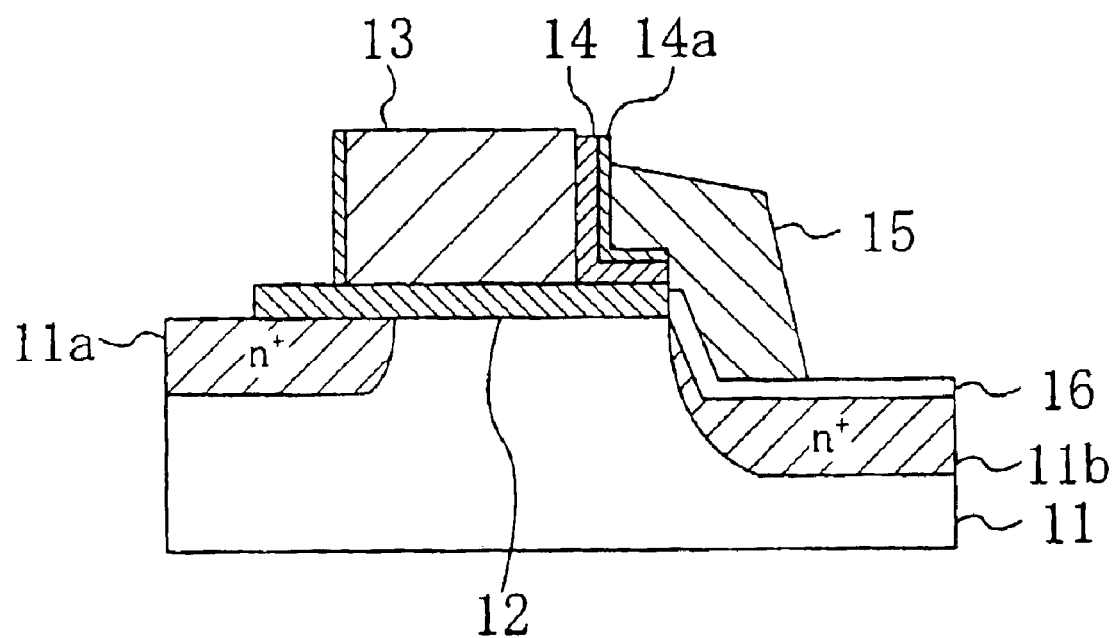
FIG. 21 is a structural cross-sectional view of a memory element in a nonvolatile semiconductor memory device according to a variation of the third embodiment.

FIG. 21 shows a cross-sectional structure of a memory element in a nonvolatile semiconductor memory device according to the variation of the third embodiment. In FIG. 21, the same components as shown in FIG. 19 are designated at the same reference numerals.

The present variation features a protective insulating film 14 provided between the control gate electrode 13 and the floating gate electrode 15, which is a multilayer structure composed of a silicon dioxide film and a silicon nitride film formed in this order on the control gate electrode 13.

The present variation also features a tunnel insulating film 16 which is formed by the internal-combustion pyrogenic oxidation and a silicon dioxide film 14a which is formed on the side surface of the silicon nitride film of the protective insulating film 14 closer to the floating gate electrode 15 by the internal-combustion pyrogenic oxidation.

A description will be given herein below to a specific example of a method for forming the tunnel insulating film 16 and the silicon dioxide film 14a.

In the step of forming the tunnel insulating film 39 shown in FIG. 20H according to the third embodiment, hydrogen gas and oxygen gas are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with water vapor generated thereover, whereby the tunnel insulating film 39 with a thickness of 6 nm to 15 nm is formed on the exposed surface of the recessed portion 21b of the semiconductor substrate 21. Since the internal-combustion thermal oxidation also oxidizes the silicon nitride film, the exposed surface of the silicon nitride film 35 in the outer portion of the protective insulating film 36 is oxidized so that the tunnel insulating film 16 and the silicon dioxide film 14a shown in FIG. 21 are formed.

In addition to achieving the same effects as achieved by the third embodiment, the present variation forms the tunnel insulating film 39 with a nearly uniform thickness since the formation of the tunnel insulating film 39 by the internal-combustion thermal oxidation suppresses accelerated oxidation of the lightly doped n-type impurity diffusion region 38. Moreover, the quality of the tunnel insulating film 39 formed by the internal-combustion thermal oxidation is equal or superior to the quality of a tunnel insulating film formed in a normal oxygen atmosphere.

Furthermore, the occurrence of a bird's beak in the second thermal oxide film 28 as the gate oxide film and the occurrence of a bird's beak in a lower portion of the side surface of the control gate electrode 31A are suppressed. This provides the gate oxide film and the capacitance insulating film each having a nearly uniform thickness.

Since the use of the internal-combustion thermal oxidation oxidizes the outer surface of the protective insulating film 14 to form the silicon dioxide film 14a as shown in FIG. 21, the effect of suppressing the release of electrons accumulated in the floating gate electrode 15 is improved and the reliability of the memory element is improved.

Embodiment 4

A nonvolatile semiconductor memory device according to a fourth embodiment of the present invention and a method for fabricating the same will be described with reference to the drawings.

Figure 22:
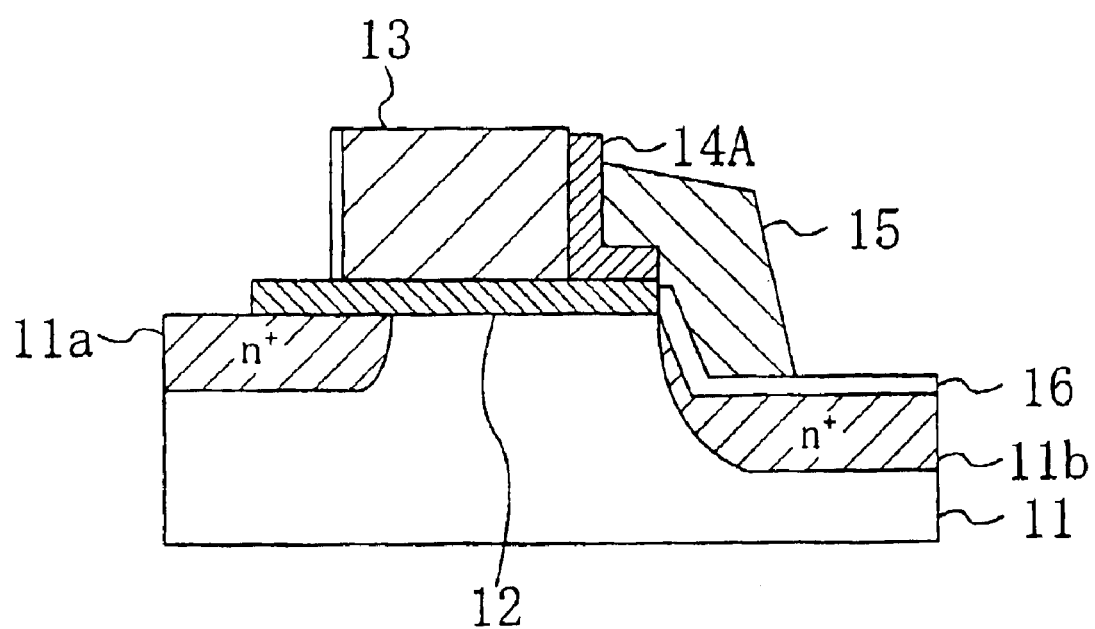
FIG. 22 is a structural cross-sectional view of a memory element in a nonvolatile semiconductor memory device according to a fourth embodiment of the present invention.

FIG. 22 shows a cross-sectional structure of a memory element in the nonvolatile semiconductor memory device according to the fourth embodiment. In FIG. 22, the description of the same components as shown in FIG. 1 is omitted by retaining the same reference numerals.

The fourth embodiment features a protective insulating film 14A which is composed of a single-layer silicon dioxide film and provided only on that one of the side surfaces of the control gate electrode 13 opposed to the floating gate electrode 15.

The description will be given next to a method for fabricating the memory element in the nonvolatile semiconductor memory device according to the fourth embodiment with reference to FIGS. 23A to 23H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 23A to 23H, the same components as used in the first embodiment are designated at the same reference numerals.

Figure 23A:
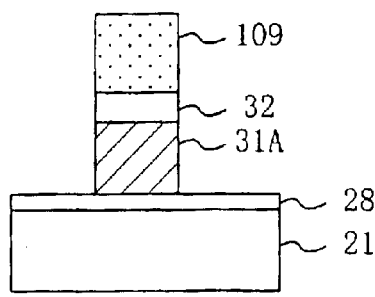
FIGS. 23A to 23H are structural cross-sectional views illustrating the individual process steps of a method for fabricating the memory element in the nonvolatile semiconductor memory device according to the fourth embodiment.

First, as shown in FIG. 23A, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 23E:
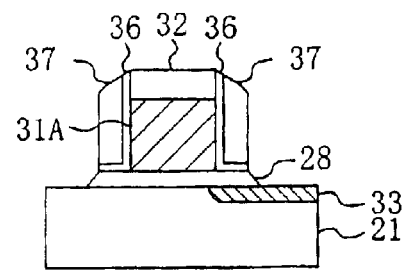
Figure 23B:
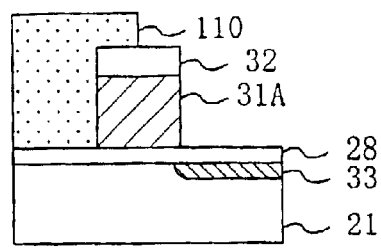

Next, as shown in FIG. 23B, the mask pattern 109 is removed and then the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 23F:
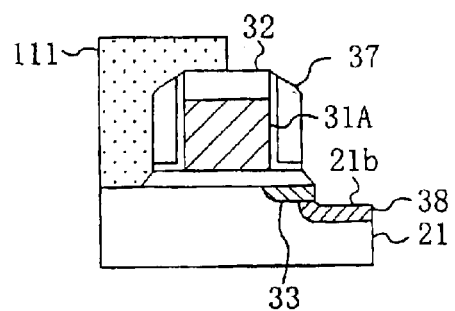
Figure 23C:
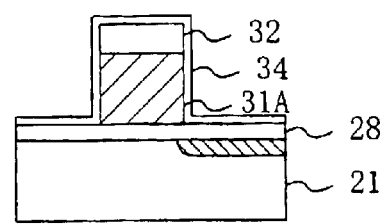

Next, as shown in FIG. 23C, the mask pattern 110 is removed and then the second silicon dioxide film 34 with a thickness of about 5 nm to 15 nm is deposited by CVD over the entire surface of the semiconductor substrate 21 including the second silicon nitride film 32 and the control gate electrode 31A.

Figure 23G:
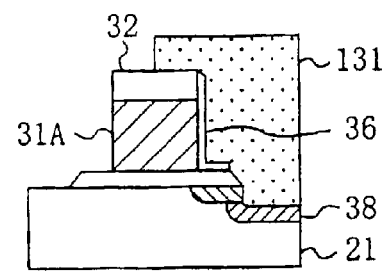
Figure 23D:
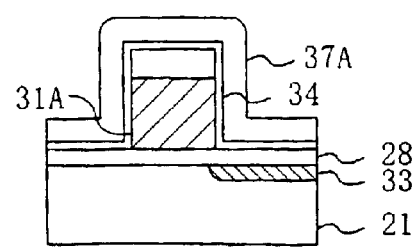

Next, as shown in FIG. 23D, the BPSG film 37A with a thickness of about 40 nm to 100 nm is deposited by CVD over the entire surface of the second silicon nitride film 34.

Then, as shown in FIG. 23E, anisotropic etching is performed to etch back the deposited BPSG film 37A and further remove the second silicon dioxide film 34 and the second thermal oxide film 28, thereby exposing the semiconductor substrate 21 and forming the sidewalls 37 on the side surfaces of the control gate electrode 31A via the protective insulating film 36 composed of the second silicon dioxide film 34.

Next, as shown in FIG. 23F, the mask pattern 111 having an opening over the drain region is formed on the semiconductor substrate 21. By using the mask pattern 111, the control gate electrode 31A, and the sidewalls 37, dry etching is performed with respect to the upper portion of the semiconductor substrate 21 by reactive-ion dry etching (RIE), thereby forming the recessed portion 21b at a depth of about 25 nm to 75 nm. The etching may also be performed by CDE instead of RIE.

Next, boron (B) ions at a relatively low dose of about $5\times10^{12}$ cm$^{-2}$ to $1\times10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5\times10^{16}$ cm$^{-3}$ to $1\times10^{19}$ cm$^{-3}$ and a junction slightly deeper than that of the first lightly doped p-type impurity diffusion region 33 is formed. Subsequently, arsenic (As) ions at a relatively low dose of about $5\times10^{12}$ cm$^{-2}$ to $1\times10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having a near-surface impurity concentration of about $5\times10^{16}$ cm$^{-3}$ to $1\times10^{19}$ cm$^{-3}$ and a junction depth of about 40 nm is formed.

Next, as shown in FIG. 23G, the mask pattern 111 is removed and the sidewalls 37 are further removed by using vapor-phase hydrofluoric acid. Then, the portion of the protective insulating film 36 on the side surface of the control gate electrode 31A closer to the source region is removed by using the mask pattern 131 having an opening over the source region of the control gate electrode 31A.

Figure 23H:
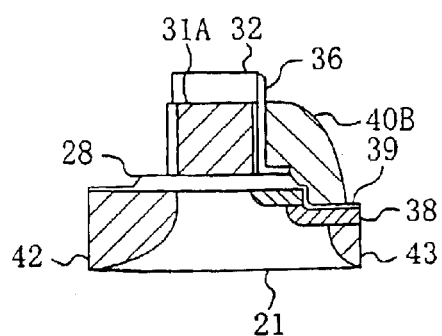

Next, as shown in FIG. 23H, the mask pattern 131 is removed and then the semiconductor substrate 21 is thermally oxidized in an oxygen atmosphere at a temperature of about 850° C., whereby the tunnel insulating film 39 with a thickness of about 9 nm is formed on the exposed surface of the recessed portion 21b of the semiconductor substrate 21. At this time, the thermal oxide film is also formed on each of the side surfaces of the control gate electrode 31A to increase the thickness of the protective insulating film 36. Since each of the protective insulating film 36 and the tunnel insulating film 39 is composed of a silicon dioxide film, a thermal stress therebetween is small.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5\times10^{13}$ cm$^{-2}$ to $1\times10^{14}$ cm$^{-2}$ are implanted into the semiconductor substrate 21 with an implant energy of about 50 keV. As a result, the source region 42 and the drain region 43 in each of which the near-surface impurity concentration of arsenic is about $5\times10^{19}$ cm$^{-3}$ to $1\times10^{21}$ cm$^{-3}$ are formed.

Although the stepped portion covered up with the floating gate electrode 40B is provided under the floating gate electrode 40B in the semiconductor substrate 21 in the fourth embodiment such that hot electrons are implanted with high efficiency into the floating gate electrode 40B, the stepped portion may not be provided.

Thus, according to the fourth embodiment, the side surface of the control gate electrode 31A opposed to the floating gate electrode 40B is covered with the protective insulating film 36, which prevents the control gate electrode 31A from being damaged by etching during the formation of the floating gate electrode 40B.

Since the sidewalls 37 composed of BPSG on the control gate electrode 31A have bottom surfaces which are on the protective insulating film 36 and are not in direct contact with the semiconductor substrate 21 as shown in FIG. 23E, the surface of the semiconductor substrate 21 is not damaged when the sidewalls 37 are removed in the subsequent step. This stabilizes the operation of the memory elements.

In the fourth embodiment also, each of the elements in the peripheral circuit formation region is formed subsequently to the step of forming the memory elements so that the control gate electrode 31A and the floating gate electrode 40B suffer no etching damage.

Since the protective insulating film 36 is not provided on the side surface of the control gate electrode 31A opposite to the floating gate electrode 40B, the effective channel length of the nonvolatile semiconductor memory element can be reduced.

Variation of Embodiment 4

A variation of the fourth embodiment of the present invention will be described with reference to the drawings.

Figure 24:
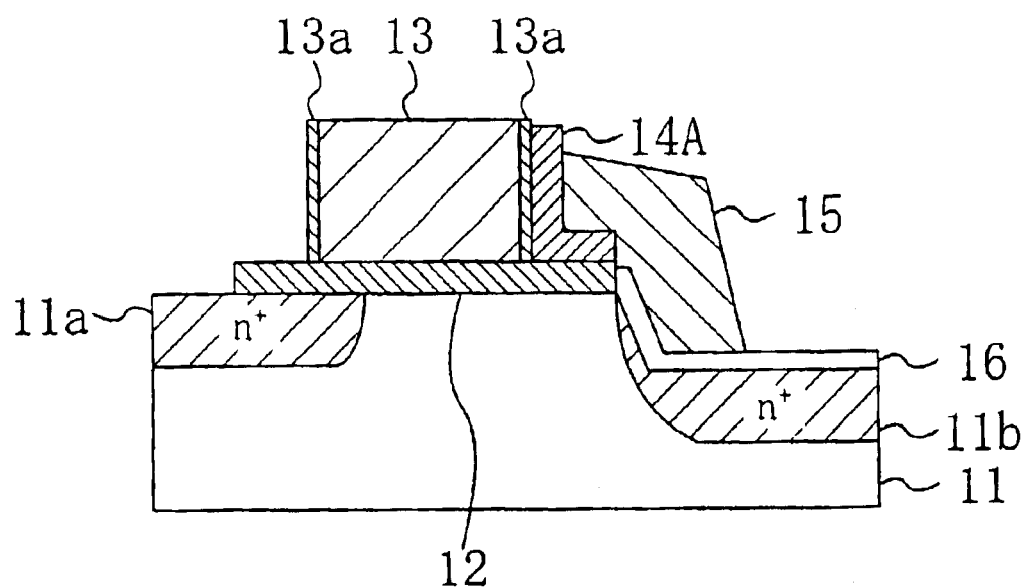
FIG. 24 is a structural cross-sectional view of a memory element in a nonvolatile semiconductor memory device according to a variation of the fourth embodiment.

FIG. 24 shows a cross-sectional structure of a memory element in a nonvolatile semiconductor memory device according to the variation of the fourth embodiment. In FIG.

24, the same components as shown in FIG. 22 are designated at the same reference numerals.

The present variation features a tunnel insulating film 16 which is formed by the internal-combustion pyrogenic oxidation and a silicon dioxide film 13a which is formed on each of the side portions of the control gate electrode 13 by the internal-combustion pyrogenic oxidation.

A description will be given herein below to a specific example of a method for forming the tunnel insulating film 16 and the silicon dioxide film 13a.

In the step of forming the tunnel insulating film 39 shown in FIG. 23H according to the fourth embodiment, e.g., hydrogen gas and oxygen gas are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with water vapor generated thereover, whereby the tunnel insulating film 39 with a thickness of 6 nm to 15 nm is formed on the exposed surface of the recessed portion 21b of the semiconductor substrate 21. At this time, the side surfaces of the control gate electrode 31A are also thermally oxidized simultaneously so that the tunnel insulating film 16 and the silicon dioxide film 13a shown in FIG. 24 are formed.

In addition to achieving the same effects as achieved by the fourth embodiment, the present variation forms the tunnel insulating film 39 with a nearly uniform thickness since the formation of the tunnel insulating film 39 by the internal-combustion thermal oxidation suppresses accelerated oxidation of the lightly doped n-type impurity diffusion region 38.

Moreover, the occurrence of a bird's beak in the second thermal oxide film 28 as, the gate oxide film and the occurrence of a bird's beak in the lower portion of the side surface of the control gate electrode 31A are suppressed. As a result, each of the gate oxide film and the capacitance insulating film has a nearly uniform thickness.

Since the formation of the tunnel insulating film 39 by the internal-combustion thermal oxidation forms the compact silicon dioxide films 13a on each of the side portions of the control gate electrode 13 as shown in FIG. 24, the release of electrons accumulated in the floating gate electrode 15 is suppressed and the reliability of the memory element is improved. Furthermore, the quality of the tunnel insulating film 39 formed by the internal-combustion thermal oxidation is equal or superior to the quality of a tunnel insulating film formed in a normal oxygen atmosphere.

Although the lower portion of the protective insulating film 14A has a portion protruding along the substrate surface, it is also possible to form the protective insulating film 14A without the protruding portion. Without the protruding portion, trapping of electrons or holes in the protruding portion is suppressed during a write or erase operation so that the degradation of the memory element due to an increase in the number of write or erase operations is suppressed significantly.

Embodiment 5

A nonvolatile semiconductor memory device according to a fifth embodiment of the present invention and a method for fabricating the same will be described with reference to the drawings.

Figure 25:
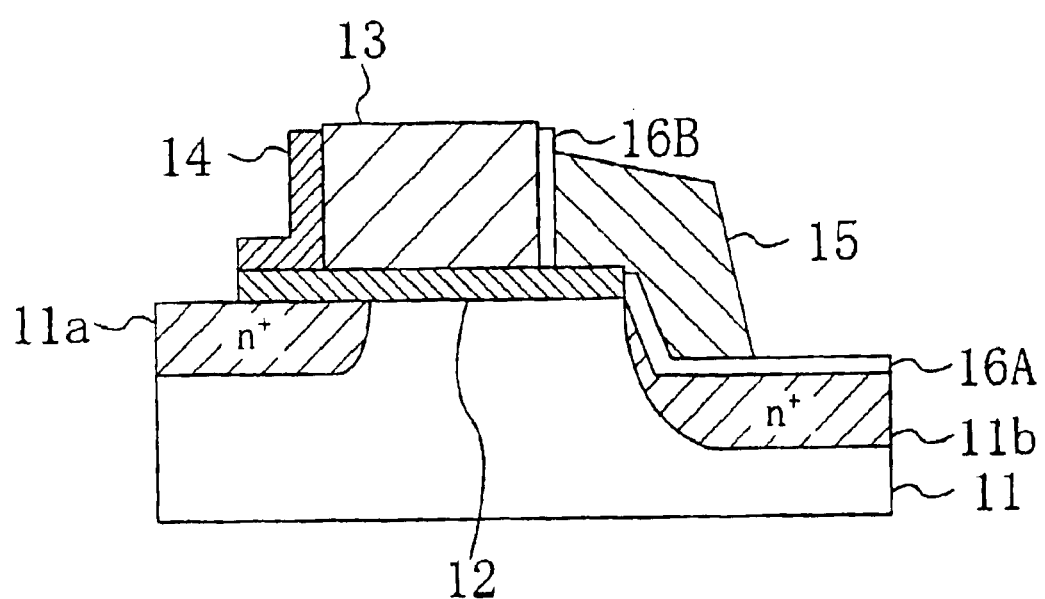
FIG. 25 is a structural cross-sectional view of a memory element in a nonvolatile semiconductor memory device according to a fifth embodiment of the present invention.

FIG. 25 shows a cross-sectional structure of a memory element in the nonvolatile semiconductor memory device according to the fifth embodiment. In FIG. 25, the description of the same components as shown in FIG. 1 is omitted by retaining the same reference numerals.

The fifth embodiment features a protective insulating film 14A which is a multilayer structure composed of a silicon dioxide film and a silicon nitride film and provided only on that one of the side surfaces of the control gate electrode 13 opposite to the floating gate electrode 15.

The present embodiment also features a capacitance insulating film 16B between the control gate electrode 13 and the floating gate electrode 15, which is composed of the same thermal oxide film as composing a tunnel insulating film 16A.

The description will be given next to a method for fabricating the memory element in the nonvolatile semiconductor memory device according to the fifth embodiment with reference to FIGS. 26A to 26H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 26A to 26H, the same components as used in the first embodiment are designated at the same reference numerals.

Figure 26A:
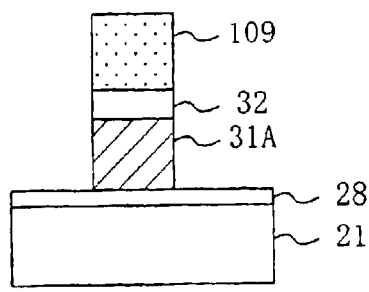
FIGS. 26A to 26H are structural cross-sectional views illustrating the individual process steps of a method for fabricating the memory element in the nonvolatile semiconductor memory device according to the fifth embodiment.

First, as shown in FIG. 26A, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 26B:
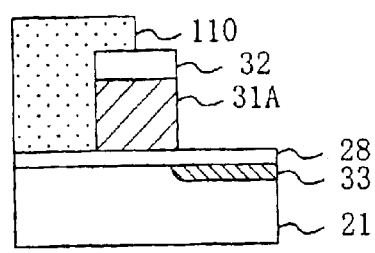

Next, as shown in FIG. 26B, the mask pattern 109 is removed and then the mask pattern 110 having an opening over the drain formation region is formed on the semiconductor substrate 21. By using the formed mask pattern 110, boron (B) ions at a dose of about $5\times10^{12}$ cm$^{-2}$ to $1\times10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5\times10^{16}$ cm$^{-3}$ to $1\times10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 26C:
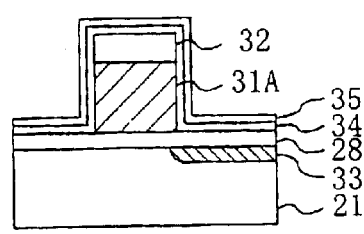

Next, as shown in FIG. 26C, the mask pattern 110 is removed and then the second silicon dioxide film 34 and the third silicon nitride film 35 each having a thickness of about 5 nm to 15 nm are deposited successively by CVD over the entire surface of the semiconductor substrate 21 including the second silicon nitride film 32 and the control gate electrode 31A.

Figure 26D:
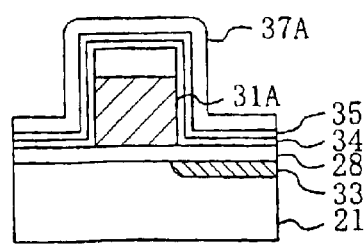

Next, as shown in FIG. 26D, the BPSG film 37A with a thickness of about 40 nm to 100 nm is deposited by CVD over the entire surface of the third silicon nitride film 35.

Figure 26E:
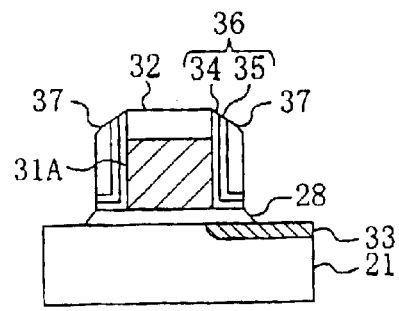

Then, as shown in FIG. 26E, anisotropic etching is performed to etch back the deposited BPSG film 37A and further remove the third silicon nitride film 35, the second silicon dioxide film 34, and the second thermal oxide film 28, thereby exposing the semiconductor substrate 21 and forming the sidewalls 37 on the side surfaces of the control gate electrode 31A via the protective insulating film 36 composed of the second silicon dioxide film 34.

Figure 26F:
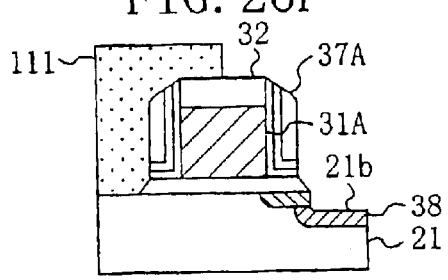
Figure 26G:
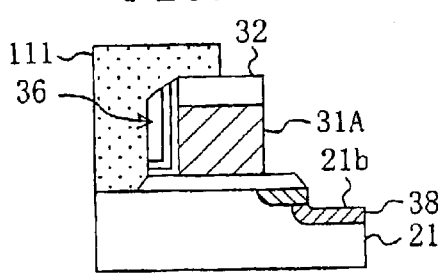

Next, as shown in FIG. 26F, the mask pattern 111 having an opening over the drain region is formed on the semiconductor substrate 21. By using the mask pattern 111, the control gate electrode 31A, and the sidewalls 37, dry etching is performed with respect to the upper portion of the semiconductor substrate 21, by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 kev to 50 keV by using the mask pattern 111, whereby the shallow lightly doped n-type impurity diffusion region 38 having a near-surface impurity concentration of about $5 \times 10^{16}$ cm$^{-3}$ to $1 \times 10^{19}$ cm$^{-3}$ and a junction depth of about 40 nm is formed.

Next, as shown in FIG. 20G, the sidewalls 37 are removed by using vapor-phase hydrofluoric acid. Then, dry etching is performed with respect to the third silicon nitride film 35 of the protective insulating film 36 and wet etching is performed with respect to the second silicon dioxide film 34 each by using the mask pattern 111, whereby the protective insulating film 36 on the side surface of the control gate electrode 31A closer to the drain region is removed therefrom.

Figure 26H:
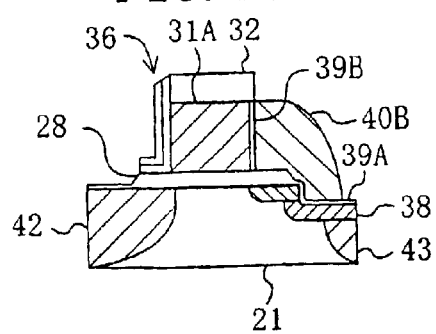

Next, as shown in FIG. 26H, the mask pattern 111 is removed and the semiconductor substrate 21 is thermally oxidized in an oxygen atmosphere at a temperature of about 850° C., whereby a thermal oxide film with a thickness of about 9 nm is formed on the exposed surface of the recessed portion 21b of the semiconductor substrate 21 and on the side surface of the control gate electrode 31A closer to the drain region. The thermal oxide film serves as a tunnel insulating film 39A between the semiconductor substrate 21 and a floating gate electrode to be formed in the subsequent step, while serving as a capacitance insulating film 39B between the control gate electrode 31A and the floating gate electrode.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the capacitance insulating film 39B interposed therebetween and opposed to the recessed portion 21b in the semiconductor substrate 21 with the tunnel insulating film 39A interposed therebetween.

Next, by using the control gate electrode 31A and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 kev. As a result, the source region 42 and the drain region 43 in each of which the near-surface impurity concentration of arsenic is about $5 \times 10^{19}$ cm$^{-3}$ to $1 \times 10^{21}$ cm$^{-3}$ are formed in the semiconductor substrate 21.

Although the stepped portion covered up with the floating gate electrode 40B is provided under the floating gate electrode 40B in the semiconductor substrate 21 in the fifth embodiment such that hot electrons are implanted with high efficiency into the floating gate electrode 40B, the stepped portion may not be provided.

Thus, according to the fifth embodiment, the side surface of the control gate electrode 31A closer to the source region is covered with the protective insulating film 36, which prevents the control gate electrode 31A from being damaged by etching during the formation of the floating gate electrode 40B.

In the fifth embodiment also, each of the elements in the peripheral circuit formation region is formed subsequently to the step of forming the memory elements so that the control gate electrode 31A and the floating gate electrode 40B suffer no etching damage.

Since the sidewalls 37 composed of BPSG on the control gate electrode 31A have bottom surfaces which are on the protective insulating film 36 and are not in direct contact with the semiconductor substrate 21 as shown in FIG. 26E, the surface of the semiconductor substrate 21 is not damaged when the sidewalls 37 are removed in the subsequent step. This stabilizes the operation of the memory elements.

Since the tunnel insulating film 39A and the capacitance insulating film 39B are formed in the same step, the number of the process steps can be reduced. Since the tunnel insulating film 39A and the capacitance insulating film 39B have nearly equal thicknesses, the capacitive coupling ratio between the control gate electrode 31A and the floating gate electrode 40B can be increased so that the operating characteristics of the nonvolatile semiconductor memory element are improved.

Variation of Embodiment 5

A variation of the fifth embodiment of the present invention will be described with reference to the drawings.

Figure 27:
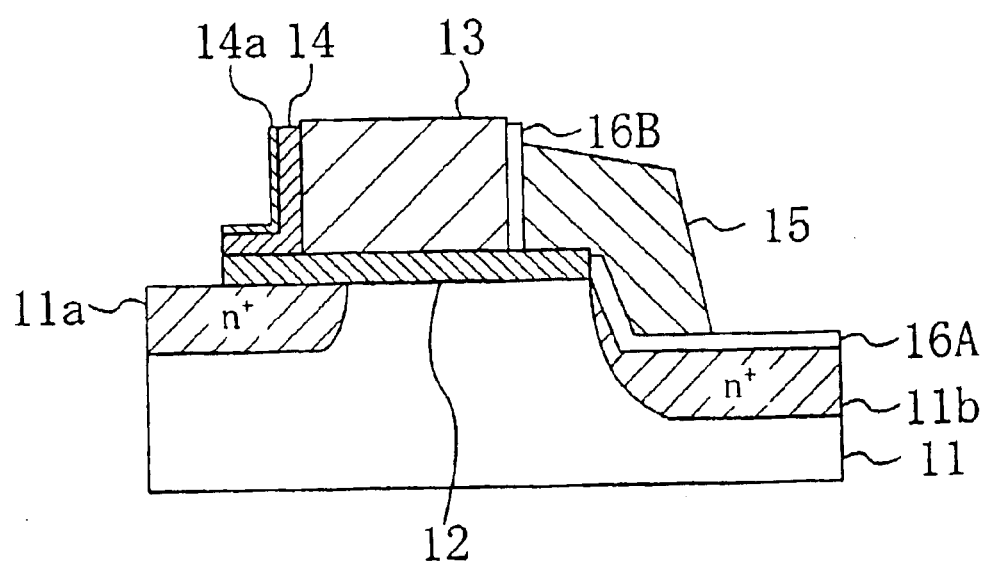
FIG. 27 is a structural cross-sectional view of a memory element in a nonvolatile semiconductor memory device according to a variation of the fifth embodiment.

FIG. 27 shows a cross-sectional structure of a memory element in a nonvolatile semiconductor memory device according to the variation of the fifth embodiment. In FIG. 27, the same components as shown in FIG. 25 are designated at the same reference numerals.

The present variation features a protective insulating film 14 provided on the side surface of the control gate electrode 13 opposite to the floating gate electrode 15, which is a multilayer structure composed of a silicon dioxide film and a silicon nitride film formed in this order on the control gate electrode 13.

The present variation also features a tunnel insulating film 16A which is formed by the internal-combustion pyrogenic oxidation and a silicon dioxide film 14a which is formed on the side surface of the silicon nitride film of the protective insulating film 14 opposite to the silicon dioxide film by the internal-combustion pyrogenic oxidation.

A description will be given herein below to a specific example of a method for forming the tunnel insulating film 16A and the silicon dioxide film 14a.

In the step of forming the tunnel insulating film 39A and the capacitance insulating film 39B shown in FIG. 26H according to the fifth embodiment, hydrogen gas and oxygen gas are introduced into the chamber of the rapid thermal oxidation apparatus in which the temperature is set to about 900° C. to 1100° C. and the pressure is set to about 1000 Pa to 2000 Pa and the semiconductor substrate 21 is thermally oxidized with water vapor generated thereover, whereby a thermal oxide film with a thickness of 6 nm to 15 nm is formed on the exposed surface of the recessed portion 21b of the semiconductor substrate 21. The thermal oxide film serves as the tunnel insulating film 39A between the semiconductor substrate 21 and the floating gate electrode, while serving as the capacitance insulating film 39A between the control gate electrode 31A and the floating gate electrode. Since the internal-combustion thermal oxidation also oxidizes the silicon nitride film, the exposed surface of the silicon nitride film 35 in the outer portion of the protective insulating film 36 is oxidized so that the tunnel insulating film 16A and the silicon dioxide film 14a shown in FIG. 27 are formed.

In addition to achieving the same effects as achieved by the fifth embodiment, the present variation forms the tunnel insulating film 39A with a nearly uniform thickness since the formation of the tunnel insulating film 39 by the internal-combustion thermal oxidation suppresses accelerated oxidation of the lightly doped n-type impurity diffusion region 38. Moreover, the quality of each of the tunnel insulating film 39A and the capacitance insulating film 39B formed by the internal-combustion thermal oxidation is equal or superior to the quality of a thermal oxide film formed in a normal oxygen atmosphere.

Furthermore, the occurrence of a bird's beak in the second thermal oxide film 28 as the gate oxide film and the occurrence of a bird's beak in the lower portion of the side surface of the control gate electrode 31A are suppressed. This provides the gate oxide film and the capacitance insulating film 39B each having a nearly uniform thickness.

Embodiment 6

A nonvolatile semiconductor memory device according to a sixth embodiment of the present invention and a method for fabricating the same will be described with reference to the drawings.

Figure 28:
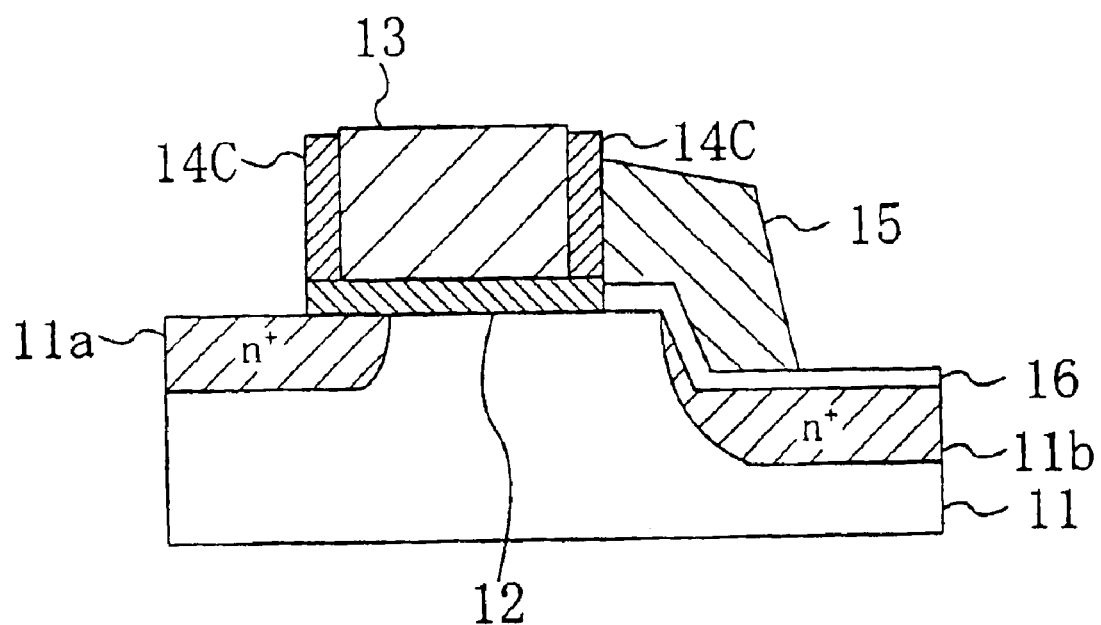
FIG. 28 is a structural cross-sectional view of a memory element in a nonvolatile semiconductor memory device according to a sixth embodiment of the present invention.

FIG. 28 shows a cross-sectional structure of a memory element in the nonvolatile semiconductor memory device according to the sixth embodiment. In FIG. 28, the description of the same components as shown in FIG. 1 is omitted by retaining the same reference numerals.

The sixth embodiment features a protective insulating film 14C which is a multilayer structure composed of a silicon dioxide film and a silicon nitride film, provided only on each of the side surfaces of the control gate electrode 13, and having a lower portion not protruding along the substrate surface.

The description will be given next to a method for fabricating the memory element in the nonvolatile semiconductor memory device according to the sixth embodiment with reference to FIGS. 29A to 29H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 29A to 29H, the same components as used in the first embodiment are designated at the same reference numerals.

First, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 29A:
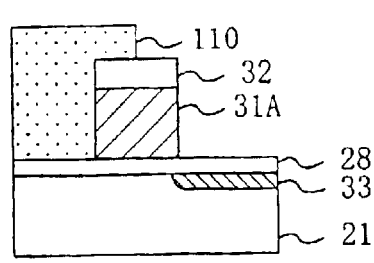
FIGS. 29A to 29H are structural cross-sectional views illustrating the individual process steps of a method for fabricating the memory element in the nonvolatile semiconductor memory device according to the sixth embodiment.

Next, as shown in FIG. 29A, the mask pattern 109 is removed and then the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 29B:
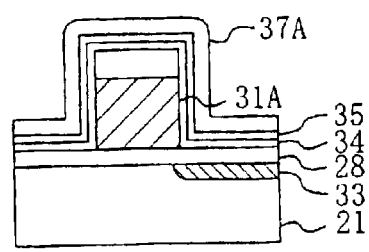

Next, as shown in FIG. 29B, the mask pattern 110 is removed and then the second silicon dioxide film 34 and the third silicon nitride film 35 each having a thickness of about 5 nm to 15 nm are deposited successively by CVD over the entire surface of the semiconductor substrate 21 including the second silicon nitride film 32 and the control gate electrode 31A. Then, the BPSG film 37A with a thickness of about 40 nm to 100 nm is deposited by CVD over the entire surface of the third silicon nitride film 35.

Figure 29C:
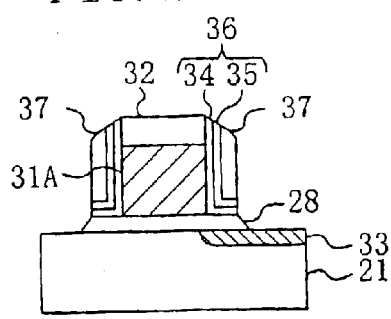

Then, as shown in FIG. 29C, anisotropic etching is performed to etch back the deposited BPSG film 37A and further remove the third silicon nitride film 35, the second silicon dioxide film 34, and the second thermal oxide film 28, thereby exposing the semiconductor substrate 21 and forming the sidewalls 37 on the side surfaces of the control gate electrode 31A via the protective insulating film 36 composed of the second silicon dioxide film 34 and the third silicon nitride film 35.

Figure 29D:
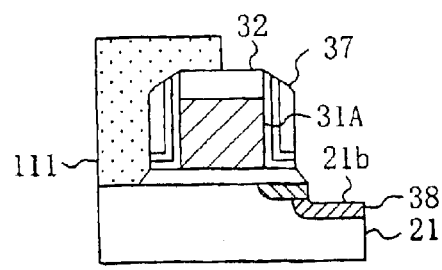

Next, as shown in FIG. 29D, the mask pattern 111 having an opening over the drain region is formed on the semiconductor substrate 21. By using the mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 keV to 50 kev by using the mask pattern 111, whereby the shallow lightly doped n-type impurity diffusion region 38 having a near-surface impurity concentration of about $5 \times 10^{16}$ cm$^{-3}$ to $1 \times 10^{19}$ cm$^{-3}$ and a junction depth of about 40 nm is formed.

Figure 29E:
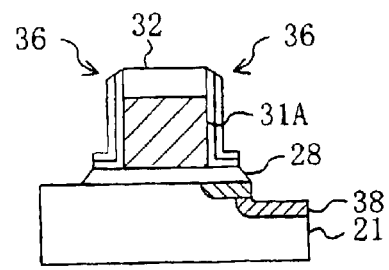
Figure 29F:
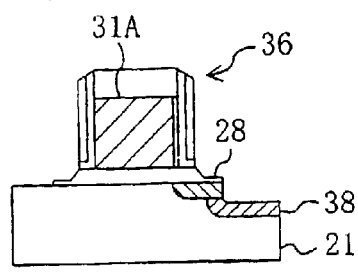
Figure 29G:
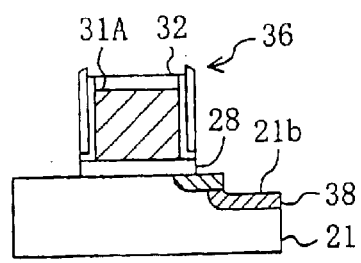

Next, as shown in FIG. 29E, the mask pattern 111 is removed and the sidewalls 37 are further removed by using vapor-phase hydrofluoric acid. Then, as shown in FIG. 29F, the portions of the protective insulating film 36 covered with the bottom portions of the sidewalls 37 are removed by anisotropic etching. Subsequently, as shown in FIG. 29G, the portions of the second thermal oxide film 28 covered with the bottom portions of the sidewalls 37 are also removed by anisotropic etching.

Figure 29H:
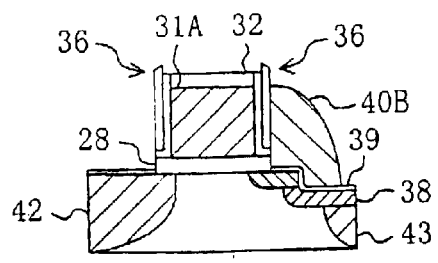

Next, as shown in FIG. 29H, the semiconductor substrate 21 is thermally oxidized in an oxygen atmosphere at a temperature of about 850° C., whereby the tunnel insulating film 39 with a thickness of about 9 nm is formed on the exposed surface of the recessed portion 21b of the semiconductor substrate 21.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 keV. As a result, the source region 42 and the drain region 43 in each of which the near-surface impurity concentration of arsenic is about $5 \times 10^{19}$ cm$^{-3}$ to $1 \times 10^{21}$ cm$^{-3}$ are formed.

Although the stepped portion covered up with the floating gate electrode 40B is provided under the floating gate electrode 40B in the semiconductor substrate 21 in the sixth embodiment such that hot electrons are implanted with high efficiency into the floating gate electrode 40B, the stepped portion may not be provided.

Thus, according to the sixth embodiment, each of the side surfaces of the control gate electrode 31A is covered with the protective insulating film 36 composed of the second silicon dioxide film 34 and the third silicon nitride film 35 in the step of forming the tunnel insulating film 39, which prevents oxidation of the side surfaces of the control gate electrode 31A.

Since the sidewalls 37 composed of BPSG on the control gate electrode 31A have bottom surfaces which are on the protective insulating film 36 and are not in direct contact with the semiconductor substrate 21 as shown in FIG. 29C, the surface of the semiconductor substrate 21 is not damaged when the sidewalls 37 are removed in the subsequent step. This stabilizes the operation of the memory elements.

In the sixth embodiment also, each of the elements in the peripheral circuit formation region is formed subsequently to the step of forming the memory elements so that the control gate electrode 31A and the floating gate electrode 40B suffer no etching damage.

Variation of Embodiment 6

A variation of the sixth embodiment of the present invention will be described with reference to the drawings.

Figure 30:
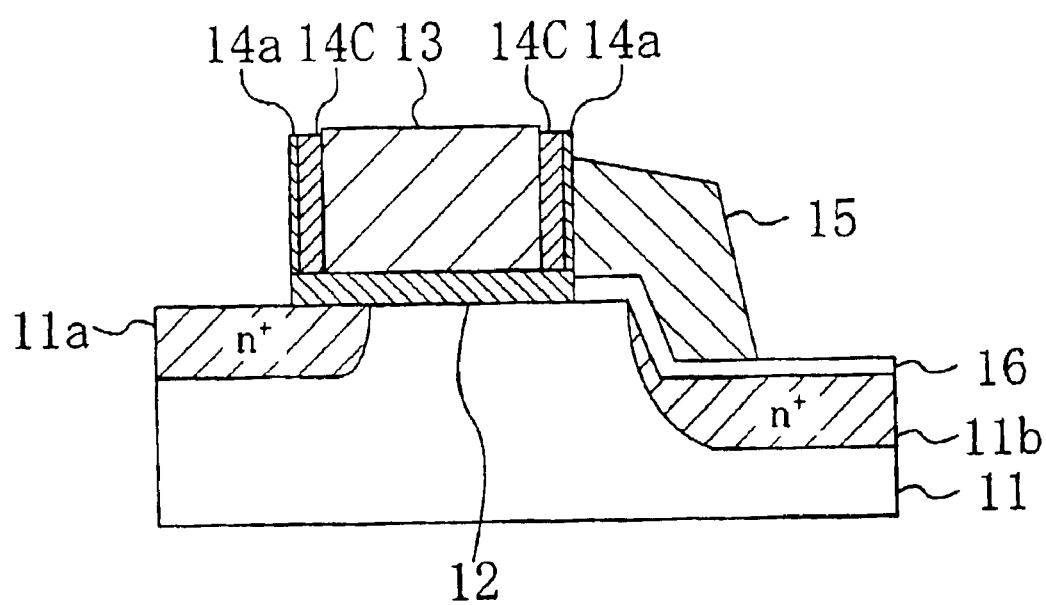
FIG. 30 is a structural cross-sectional view of a memory element in a nonvolatile semiconductor memory device according to a variation of the sixth embodiment.

FIG. 30 shows a cross-sectional structure of a memory element in a nonvolatile semiconductor memory device according to the variation of the sixth embodiment. In FIG. 30, the same components as shown in FIG. 28 are designated at the same reference numerals.

The present variation features a protective insulating film 14C provided on each of the side surfaces of the control gate electrode 13, which is a multilayer structure composed of a silicon dioxide film and a silicon nitride film formed in this order on the control gate electrode 13.

The present variation also features a tunnel insulating film 16 formed by the internal-combustion pyrogenic oxidation and a silicon dioxide film 14a formed on the side surface of the silicon nitride film of the protective insulating film 14C opposite to the silicon dioxide film by the internal-combustion pyrogenic oxidation.

A description will be given herein below to a specific example of a method for forming the tunnel insulating film 16 and the silicon dioxide film 14a.

In the step of forming the tunnel insulating film 39 shown in FIG. 29H according to the sixth embodiment, e.g., hydrogen gas and oxygen gas are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with water vapor generated thereover, whereby the tunnel insulating film 39 with a thickness of 6 nm to 15 nm is formed on the exposed surface of the recessed portion 21b of the semiconductor substrate 21. Since the internal-combustion thermal oxidation process also oxidizes the silicon nitride film, the exposed surface of the third silicon nitride film 35 in the outer portion of the protective insulating film 36 is. oxidized so that the tunnel insulating film 16 and the silicon dioxide film 14a shown in FIG. 30 are formed.

In addition to achieving the same effects as achieved by the sixth embodiment, the present variation forms the tunnel insulating film 39 with a nearly uniform thickness since the formation of the tunnel insulating film 39 by the internal-combustion thermal oxidation suppresses accelerated oxidation of the lightly doped n-type impurity diffusion region 38. Moreover, the quality of the tunnel insulating film 39 formed by the internal-combustion thermal oxidation is equal or superior to the quality of a tunnel insulating film formed in a normal oxygen atmosphere.

Furthermore, the occurrence of a bird's beak in the second thermal oxide film 28 as the gate oxide film and the occurrence of a bird's beak in the lower portion of the side surface of the control gate electrode 31A are suppressed. This provides the gate oxide film and the capacitance insulating film each having a nearly uniform thickness.

Since the use of the internal-combustion thermal oxidation oxidizes the outer surface of the silicon nitride film of the protective insulating film 14C to form the silicon dioxide film 14a as shown in FIG. 30, the effect of suppressing the release of electrons accumulated in the floating gate electrode 15 is improved and the reliability of the memory element is improved.

Embodiment 7

A nonvolatile semiconductor memory device according to a seventh embodiment of the present invention and a method for fabricating the same will be described with reference to the drawings.

Figure 31:
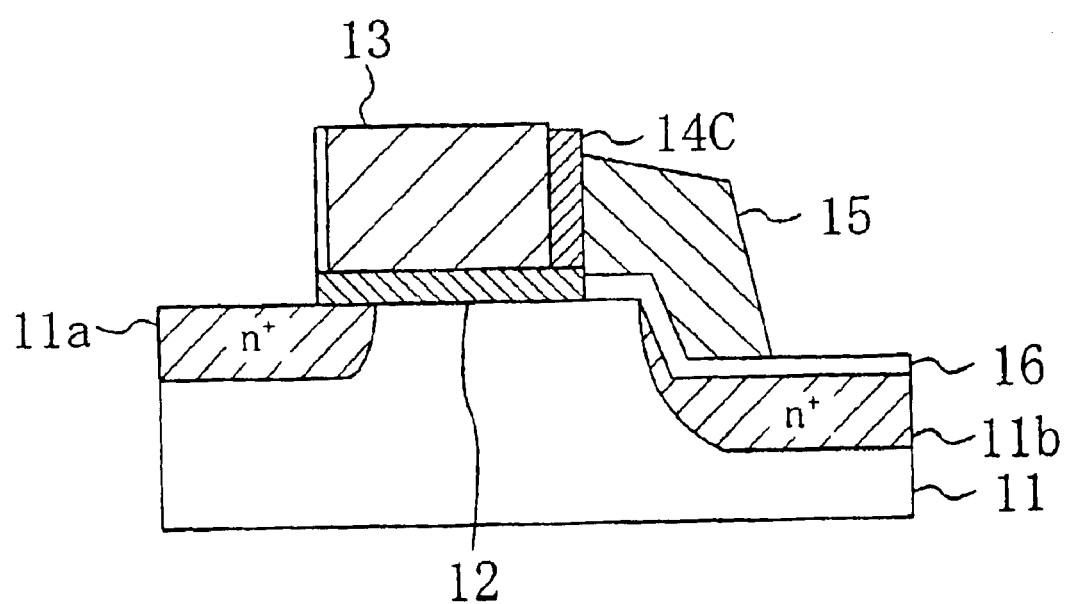
FIG. 31 is a structural cross-sectional view of a memory element in a nonvolatile semiconductor memory device according to a seventh embodiment of the present invention.

FIG. 31 shows a cross-sectional structure of a memory element in the nonvolatile semiconductor memory device according to the seventh embodiment. In FIG. 31, the description of the same components as shown in FIG. 1 is omitted by retaining the same reference numerals.

The seventh embodiment features a protective insulating film 14C which is a multilayer structure composed of a silicon dioxide film and a silicon nitride film, provided on only that one of the side surfaces of the control gate electrode 13 opposed to the floating gate electrode 15, and having a lower portion not protruding along the substrate surface.

The description will be given next to a method for fabricating the memory element in the nonvolatile semiconductor memory device according to the seventh embodiment with reference to FIGS. 32A to 32H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 32A to 32H, the same components as used in the first embodiment are designated at the same reference numerals.

First, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 32A:
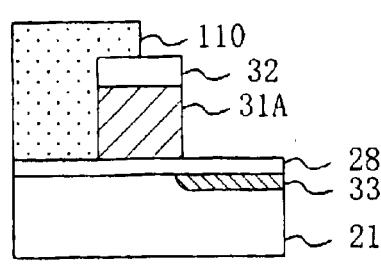
FIGS. 32A to 32H are structural cross-sectional views illustrating the individual process steps of a method for fabricating the memory element in the nonvolatile semiconductor memory device according to the seventh embodiment.

Next, as shown in FIG. 32A, the mask pattern 109 is removed and then the mask pattern 110 having an opening over the drain formation region is formed on the semiconductor substrate 21. By using the formed mask pattern 110, boron (B) ions at a dose of about $5\times10^{12}$ cm$^{-2}$ to $1\times10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5\times10^{16}$ cm$^{-3}$ to $1\times10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 32B:
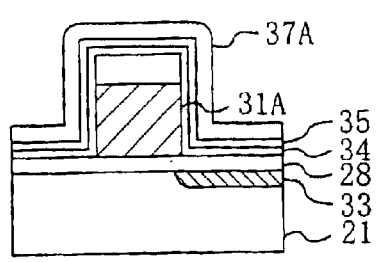

Next, as shown in FIG. 32B, the mask pattern 110 is removed and then the second silicon dioxide film 34 and the third silicon nitride film 35 each having a thickness of about 5 nm to 15 nm are deposited successively by CVD over the entire surface of the semiconductor substrate 21 including the second silicon nitride film 32 and the control gate electrode 31A. Then, the BPSG film 37A with a thickness of about 40 nm to 100 nm is deposited by CVD over the entire surface of the third silicon nitride film 35.

Figure 32C:
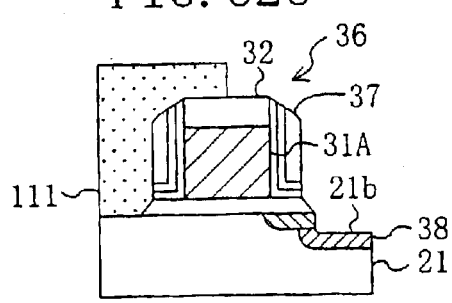

Then, as shown in FIG. 32C, anisotropic etching is performed to etch back the deposited BPSG film 37A and further remove the third silicon nitride film 35, the second silicon dioxide film 34, and the second thermal oxide film 28, thereby exposing the semiconductor substrate 21 and forming the sidewalls 37 on the side surfaces of the control gate electrode 31A via the protective insulating film 36 composed of the second silicon dioxide film 34 and the third silicon nitride film 35. Subsequently, the mask pattern 111 having an opening over the drain region is formed on the semiconductor substrate 21. By using the mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5\times10^{12}$ cm$^{-2}$ to $1\times10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5\times10^{16}$ cm$^{-3}$ to $1\times10^{19}$ cm$^{-3}$ and a junction slightly deeper than that of the first lightly doped p-type impurity diffusion region 33 is formed. Subsequently, arsenic (As) ions at a relatively low dose of about $5\times10^{12}$ cm$^{-2}$ to $1\times10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having a near-surface impurity concentration of about $5\times10^{16}$ cm$^{-3}$ to $1\times10^{19}$ cm$^{-3}$ and a junction depth of about 40 nm is formed.

Figure 32D:
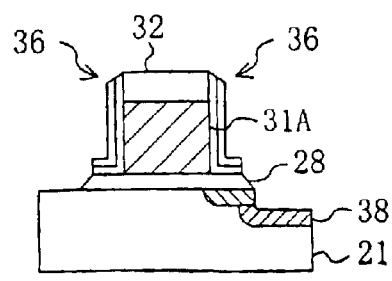
Figure 32E:
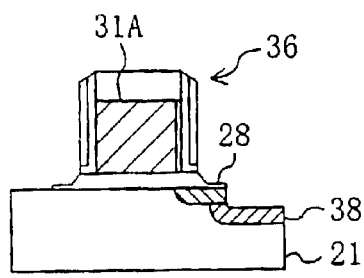
Figure 32F:
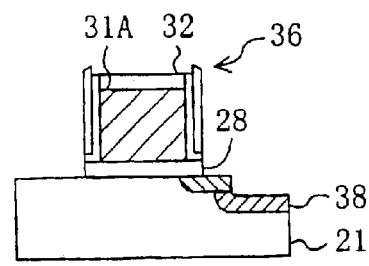

Next, as shown in FIG. 32D, the mask pattern 111 is removed and the sidewalls 37 are further removed by using vapor-phase hydrofluoric acid. Then, as shown in FIG. 32E, the portions of the protective insulating film 36 covered with the bottom portions of the sidewalls 37 are removed by anisotropic etching. Subsequently, as shown in FIG. 32F, the portions of the second thermal oxide film 28 covered with the bottom portions of the sidewalls 37 are also removed by anisotropic etching.

Figure 32G:
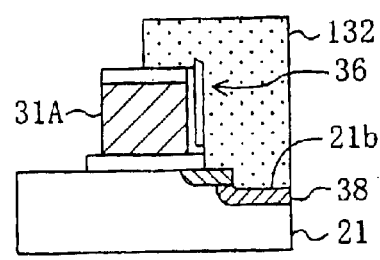

Next, as shown in FIG. 32G, a mask pattern 132 having an opening over the source region and the side of the control gate electrode 31A closer to the source region is formed. By using the formed mask pattern 132, dry etching is performed with respect to the upper third silicon nitride film 35 of the protective insulating film 36, while wet etching is performed with respect to the lower second silicon dioxide film 34 of the protective insulating film 36, whereby the portion of the protective insulating film 36 on the side surface of the control gate electrode 31A closer to the source region is removed therefrom.

Figure 32H:
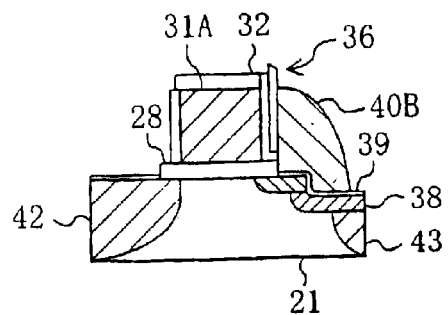

Next, as shown in FIG. 32H, the mask pattern 132 is removed and then the semiconductor substrate 21 is thermally oxidized in an oxygen atmosphere at a temperature of about 850° C., whereby the tunnel insulating film 39 with a thickness of about 9 nm is formed on the exposed surface of the recessed portion 21b of the semiconductor substrate 21. At this time, a thermal oxide film is formed on the side surface of the control gate electrode 31A closer to the source region.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21*b* in the semiconductor substrate 21 with the tunnel insulating film 39 interposed therebetween.

Next, by using the control gate electrode 31A and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 keV. As a result, the source region 42 and the drain region 43 in each of which the near-surface impurity concentration of arsenic is about $5 \times 10^{19}$ cm$^{-3}$ to $1 \times 10^{21}$ cm$^{-3}$ are formed.

Although the stepped portion covered up with the floating gate electrode 40B is provided under the floating gate electrode 40B in the semiconductor substrate 21 in the seventh embodiment such that hot electrons are implanted with high efficiency into the floating gate electrode 40B, the stepped portion may not be provided.

Thus, according to the seventh embodiment, the side surface of the control gate electrode 31A opposed to the floating gate electrode 40B is covered with the protective insulating film 36 composed of the second silicon dioxide film 34 and the third silicon nitride film 35 in the step of forming the tunnel insulating film 39, which prevents oxidation of the side surfaces of the control gate electrode 31A.

In addition, the side surface of the control gate electrode 31A opposed to the floating gate electrode 40B is covered with the protective insulating film 36, which prevents the control gate electrode 31A from being damaged by etching during the formation of the floating gate electrode 40B.

Since the sidewalls 37 composed of BPSG on the control gate electrode 31A have bottom surfaces which are on the protective insulating film 36 and are not in direct contact with the semiconductor substrate 21, as shown in FIG. 32C, the surface of the semiconductor substrate 21 is not damaged when the sidewalls 37 are removed in the subsequent step. This stabilizes the operation of the memory elements.

In the seventh embodiment also, each of the elements in the peripheral circuit formation region is formed subsequently to the step of forming the memory elements so that the control gate electrode 31A and the floating gate electrode 40B suffer no etching damage.

Since the protective insulating film 36 is not provided on the side surface of the control gate electrode 31A opposite to the floating gate electrode 40B, the effective channel length of the nonvolatile semiconductor memory element can be reduced.

Variation of Embodiment 7

A variation of the seventh embodiment of the present invention will be described with reference to the drawings.

Figure 33:
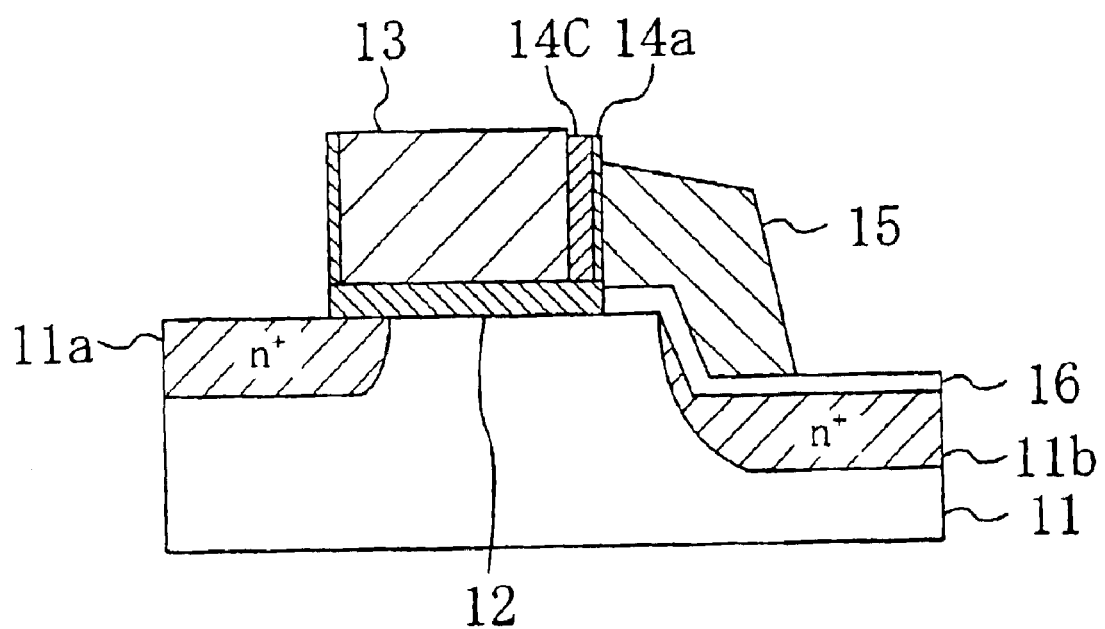
FIG. 33 is a structural cross-sectional view of a memory element in a nonvolatile semiconductor memory device according to a variation of the seventh embodiment.

FIG. 33 shows a cross-sectional structure of a memory element in a nonvolatile semiconductor memory device according to the variation of the seventh embodiment. In FIG. 33, the same components as shown in FIG. 31 are designated at the same reference numerals.

The present variation features a protective insulating film 14C provided between the control gate electrode 13 and the silicon dioxide film 14*a*, which is a multilayer structure consisting of a silicon dioxide film and a silicon nitride film formed in this order on the control gate electrode 13.

The present variation also features a tunnel insulating film 16 which is formed by the internal-combustion pyrogenic oxidation and the silicon dioxide film 14*a* which is formed on the side surface of the silicon nitride film of the protective insulating film 14C closer to the floating gate electrode 15 by the internal-combustion pyrogenic oxidation.

A description will be given herein below to a specific example of a method for forming the tunnel insulating film 16 and the silicon dioxide film 14*a*.

In the step of forming the tunnel insulating film 39 shown in FIG. 32H according to the seventh embodiment, e.g., hydrogen gas and oxygen gas are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with water vapor generated thereover, whereby the tunnel insulating film 39 with a thickness of 6 nm to 15 nm is formed on the exposed surface of the recessed portion 21*b* of the semiconductor substrate 21. Since the internal-combustion thermal oxidation process also oxidizes the silicon nitride film, the exposed surface of the third silicon nitride film 35 in the outer portion of the protective insulating film 36 is oxidized so that the tunnel insulating film 16 and the silicon dioxide film 14*a* shown in FIG. 33 are formed.

In addition to achieving the same effects as achieved by the seventh embodiment, the present variation forms the tunnel insulating film 39 with a nearly uniform thickness since the formation of the tunnel insulating film 39 by the internal-combustion thermal oxidation suppresses accelerated oxidation of the lightly doped n-type impurity diffusion region 38. Moreover, the quality of the tunnel insulating film 39 formed by the internal-combustion thermal oxidation is equal or superior to the quality of a tunnel insulating film formed in a normal oxygen atmosphere.

Furthermore, the occurrence of a bird's beak in the second thermal oxide film 28 as the gate oxide film and the occurrence of a bird's beak in the lower portion of the side surface of the control gate electrode 31A are suppressed. This provides the gate oxide film and the capacitance insulating film each having a nearly uniform thickness.

Since the use of the internal-combustion thermal oxidation oxidizes the surface of the protective insulating film 14C closer to the floating gate electrode 15 to form the silicon dioxide film 14*a* as shown in FIG. 33, the effect of suppressing the release of electrons accumulated in the floating gate electrode 15 is improved and the reliability of the memory element is improved.

Embodiment 8

A nonvolatile semiconductor memory device according to an eighth embodiment of the present invention and a method for fabricating the same will be described with reference to the drawings.

Figure 34:
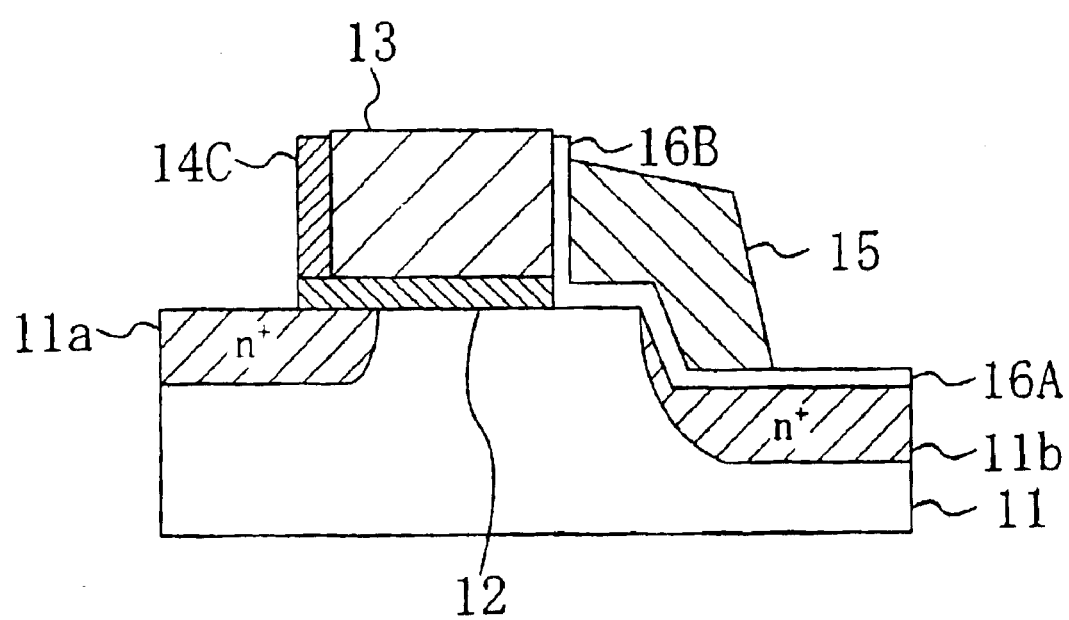
FIG. 34 is a structural cross-sectional view of a memory element in a nonvolatile semiconductor memory device according to an eighth embodiment of the present invention.

FIG. 34 shows a cross-sectional structure of a memory element in the nonvolatile semiconductor memory device according to the eighth embodiment. In FIG. 34, the description of the same components as shown in FIG. 1 is omitted by retaining the same reference numerals.

The eighth embodiment features a protective insulating film 14C which is a multilayer structure composed of a silicon dioxide film and a silicon nitride film and provided on only that one of the side surfaces of the control gate electrode 13 opposite to the floating gate electrode 15 so as not to protrude along the substrate surface.

The description will be given next to a method for fabricating the memory element in the nonvolatile semiconductor memory device according to the eighth embodiment with reference to FIGS. 35A to 35H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 35A to 35H, the same components as used in the first embodiment are designated at the same reference numerals.

First, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 35A:
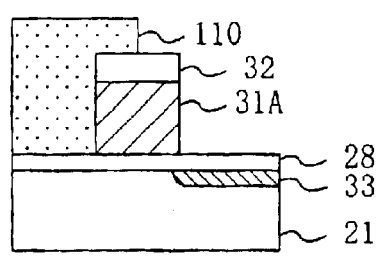
FIGS. 35A to 35H are structural cross-sectional views illustrating the individual process steps of a method for fabricating the memory element in the nonvolatile semiconductor memory device according to the eighth embodiment.

Next, as shown in FIG. 35A, the mask pattern 109 is removed and then the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 35E:
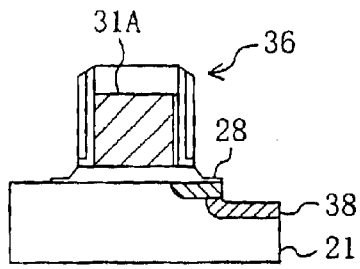
Figure 35B:
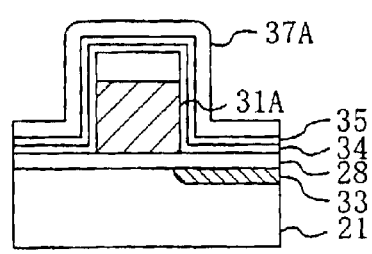

Next, as shown in FIG. 35B, the mask pattern 110 is removed and then the second silicon dioxide film 34 and the third silicon nitride film 35 each having a thickness of about 5 nm to 15 nm are deposited successively by CVD over the entire surface of the semiconductor substrate 21 including the second silicon nitride film 32 and the control gate electrode 31A. Then, the BPSG film 37A with a thickness of about 40 nm to 100 nm is deposited by CVD over the entire surface of the third silicon nitride film 35.

Figure 35F:
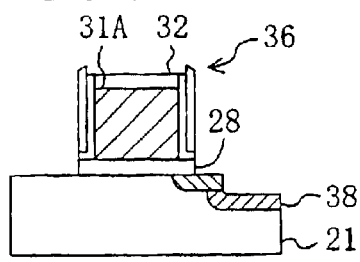
Figure 35C:
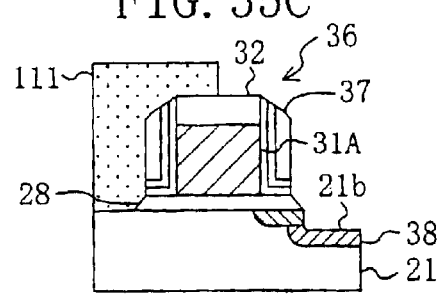

Then, as shown in FIG. 35C, anisotropic etching is performed to etch back the deposited BPSG film 37A and further remove the third silicon nitride film 35, the second silicon dioxide film 34, and the second thermal oxide film 28, thereby exposing the semiconductor substrate 21 and forming the sidewalls 37 on the side surfaces of the control gate electrode 31A via the protective insulating film 36 composed of the second silicon dioxide film 34 and the third silicon nitride film 35.

Subsequently, the mask pattern 111 having an opening over the drain region is formed on the semiconductor substrate 21. By using the mask-pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having a near-surface impurity concentration of about $5 \times 10^{16}$ cm$^{-3}$ to $1 \times 10^{19}$ cm$^{-3}$ and a junction depth of about 40 nm is formed.

Figure 35G:
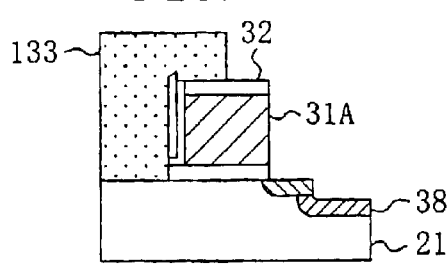
Figure 35D:
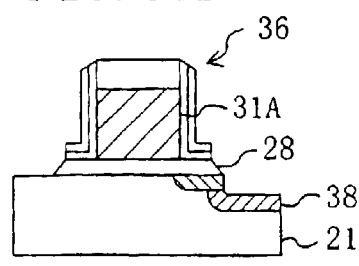

Next, as shown in FIG. 35D, the mask pattern 111 is removed and the sidewalls 37 are further removed by using vapor-phase hydrofluoric acid. Then, as shown in FIG. 35E, the portions of the protective insulating film 36 covered with the bottom portions of the sidewalls 37 are removed by anisotropic etching. Subsequently, as shown in FIG. 35F, the portions of the second thermal oxide film 28 covered with the bottom portions of the sidewalls 37 are also removed by anisotropic etching.

Next, as shown in FIG. 35G, a mask pattern 133 having an opening over the drain region and the side of the control gate electrode 31A closer to the drain region is formed. By using the formed mask pattern 133, dry etching is performed with respect to the upper third silicon nitride film 35 of the protective insulating film 36, while wet etching is performed with respect to the lower second silicon dioxide film 34 of the protective insulating film 36, whereby the portion of the protective insulating film 36 on the side surface of the control gate electrode 31A closer to the drain region is removed therefrom.

Figure 35H:
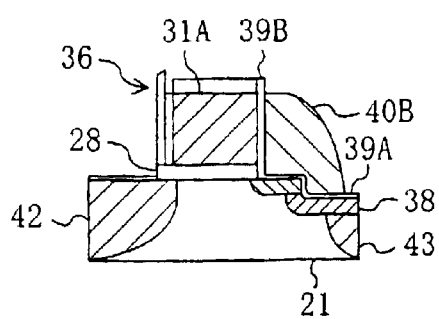

Next, as shown in FIG. 35H, the mask pattern 133 is removed and then the semiconductor substrate 21 is thermally oxidized in an oxygen atmosphere at a temperature of about 850° C., whereby a thermal oxide film with a thickness of about 9 nm is formed on the exposed surface of the recessed portion 21b of the semiconductor substrate 21 and on the side surface of the control gate electrode 31A closer to the drain region. The thermal oxide film serves as the tunnel insulating film 39A between the semiconductor substrate 21 and a floating gate electrode to be formed in the subsequent step, while serving as the capacitance insulating film 39B between the control gate electrode 31A and the floating gate electrode.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39A is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the capacitance insulating film 39B interposed therebetween and opposed to the recessed portion 21b in the semiconductor substrate 21 with the tunnel insulating film 39A interposed therebetween.

Next, by using the control gate electrode 31A and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 kev. As a result, the source region 42 and the drain region 43 in each of which the near-surface impurity concentration of arsenic is about $5 \times 10^{19}$ cm$^{-3}$ to $1 \times 10^{21}$ cm$^{-3}$ are formed.

Although the stepped portion covered up with the floating gate electrode 40B is provided under the floating gate electrode 40B in the semiconductor substrate 21 in the eighth embodiment such that hot electrons are implanted with high efficiency into the floating gate electrode 40B, the stepped portion may not be provided.

Thus, according to the eighth embodiment, the side surface of the control gate electrode 31A closer to the source region is covered with the protective insulating film 36, which prevents the control gate electrode 31A from being damaged by etching during the formation of the floating gate electrode 40B.

Since the sidewalls 37 composed of BPSG on the control gate electrode 31A have bottom surfaces which are on the protective insulating film 36 and are not in direct contact with the semiconductor substrate 21, as shown in FIG. 35C, the surface of the semiconductor substrate 21 is not damaged when the sidewalls 37 are removed in the subsequent step. This stabilizes the operation of the memory elements.

In the eighth embodiment also, each of the elements in the peripheral circuit formation region is formed subsequently to the step of forming the memory elements so that the control gate electrode 31A and the floating gate electrode 40B suffer no etching damage.

Since the tunnel insulating film 39A and the capacitance insulating film 39B are formed in the same step, the number of the process steps can be reduced. Since the tunnel insulating film 39A and the capacitance insulating film 39B have nearly equal thicknesses, the capacitive coupling ratio between the control gate electrode 31A and the floating gate electrode 40B can be increased so that the operating characteristics of the nonvolatile semiconductor memory element are improved.

Variation of Embodiment 8

A variation of the eighth embodiment of the present invention will be described with reference to the drawings.

Figure 36:
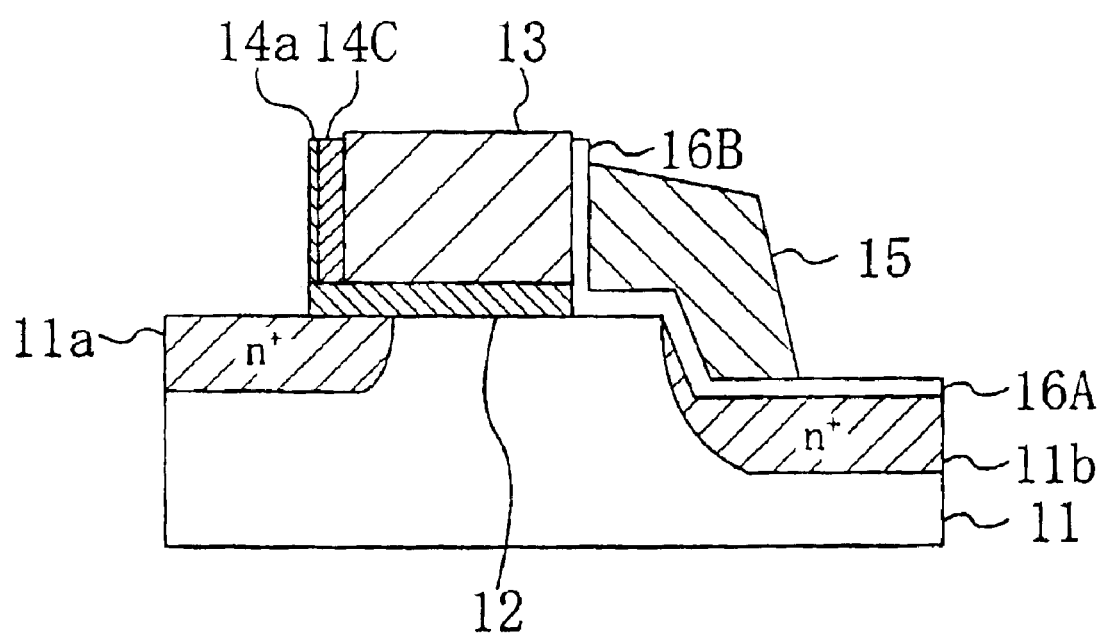
FIG. 36 is a structural cross-sectional view of a memory element in a nonvolatile semiconductor memory device according to a variation of the eighth embodiment.

FIG. 36 shows a cross-sectional structure of a memory element in a nonvolatile semiconductor memory device according to the variation of the eighth embodiment. In FIG. 36, the same components as shown in FIG. 34 are designated at the same reference numerals.

The present variation features a protective insulating film 14C provided on the side surface of the control gate electrode 13 opposite to the floating gate electrode 15, which is a multilayer structure composed of a silicon dioxide film and a silicon nitride film formed in this order on the control gate electrode 13.

The present variation also features the tunnel insulating film 16A and the capacitance insulating film 16B formed by the internal-combustion pyrogenic oxidation and a silicon dioxide film 14a formed on the side surface of the silicon nitride film of the protective insulating film 14C opposite to the silicon dioxide film by the internal-combustion pyrogenic oxidation.

A description will be given herein below to a specific example of a method for forming the tunnel insulating film 16A and the silicon dioxide film 14a.

In the step of forming the tunnel insulating film 39A and the capacitance insulating film 39B shown in FIG. 35H according to the eighth embodiment, e.g., hydrogen gas and oxygen gas are introduced into the chamber of the rapid thermal oxidation apparatus in which the temperature is set to about 900° C. to 1100° C. and the pressure is set to about 1000 Pa to 2000 Pa and the semiconductor substrate 21 is thermally oxidized with water vapor generated thereover, whereby a thermal oxide film with a thickness of 6 nm to 15 nm is formed on the exposed surface of the recessed portion 21b of the semiconductor substrate 21. The thermal oxide film serves as the tunnel insulating film 39A between the semiconductor substrate 21 and the floating gate electrode, while serving as the capacitance insulating film 39B between the control gate electrode 31A and the floating gate electrode. Since the internal-combustion thermal oxidation process also oxidizes the silicon nitride film, the exposed surface of the third silicon nitride film 35 in the outer portion of the protective insulating film 36 is oxidized so that the tunnel insulating film 16A and the silicon dioxide film 14A shown in FIG. 36 are formed.

In addition to achieving the same effects as achieved by the eighth embodiment, the present variation forms the tunnel insulating film 39A with a nearly uniform thickness since the formation of the tunnel insulating film 39 by the internal-combustion thermal oxidation suppresses accelerated oxidation of the lightly doped n-type impurity diffusion region 38. Moreover, the quality of each of the tunnel insulating film 39A and the capacitance insulating film 39B formed integrally by the internal-combustion thermal oxidation is equal or superior to the quality of a thermal oxide film formed in a normal oxygen atmosphere.

Furthermore, the occurrence of a bird's beak in the second thermal oxide film 28 as the gate oxide film and the occurrence of a bird's beak in the lower portion of the side surface of the control gate electrode 31A are suppressed. This provides the gate oxide film and the capacitance insulating film 39B each having a nearly uniform thickness.

Embodiment 9

A nonvolatile semiconductor memory device according to a ninth embodiment of the present invention and a method for fabricating the same will be described with reference to the drawings.

Figure 37A:
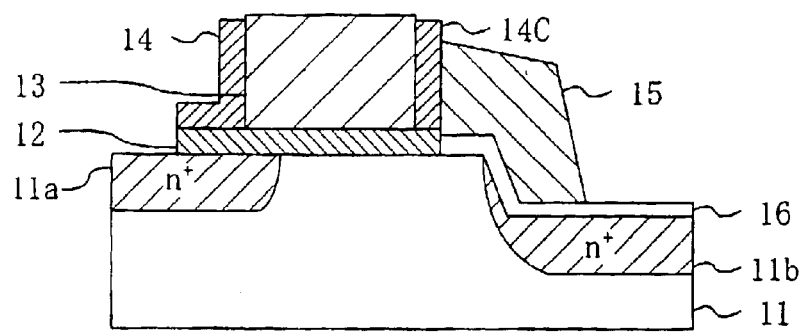
FIG. 37A is a structural cross-sectional view of a memory element in a nonvolatile semiconductor memory device according to a ninth embodiment of the present invention.
Figure 37B:
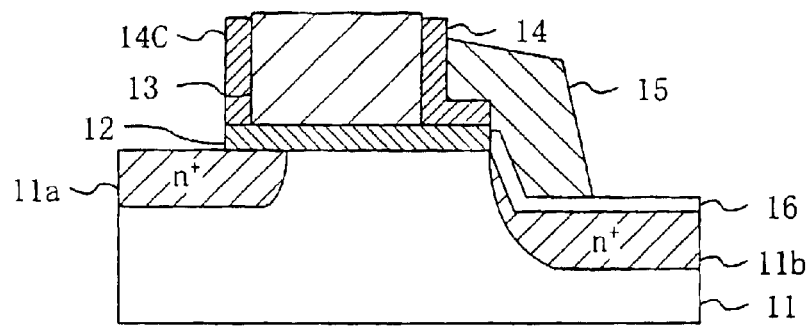
FIGS. 37B to 37D are structural cross-sectional views of a memory element in a nonvolatile semiconductor memory device according to a variation of the ninth embodiment.

FIG. 37A shows a cross-sectional structure of a memory element in the nonvolatile semiconductor memory device according to the ninth embodiment and FIG. 37B shows a variation thereof. In FIGS. 37A and 37B, the description of the same components as shown in FIG. 1 is omitted by retaining the same reference numerals.

As shown in FIG. 37A, a memory element according to the ninth embodiment has a protective insulating film 14C which is a multilayer structure composed of a silicon dioxide film and a silicon nitride film and provided only on that one of the side surfaces of the control gate electrode 13 opposed to the floating gate electrode 15 and a protective insulating film 14 which has a protruding portion in the lower part thereof and is provided on the side surface of the control gate electrode 13 opposite to the floating gate electrode 15.

As shown in FIG. 37B, on the other hand, a memory element according to the variation of the ninth embodiment has a protective insulating film 14 which is a multilayer structure composed of a silicon dioxide film and a silicon nitride film, provided on that one of the side surfaces of the control gate electrode 13 opposed to the floating gate electrode 15, and having a protruding portion in the lower part thereof and a protective insulating film 14C which is formed only on that one of the side surfaces of the control gate electrode 13 opposite to the floating gate electrode 15.

The description will be given next to a method for fabricating the memory element in the nonvolatile semiconductor memory device according to the ninth embodiment with reference to FIGS. 38A to 38G. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 38A to 38G, the same components as used in the first embodiment are designated at the same reference numerals.

First, dry etching is performed with respect to the second silicon nitride film 32 and to the polysilicon film 31 by using a mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 38A:
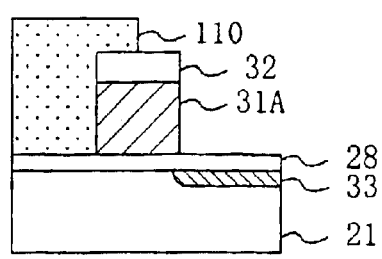
FIGS. 38A to 38G are structural cross-sectional views illustrating the individual process steps of a method for fabricating the memory element in the nonvolatile semiconductor memory device according to the ninth embodiment.
Figure 38E:
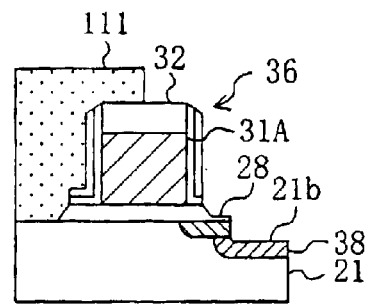

Next, as shown in FIG. 38A, the mask pattern 109 is removed and then the mask pattern 110 having an opening over, the drain formation region is formed on the semiconductor substrate 21. By using the formed mask pattern 110, boron (B) ions at a dose of about $5\times10^{12}$ cm$^{-2}$ to $1\times10^{14}$ cm$^{-2}$ are implanted into the semiconductor substrate 21 with an implant energy of about 5 keV to 15 keV, whereby the first lightly doped p-type impurity diffusion region 33 having a near-surface impurity concentration of about $5\times10^{16}$ cm$^{-3}$ to $1\times10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 38B:
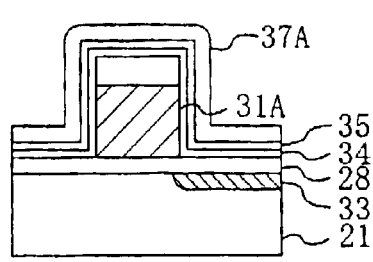

Next, as shown in FIG. 38B, the mask pattern 110 is removed and then a second silicon dioxide film 34 and the third silicon nitride film 35 each having a thickness of about 5 nm to 15 nm are deposited successively by CVD over the entire surface of the semiconductor substrate 21 including the second silicon nitride film 32 and the control gate electrode 31A. Then, the BPSG film 37A with a thickness of about 40 nm to 100 nm is deposited by CVD over the entire surface of the third silicon nitride film 35.

Figure 38F:
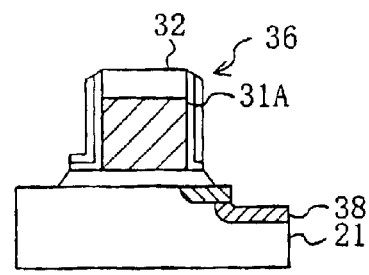
Figure 38C:
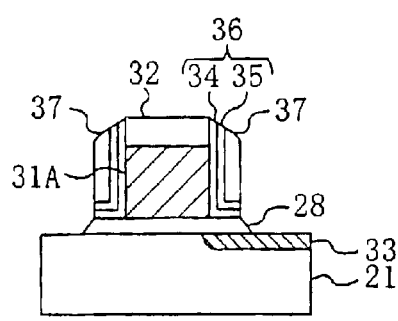

Then, as shown in FIG. 38C, anisotropic etching is performed to etch back the deposited BPSG film 37A and further remove the third silicon nitride film 35, the second silicon dioxide film 34, and the second thermal oxide film 28, thereby exposing the semiconductor substrate 21 and forming the sidewalls 37 on the side surfaces of the control gate electrode 31A via a protective insulating film 36 composed of the second silicon dioxide film 34 and the third silicon nitride film 35.

Figure 38G:
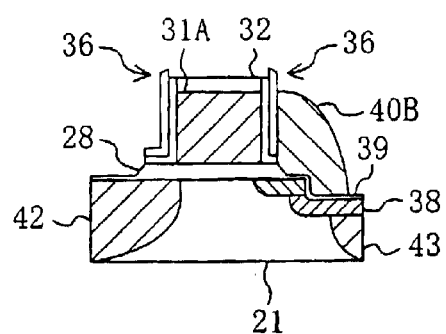
Figure 38D:
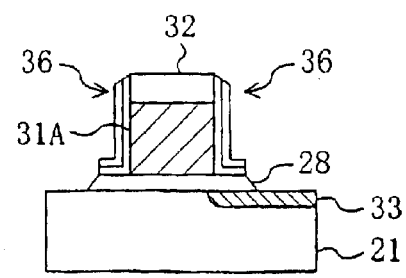

Next, as shown in FIG. 38D, the sidewalls 37 are removed by using vapor-phase hydrofluoric acid. Then, as shown in FIG. 3SE, the mask pattern 111 having an opening over the drain region is formed on the semiconductor substrate 21. By using the formed mask pattern 111, the control gate electrode 31A, and the protective insulating film 36, dry etching is performed with respect to the upper portion of the semiconductor substrate 21 by reactive-ion etching (RIE), thereby forming the recessed portion 21b at a depth of about 25 nm to 75 nm. At that time, the portions of the protective insulating film 36 covered with the bottom surfaces of the sidewalls 37 and the respective upper parts of the portions of the second thermal oxide film 28 covered with the bottom surfaces of the sidewalls 37 are removed. It is to be noted that the etching may also be performed by CDE instead of RIE.

Next, boron (B) ions at a relatively low dose of about $5\times10^{12}$ cm$^{-2}$ to $1\times10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5\times10^{16}$ cm$^{-3}$ to $1\times10^{19}$ cm$^{-3}$ and a junction slightly deeper than that of the first lightly doped p-type impurity diffusion region 33 is formed. Subsequently, arsenic (As) ions at a relatively low dose of about $5\times10^{12}$ cm$^{-2}$ to $1\times10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having a near-surface impurity concentration of about $5\times10^{16}$ cm$^{-3}$ to $1\times10^{19}$ cm$^{-3}$ and a junction depth of about 40 nm is formed. In the present embodiment, the portions of the second thermal oxide film 28 covered with the bottom surfaces of the sidewalls 37 serve as a mask against arsenic (As) ions.

Next, as shown in FIG. 38F, the portions of the second thermal oxide film 28 covered with the bottom portions of the sidewalls 37 are removed by anisotropic etching.

Next, as shown in FIG. 38G, the semiconductor substrate 21 is thermally oxidized in an oxygen atmosphere at a temperature of about 850° C., whereby a tunnel insulating film 39 with a thickness of about 9 nm is formed on the exposed surface of the recessed portion 21b of the semiconductor substrate 21.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5\times10^{13}$ cm$^{-2}$ to $1\times10^{14}$ cm$^{-2}$ are implanted into the semiconductor substrate 21 with an implant energy of about 50 keV. As a result, the source region 42 and the drain region 43 in each of which the near-surface impurity concentration of arsenic is about $5\times10^{19}$ cm$^{-3}$ to $1\times10^{21}$ cm$^{-3}$ are formed.

Although the stepped portion covered up with the floating gate electrode 40B is provided under the floating gate electrode 40B in the semiconductor substrate 21 in the ninth embodiment such that hot electrons are implanted with high efficiency into the floating gate electrode 40B, the stepped portion may not be provided.

Thus, according to the ninth embodiment, each of the side surfaces of the control gate electrode 31A is covered with the protective insulating film 36 composed of the second silicon dioxide film 34 and the third silicon nitride film 35, which prevents oxidation of the side surfaces of the control gate electrode 31A.

In addition, the both side surfaces of the control gate electrode 31A are covered with the protective insulating film 36, which prevents the control gate electrode 31A from being damaged by etching during the formation of the floating gate electrode 40B.

In the ninth embodiment also, each of the elements in the peripheral circuit formation region is formed subsequently to the step of forming the memory elements so that the control gate electrode 31A and the floating gate electrode 40B suffer no etching damage.

Since the sidewalls 37 composed of BPSG on the control gate electrode 31A have bottom surfaces which are on the protective insulating film 36 and are not in direct contact with the semiconductor substrate 21, as shown in FIG. 38C, the surface of the semiconductor substrate 21 is not damaged when the sidewalls 37 are removed in the subsequent step. This stabilizes the operation of the memory elements.

For the memory element according to the variation of the ninth embodiment shown in FIG. 37B, it is appropriate to form the recessed portion 21b by leaving the sidewalls 37 after the step shown in FIG. 38C and then remove the protruding portion of the protective insulating film 36 and the end portion of the thermal oxide film 28 which are closer to the source region.

Figure 37C:
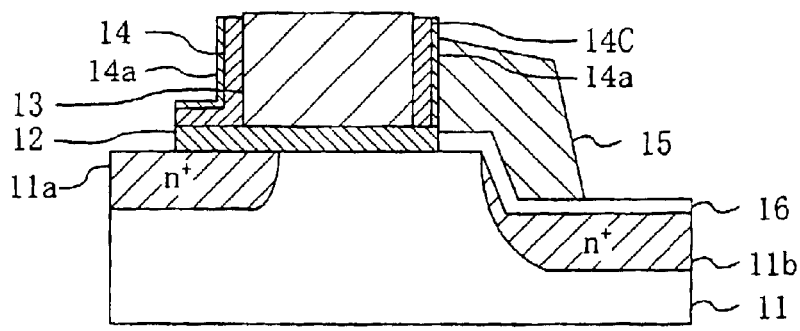
Figure 37D:
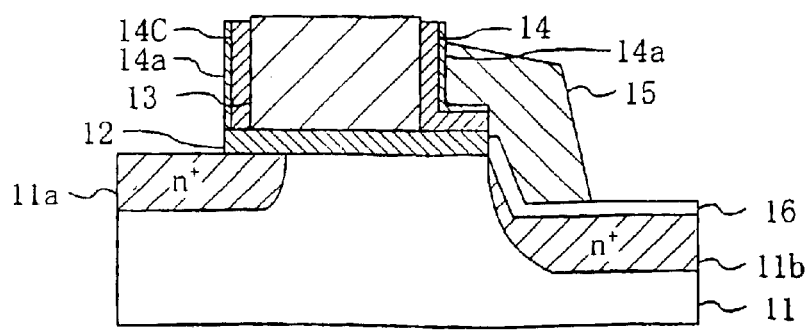

Alternatively, it is also possible to form the tunnel insulating film 16 by the internal-combustion pyrogenic oxidation and form the silicon dioxide film 14a by the internal-combustion pyrogenic oxidation also on the outer portions of the protective insulating films 14 and 14C, as shown in FIGS. 37C and 37D.

A description will be given herein below to a specific example of a method for forming the tunnel insulating film 16 and the silicon dioxide film 14a. In the step of forming the tunnel insulating film shown in FIG. 38G, e.g., hydrogen gas and oxygen are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with water vapor generated thereover, whereby the tunnel insulating film 39 with a thickness of 6 nm to 15 nm is formed on the exposed surface of the recessed portion 21b of the semiconductor substrate 21. Since the internal-combustion thermal oxidation also oxidizes the silicon nitride film, the exposed surface of the silicon nitride film 35 in the outer portion of the protective insulating film 36 is oxidized, whereby the tunnel insulating film 16 and the silicon dioxide film 14a shown in FIG. 37C or 37D are formed.

Embodiment 10

A nonvolatile semiconductor memory device according to a tenth embodiment of the present invention and a method for fabricating the same will be described with reference to the drawings.

Figure 39:
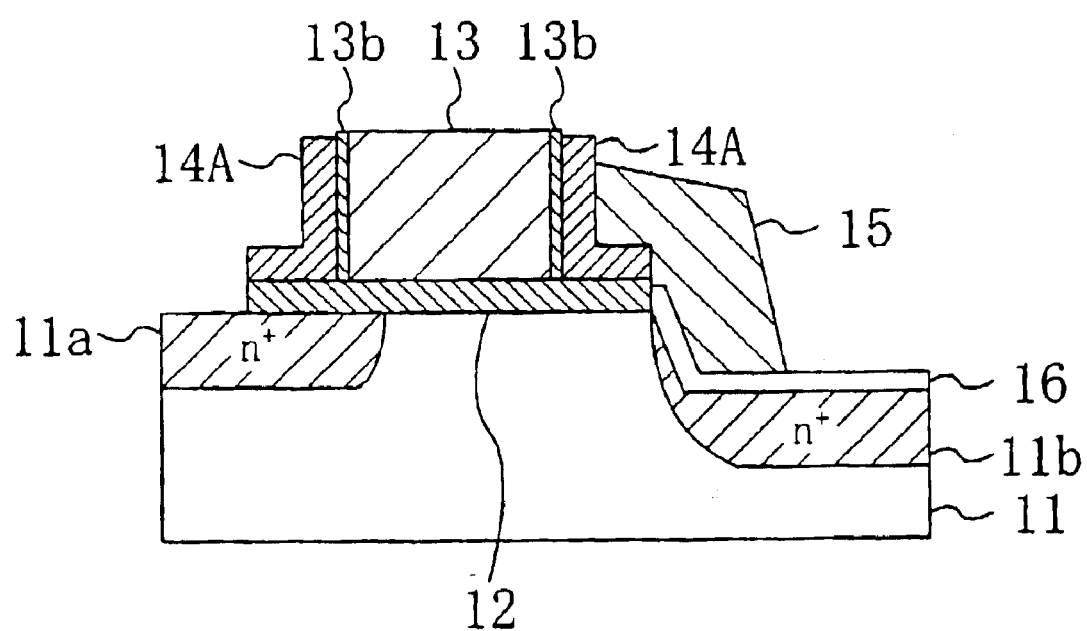
FIG. 39 is a structural cross-sectional view of a memory element in a nonvolatile semiconductor memory device according to a tenth embodiment of the present invention.

FIG. 39 shows a cross-sectional structure of a memory element in the nonvolatile semiconductor memory device according to the tenth embodiment. In FIG. 39, the description of the same components as shown in FIG. 1 is omitted by retaining the same reference numerals.

The tenth embodiment features a single-layer protective insulating film 14A composed of a silicon nitride which is provided on each of the side surfaces of the control gate electrode 13 and a control gate electrode 13 having a silicon dioxide film 13b which is formed by the internal-combustion pyrogenic oxidation on each of the side portions thereof.

The description will be given next to a method for fabricating the memory element in the nonvolatile semiconductor memory device according to the tenth embodiment with reference to FIGS. 40A to 40H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 40A to 40H, the same components as used in the first embodiment are designated at the same reference numerals.

Figure 40A:
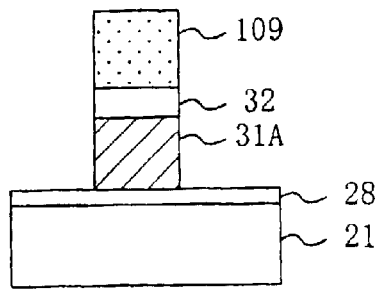
FIGS. 40A to 40H are structural cross-sectional views illustrating the individual process steps of a method for fabricating the memory element in the nonvolatile semiconductor memory device according to the tenth embodiment.

First, as shown in FIG. 40A, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 40E:
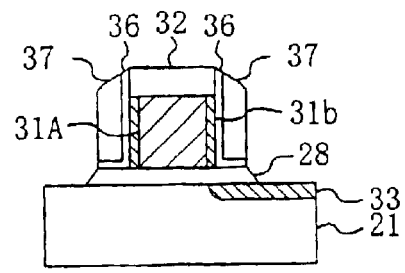
Figure 40B:
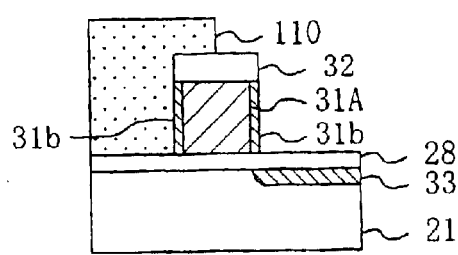

Next, as shown in FIG. 40B, the mask pattern 109 is removed and then hydrogen gas and oxygen gas are introduced into the chamber of the thermal oxidation system in which the temperature is set to about 900° C. to 1100° C. and the pressure is set to about 1000 Pa to 2000 Pa. Sy thermally oxidizing the control gate electrode 31A with water vapor generated over the semiconductor substrate 21, a silicon dioxide film 31b with a thickness of about 5 nm to 15 nm is formed on each of the side portions of the control gate electrode 31A. Subsequently, the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 kev to 15 keV, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 40F:
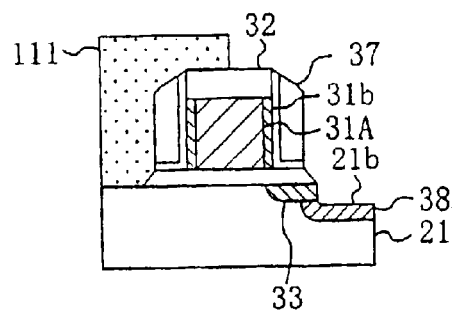
Figure 40C:
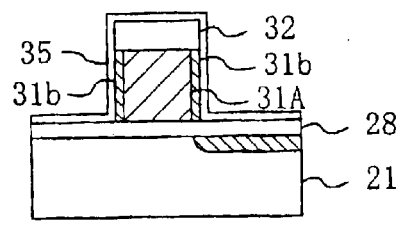

Next, as shown in FIG. 40C, the mask pattern 110 is removed and then the third silicon nitride film 35 having a thickness of about 5 nm to 15 nm is deposited by CVD over the entire surface of the semiconductor substrate 21 including the second silicon nitride film 32 and the control gate electrode 31A.

Figure 40G:
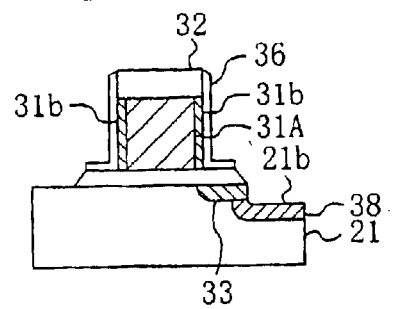
Figure 40D:
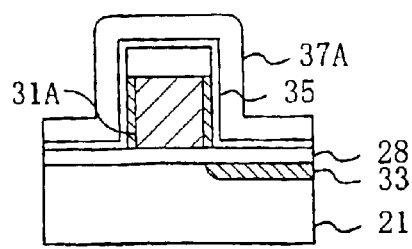

Then, as shown in FIG. 40D, the BPSG film 37A with a thickness of about 40 nm to 100 nm is deposited by CVD over the entire surface of the third silicon nitride film 35.

Then, as shown in FIG. 40E, anisotropic etching is performed to etch back the deposited BPSG film 37A and further remove the third silicon nitride film 35 and the second thermal oxide film 28, thereby exposing the semiconductor substrate 21 and forming the sidewalls 37 on the side surfaces of the control gate electrode 31A via the protective insulating film 36 composed of the third silicon nitride film 35.

Next, as shown in FIG. 40F, the mask pattern 111 having an opening over the drain region is formed. By using the formed mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 kev by using the mask pattern 111, whereby the second lightly doped p-type impurity diffusion region (not shown) having a near-surface impurity concentration of about $5\times10^{16}$ cm$^{-3}$ to $1\times10^{19}$ cm$^{-3}$ and a junction slightly deeper than that of the first lightly doped p-type impurity diffusion region 33 is formed. Subsequently, arsenic (As) ions at a relatively low dose of about $5\times10^{12}$ cm$^{-2}$ to $1\times10^{14}$ cm$^{-2}$ are implanted into the semiconductor substrate 21 with an implant energy of about 20 kev to 50 kev by using the mask pattern 111, whereby the shallow lightly doped n-type impurity diffusion region 38 having an impurity concentration of about $5\times10^{16}$ cm$^{-3}$ to $1\times10^{19}$ cm$^{-3}$ and a junction depth of about 40 nm is formed.

Figure 40H:
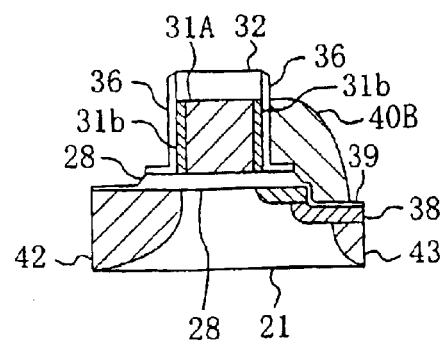

Next, as shown in FIG. 40G, the mask pattern 111 is removed and the sidewalls 37 are further removed by using vapor-phase hydrofluoric acid. Then, as shown in FIG. 40H, the semiconductor substrate 21 is thermally oxidized in an oxygen atmosphere at a temperature of about 850° C., whereby the tunnel insulating film 39 with a thickness of about 9 nm is formed on the exposed surface of the recessed portion 21b of the semiconductor substrate 21.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form the sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5\times10^{13}$ cm$^{-2}$ to $1\times10^{14}$ cm$^{-2}$ are implanted into the semiconductor substrate 21 with an implant energy of about 50 keV. As a result, the source region 42 and the drain region 43 in each of which the near-surface impurity concentration of arsenic is about $5\times10^{19}$ cm$^{-3}$ to $1\times10^{21}$ cm$^{-3}$ are formed.

Although the stepped portion covered up with the floating gate electrode 40B is provided under the floating gate electrode 40B in the semiconductor substrate 21 in the tenth embodiment such that hot electrons are implanted with high efficiency into the floating gate electrode 40B, the stepped portion may not be provided.

Thus, according to the tenth embodiment, each of the side surfaces of the control gate electrode 31A is covered with the protective insulating film 36, which prevents the control gate electrode 31A from being damaged by etching during the formation of the floating gate electrode 40B.

Since the sidewalls 37 composed of BPSG on the control gate electrode 31A have bottom surfaces which are on the protective insulating film 36 and are not in direct contact with the semiconductor substrate 21, as shown in FIG. 40E, the surface of the semiconductor substrate 21 is not damaged when the sidewalls 37 are removed in the subsequent step. This stabilizes the operation of the memory elements.

In the tenth embodiment also, each of the elements in the peripheral circuit formation region is formed subsequently to the step of forming the memory elements so that the control gate electrode 31A and the floating gate electrode 40B suffer no etching damage.

Since the silicon dioxide film 31B has been formed by the pyrogenic internal-combustion thermal oxidation on each of the side portions of the control gate electrode 31A, it is more compact than a silicon dioxide film formed by CVD. This enhances the effect of suppressing the release of electrons accumulated in the floating gate electrode 40B and increases the reliability of the memory element.

Figure 41A:
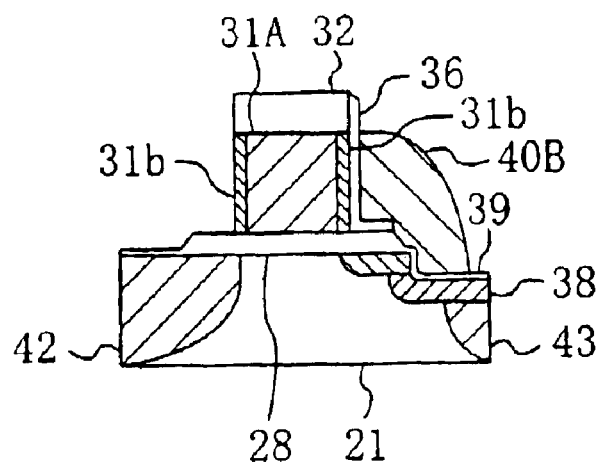
FIGS. 41A and 41B are structural cross-sectional views of other examples of the memory element in the nonvolatile semiconductor memory device according to the tenth embodiment.
Figure 41B:
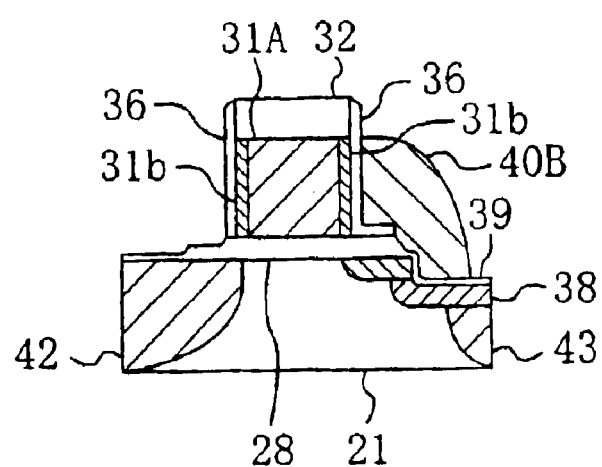

Although the tenth embodiment has provided the protective insulating film 36 on each of the side surfaces of the control gate electrode 31A, the protective insulating film 36 located on the side of the control gate electrode 31A opposite to the floating gate electrode 40B need not be provided, as shown in FIG. 41A. It is also possible to remove only the protruding portion in the lower part of the protective insulating film 36 located on the side of the control gate electrode 31A opposite to the floating gate electrode 40B, as shown in FIG. 41B.

Figure 42A:
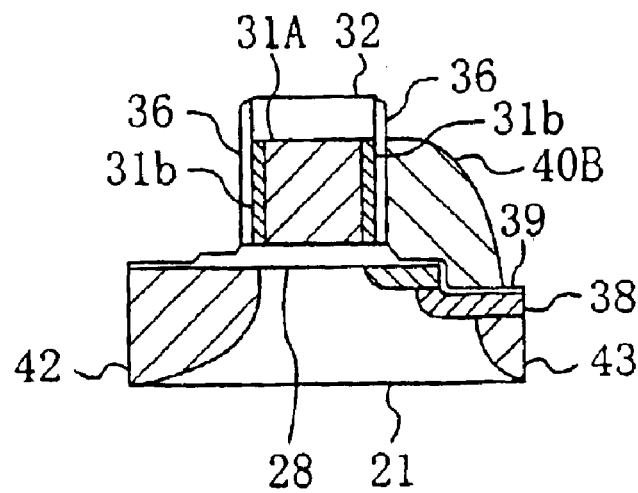
FIGS. 42A and 42B are structural cross-sectional views of other examples of the memory element in the nonvolatile semiconductor memory device according to the tenth embodiment.

It is also possible to remove, from the structure shown in FIG. 40G, the sidewalls 37 and further remove the respective portions of the protective insulating film 36 and the second insulating film 28 serving as the gate oxide film which are covered with the bottom surfaces of the sidewalls 37 by anisotropic etching to provide the structure shown in FIG. 42A. As shown in FIG. 142B, it is also possible to leave the protruding portion in the lower part of the protective insulating film 36 located on the side of the control gate electrode 31A opposite to the floating gate electrode 40B.

Figure 43:
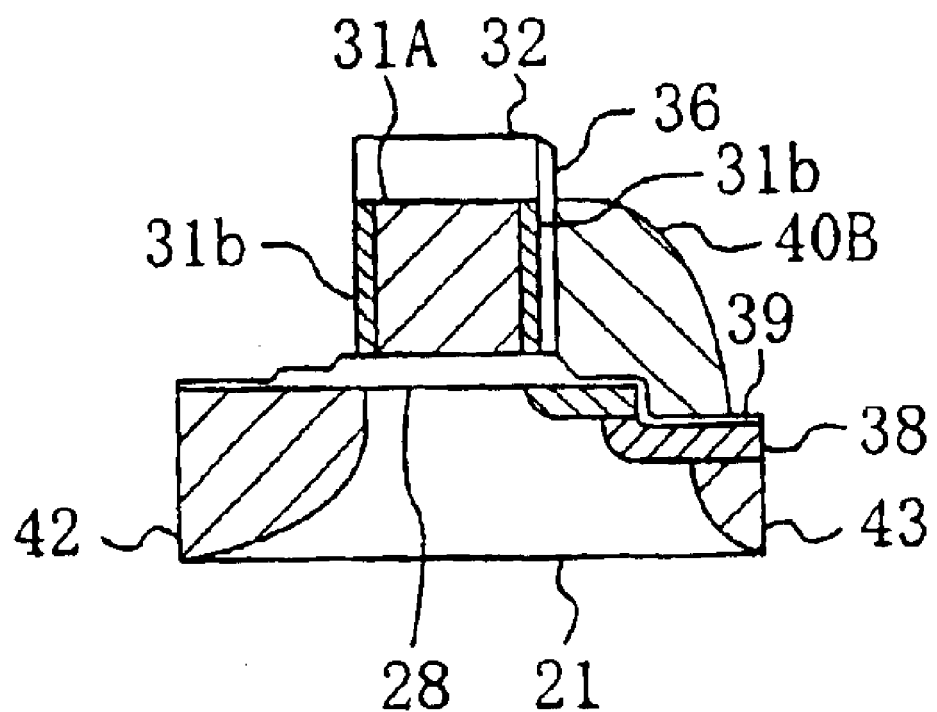
FIG. 43 is a structural cross-sectional view of another example of the memory element in the nonvolatile semiconductor memory device according to the tenth embodiment.

As shown in FIG. 43, it is also possible to remove the protective insulating film 36 located on that one of the side surface of the control gate electrode 31A opposite to the floating gate electrode 40B.

Figure 42B:
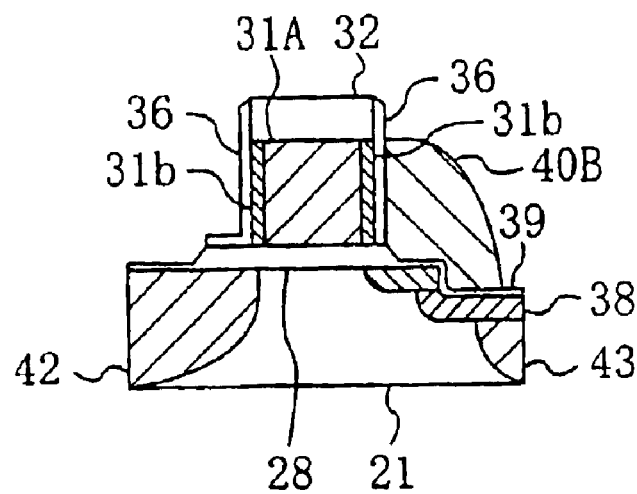

In the structures shown in FIGS. 42A, 42B, and 43, the respective portions of the protective insulating film 36 and the second insulating film 28 which are covered with the bottom surfaces of the sidewalls 37 no more exist. This suppresses the trapping of electrons or holes in the protective insulating film 36 and the second insulating film 28 during a write or erase operation. As a result, the degradation of the operating characteristics of the memory element due to repeated write and erase operations performed with respect to the memory element can be suppressed.

Variation of Embodiment 10

A variation of the tenth embodiment of the present invention will be described with reference to the drawings.

Figure 44:
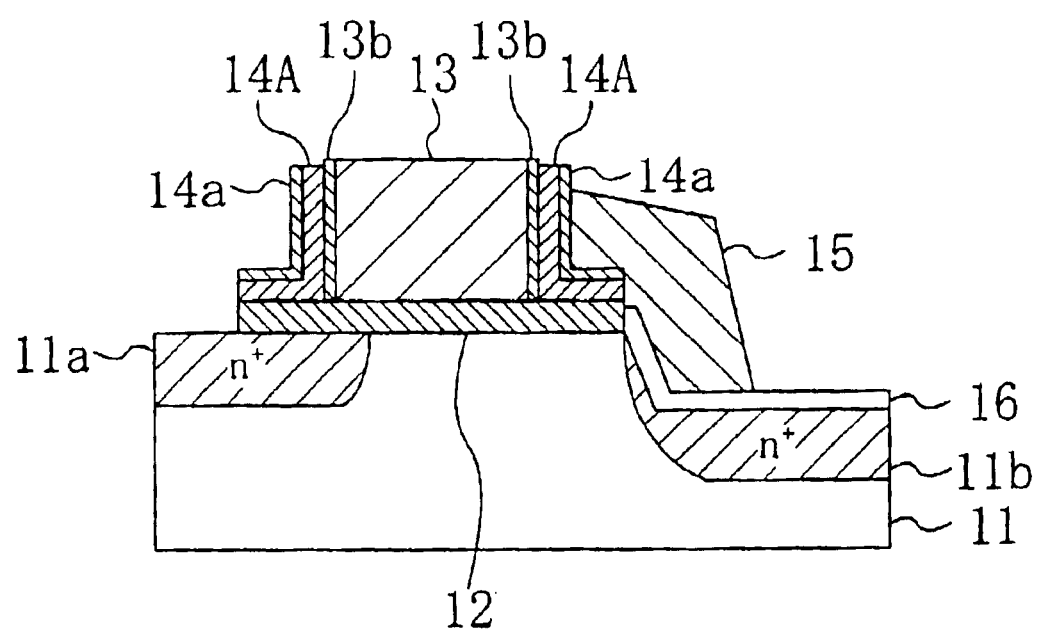
FIG. 44 is a structural cross-sectional view of a memory element in a nonvolatile semiconductor memory device according to a variation of the tenth embodiment.

FIG. 44 shows a cross-sectional structure of a memory element in a nonvolatile semiconductor memory device according to the variation of the tenth embodiment. In FIG. 44, the same components as shown in FIG. 42 are designated at the same reference numerals.

The present variation features a tunnel insulating film 16 which is formed by the internal-combustion pyrogenic oxidation and a silicon dioxide film 14a which is formed by the internal-combustion pyrogenic oxidation on the surface of the protective insulating film 14A opposite to the control gate electrode 13.

A description will be given herein below to a specific example of a method for forming the tunnel insulating film 16 and the silicon dioxide film 14a.

In the step of forming the tunnel insulating film 39 shown in FIG. 40H according to the tenth embodiment, e.g., hydrogen gas and oxygen gas are introduced into the chamber of the rapid thermal oxidation apparatus in which the temperature is set to about 900° C. to 1100° C. and the pressure is set to about 1000 Pa to 2000 Pa such that the semiconductor substrate 21 is thermally oxidized with vapor generated over the semiconductor substrate 21, whereby the tunnel insulating film 39 with a thickness of 6 nm to 15 nm is formed on the exposed surface of the recessed portion 21b of the semiconductor substrate 21. At this time, the exposed surface of the protective insulating film 36 composed of a silicon nitride is also oxidized simultaneously so that the tunnel insulating film 16 and the silicon dioxide film 14a shown in FIG. 44 are formed.

In addition to achieving the same effects as achieved by the tenth embodiment, the present variation forms the tunnel insulating film 39 with a nearly uniform thickness since the formation of the tunnel insulating film 39 by the internal-combustion thermal oxidation suppresses accelerated oxidation of the lightly doped n-type impurity diffusion region 38. Moreover, the quality of the tunnel insulating film 39 formed by the internal-combustion thermal oxidation is equal or superior to the quality of a tunnel insulating film formed in a normal oxygen atmosphere.

Furthermore, the use of the internal-combustion thermal oxidation suppresses the occurrence of a bird's beak in the second thermal oxide film 28 as the gate oxide film and the occurrence of a bird's beak in the lower portion of the side surface of the control gate electrode 31A so that each of the gate oxide film and the protective insulating film 36 serving as the capacitance insulating film is formed to have a nearly uniform thickness.

Since the use of the internal-combustion thermal oxidation further oxidizes the outer surface of the silicon nitride film of the protective insulating film 14A to form the silicon dioxide film 14a as shown in FIG. 44, the effect of suppressing the release of electrons accumulated in the floating gate electrode 15 is improved and the reliability of the memory element is improved.

Figure 45:
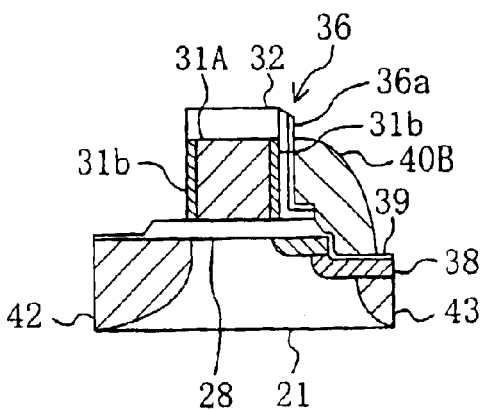
FIG. 45 is a structural cross-sectional view of another example of the memory element in the nonvolatile semiconductor memory device according to the variation of the tenth embodiment.

Although the present variation has provided the protective insulating film 36 on each of the side surfaces of the control gate electrode 31A, the protective insulating film 36 located on the side of the control gate electrode 31A opposite to the floating gate electrode 40B need not be provided, as shown in FIG. 45. A silicon dioxide film 36a formed on the protective insulating film 36 in FIG. 45 corresponds to the silicon dioxide film 14a in FIG. 44.

Figure 46:
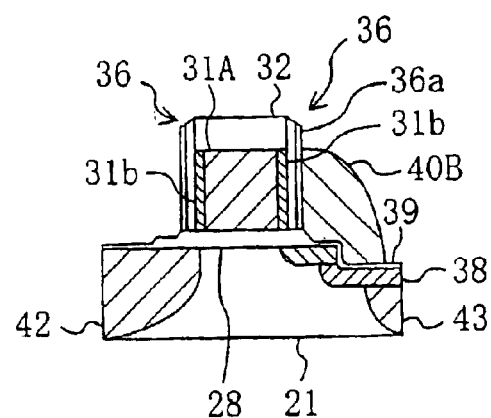
FIG. 46 is a structural cross-sectional view of another example of the memory element in the nonvolatile semiconductor memory device according to the variation of the tenth embodiment.

It is also possible to remove the respective portions of the protective insulating film 36 and the second insulating film 28 which are covered with the bottom surfaces of the sidewalls 37 to provide the structure shown in FIG. 46.

Figure 47:
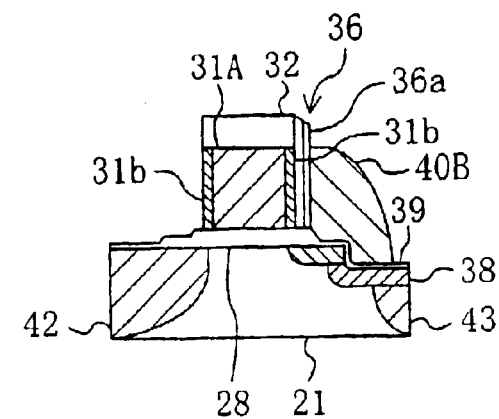
FIG. 47 is a structural cross-sectional view of another example of the memory element in the nonvolatile semiconductor memory device according to the variation of the tenth embodiment.

As shown in FIG. 47, it is also possible to remove the protective insulating film 36 located on that one of the side surfaces of the control gate electrode 31A opposite to the floating gate electrode 40B.

In the structure shown in FIGS. 46 and 47, the respective portions of the protective insulating film 36 and the second insulating film 28 which are covered with the bottom surfaces of the sidewalls 37 no more exist. This suppresses the trapping of electrons or holes in the protective insulating film 36 and the second insulating film 28 during a write or erase operation. As a result, the degradation of the operating characteristics of the memory element due to repeated write and erase operations performed with respect to the memory element can be suppressed.

It is also possible to remove, of the protective insulating film 36 provided on each of the side surfaces of the control gate electrode 31A, only the protruding portion which is located on the side opposite to the floating gate electrode 40B. Conversely, it is also possible to remove only the protruding portion of the protective insulating film 36 which is located on the side opposed to the floating gate electrode 40B.

Embodiment 11

A nonvolatile semiconductor memory device according to an eleventh embodiment of the present invention and a method for fabricating the same will be described with reference to the drawings.

Figure 48:
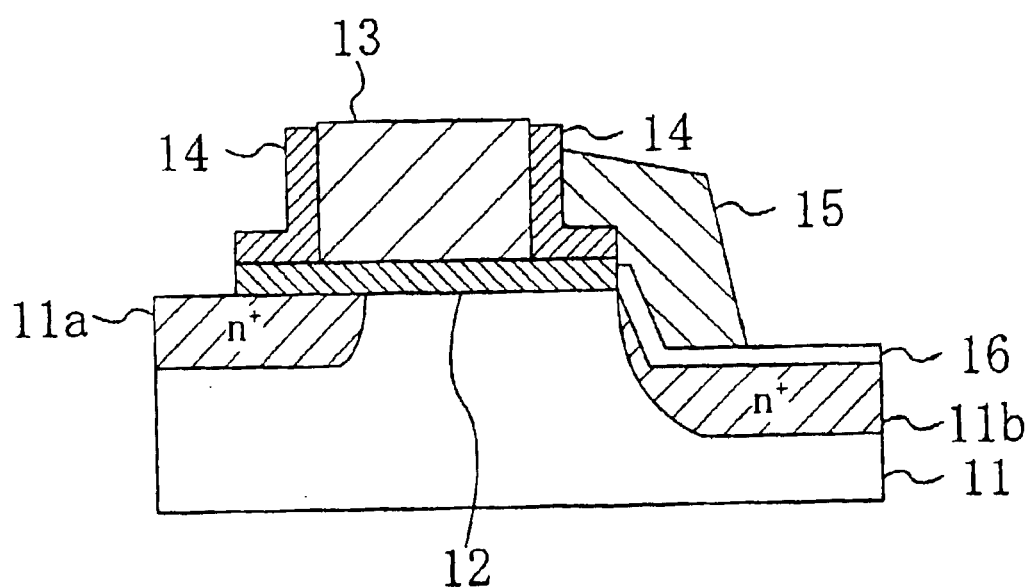
FIG. 48 is a structural cross-sectional view of a memory element in a nonvolatile semiconductor memory device according to an eleventh embodiment of the present invention.

FIG. 48 shows a cross-sectional structure of a memory element in the nonvolatile semiconductor memory device according to the eleventh embodiment. In FIG. 48, the description of the same components as shown in FIG. 1 is omitted by retaining the same reference numerals.

The eleventh embodiment features a protective insulating film 14 which is a three-layer structure formed on each of the side surfaces of the control gate electrode 13 and composed of a silicon dioxide film, a silicon nitride film, and a silicon dioxide film formed in this order on the control gate electrode 13 and a tunnel insulating film 16 which is formed by the internal-combustion pyrogenic oxidation.

The description will be given next to a method for fabricating the memory element in the nonvolatile semiconductor memory device according to the eleventh embodiment with reference to FIGS. 49A to 49H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIGS. 49A to 49H, the same components as used in the first embodiment are designated at the same reference numerals.

Figure 49A:
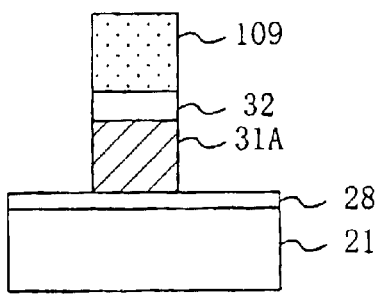
FIGS. 49A to 49H are structural cross-sectional views illustrating the individual process steps of a method for fabricating the memory element in the nonvolatile semiconductor memory device according to the eleventh embodiment.

First, as shown in FIG. 49A, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 49B:
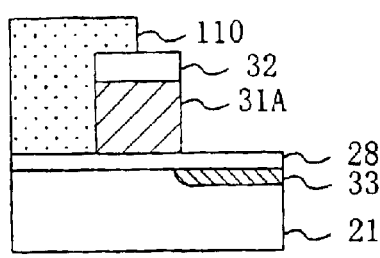

Next, as shown in FIG. 49B, the mask pattern 109 is removed and the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 kev to 15 kev, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 49C:
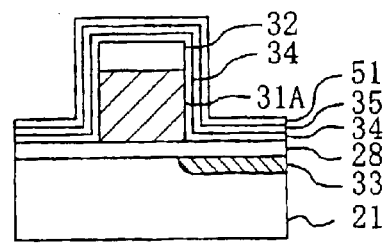

Next, as shown in FIG. 49C, the mask pattern 110 is removed and then the second silicon dioxide film 34, the third silicon nitride film 35, and a fourth silicon dioxide film 51 each having a thickness of about 5 nm to 15 nm are deposited successively by CVD over the entire surface of the semiconductor substrate 21 including the second silicon nitride film 32 and the control gate electrode 31A.

Figure 49D:
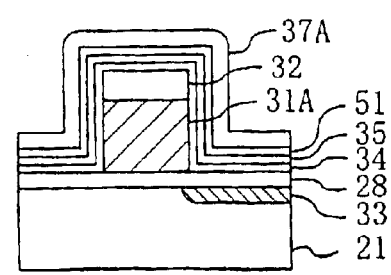

Then, as shown in FIG. 49D, the BPSG film 37A with a thickness of about 40 nm to 100 nm is deposited by CVD over the entire surface of the fourth silicon dioxide film 51.

Figure 49E:
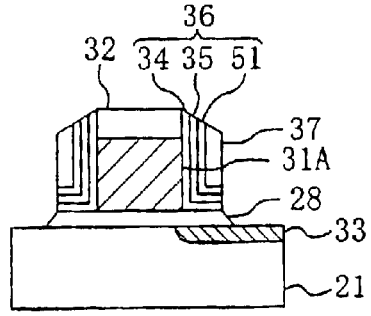

Then, as shown in FIG. 49E, anisotropic etching is performed to etch back the deposited BPSG film 37A and further remove the fourth silicon dioxide film 51, the third silicon nitride film 35, the second silicon dioxide film 34, and the second thermal oxide film 28, thereby exposing the semiconductor substrate 21 and forming the sidewalls 37 on each of the side surfaces of the control gate electrode 31A via the protective insulating film 36 composed of the second silicon dioxide film 43, the third silicon nitride film 35, and the fourth silicon dioxide film 51.

Figure 49F:
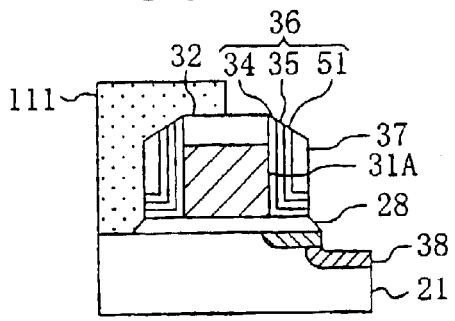

Subsequently, as shown in FIG. 49F, the mask pattern 111 having an opening over the drain region is formed on the semiconductor substrate 21. By using the formed mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 keV by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As) ions at a relatively low dose of about $5 \times 10^{12}$ cm$^{-2}$ to $1 \times 10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having an impurity concentration of about $5 \times 10^{16}$ cm$^{-3}$ to $1 \times 10^{19}$ cm$^{-3}$ and a junction depth of about 40 nm is formed.

Figure 49G:
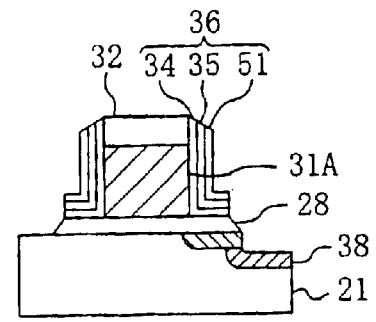
Figure 49H:
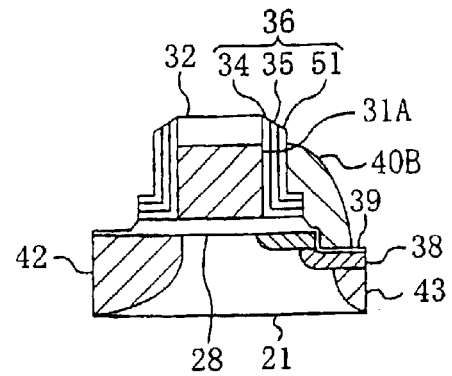

Next, as shown in FIG. 49G, the mask pattern 111 is removed and the sidewalls 37 are further removed by using vapor-phase hydrofluoric acid. Then, as shown in FIG. 49H, hydrogen gas and oxygen gas are introduced into the chamber of the thermal oxidation system in which the temperature is set to about 900° C. to 1100° C. and the pressure is set to about 1000 Pa to 2000 Pa. By thermally oxidizing the semiconductor substrate 21 with water vapor generated thereover, the tunnel insulating film 39 with a thickness of about 6 nm to 15 nm is formed on the exposed surface of the recessed portion 21b of the semiconductor substrate 21. Since the exposed surface of the protective insulating film 36 is covered with the fourth silicon dioxide film 51, the oxidation of the third silicon nitride film 35 of the protective insulating film 36 by the internal-combustion thermal oxidation is prevented and the structure of the ONO film composed of the silicon nitride film of the protective insulating film 36 interposed between the silicon dioxide films is not damaged.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form a sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5 \times 10^{13}$ cm$^{-2}$ to $1 \times 10^{14}$ cm$^{-2}$ are implanted into the semiconductor substrate 21 with an implant energy of about 50 keV. As a result, the source region 42 and the drain region 43 in each of which the near-surface impurity concentration of arsenic is about $5 \times 10^{19}$ cm$^{-3}$ to $1 \times 10^{21}$ cm$^{-3}$ are formed.

Although the stepped portion covered up with the floating gate electrode 40B is provided under the floating gate electrode 40B in the semiconductor substrate 21 in the eleventh embodiment such that hot electrons are implanted with high efficiency into the floating gate electrode 40B, the stepped portion may not be provided.

Thus, according to the eleventh embodiment, each of the side surfaces of the control gate electrode 31A is covered with the protective insulating film 36, which prevents the control gate electrode 31A from being damaged by etching during the formation of the floating gate electrode 40B. In addition, the side surface of the control gate electrode 31A closer to the floating gate electrode 40B is not oxidized in the step for forming the tunnel insulating film 39.

Since the sidewalls 37 composed of BPSG on the control gate electrode 31A have bottom surfaces which are on the protective insulating film 36 and are not in direct contact with the semiconductor substrate 21, as shown in FIG. 49E, the surface of the semiconductor substrate 21 is not damaged when the sidewalls 37 are removed in the subsequent step. This stabilizes the operation of the memory elements.

In the eleventh embodiment also, each of the elements in the peripheral circuit formation region is formed subsequently to the step of forming the memory elements so that the control gate electrode 31A and the floating gate electrode 40B suffer no etching damage.

Since the tunnel insulating film 39 is formed by the internal-combustion thermal oxidation, accelerated oxidation of the lightly doped n-type impurity diffusion region 38 is suppressed so that the tunnel insulating film 39 has a nearly uniform thickness. Moreover, the quality of the tunnel insulating film 39 formed by the internal-combustion thermal oxidation is equal or superior to the quality of a tunnel insulating film formed in a normal oxygen atmosphere.

Furthermore, the occurrence of a bird's beak in the second thermal oxide film 28 as the gate oxide film and the occurrence of a bird's beak in the lower portion of the side surface of the control gate electrode 31A are suppressed.

The provision of the fourth silicon dioxide film 51 in the outer portion of the protective insulating film 36 not only prevents the oxidation of the third silicon nitride film 35 but also improves the controllability of the thickness of the third silicon nitride film 35. Since the protective insulating film 36 has the three-layer structure, the release of electrons accumulated in the floating gate electrode 15 is suppressed and the reliability of the memory element is improved.

Figure 50:
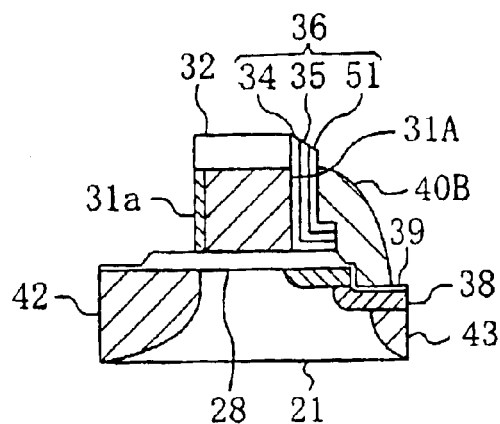
FIG. 50 is a structural cross-sectional view of another example of the memory element in the nonvolatile semiconductor memory device according to the eleventh embodiment.

Although the eleventh embodiment has provided the protective insulating film 36 on each of the side surfaces of the control gate electrode 31A, the protective insulating film 36 located on the side of the control gate electrode 31A opposite to the floating gate electrode 40B need not be provided, as shown in FIG. 50A. In that case, a silicon dioxide film 31a is formed on the side portion of the control gate electrode 31A opposite to the floating gate electrode 40B during the formation of the tunnel insulating film 39 by the internal-combustion thermal oxidation.

Figure 51:
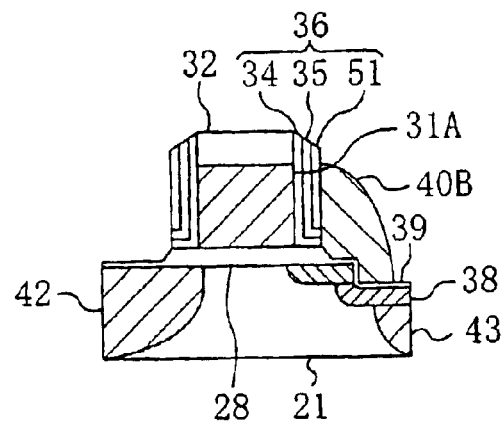
FIG. 51 is a structural cross-sectional view of another example of the memory element in the nonvolatile semiconductor memory device according to the eleventh embodiment.

It is also possible to remove, from the structure shown in FIG. 49G, the sidewalls 37 and further remove the respective portions of the protective insulating film 36 and the second insulating film 28 serving as the gate oxide film which are covered with the bottom surfaces of the sidewalls 37 by anisotropic etching to provide the structure shown in FIG. 51.

Figure 52:
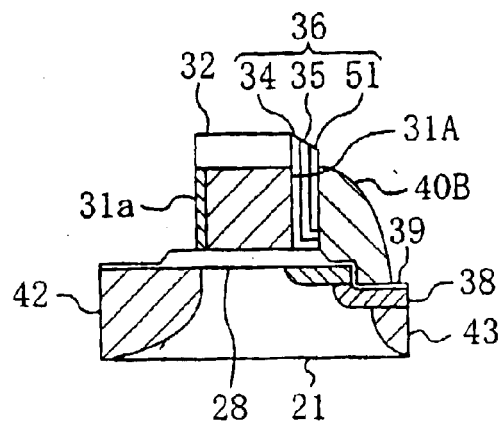
FIG. 52 is a structural cross-sectional view of another example of the memory element in the nonvolatile semiconductor memory device according to the eleventh embodiment.

As shown in FIG. 52, it is also possible to remove the protective insulating film 36 located on that one of the side surfaces of the control gate electrode 31A opposite to the floating gate electrode 40B.

In the structure shown in FIGS. 51 and 52, the respective portions of the protective insulating film 36 and the second insulating film 28 which are covered with the bottom surfaces of the sidewalls 37 no more exist. This suppresses the trapping of electrons or holes in the protective insulating film 36 and the second insulating film 28 during a write or erase operation. As a result, the degradation of the operating characteristics of the memory element due to repeated write and erase operations performed with respect to the memory element can be suppressed.

It is also possible to remove, of the protective insulating film 36 provided on each of the side surfaces of the control gate electrode 31A, only the protruding portion which is located on the side opposite to the floating gate electrode 40B. Conversely, it is also possible to remove only the protruding portion of the protective insulating film 36 which is located on the side opposed to the floating gate electrode 40B.

Embodiment 12

A nonvolatile semiconductor memory device according to a twelfth embodiment of the present invention and a method for fabricating the same will be described with reference to the drawings.

Figure 53:
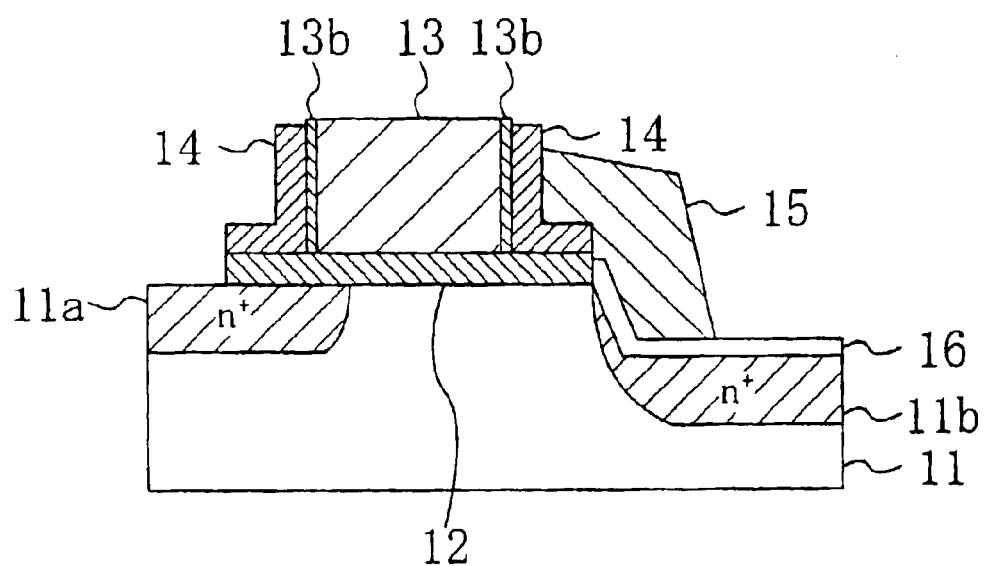
FIG. 53 is a structural cross-sectional view of a memory element in a nonvolatile semiconductor memory device according to a twelfth embodiment of the present invention.

FIG. 53 shows a cross-sectional structure of a memory element in the nonvolatile semiconductor memory device according to the twelfth embodiment. In FIG. 53, the description of the same components as shown in FIG. 1 is omitted by retaining the same reference numerals.

The twelfth embodiment features a protective insulating film 14 which is a multilayer structure composed of a silicon nitride film and a silicon dioxide film and formed in this order on each of the side surfaces of the control gate electrode 13.

The twelfth embodiment also features a tunnel insulating film 16 which is formed by the internal-combustion pyrogenic oxidation and a silicon dioxide film 13b which is formed on each of the side portions of the control gate electrode 13 by the internal-combustion pyrogenic oxidation.

The description will be given next to a method for fabricating the memory element in the nonvolatile semiconductor memory device according to the twelfth embodiment with reference to FIGS. 54A to 54H. As for the steps of (1) Formation of Isolation Regions, (2) Formation of Well Regions, (3) Formation of Gate Oxide Films, and (5) Formation of Elements in Peripheral Circuit Formation Region, they are the same as in the first embodiment. In FIG. 54, the same components as used in the first embodiment are designated at the same reference numerals.

Figure 54A:
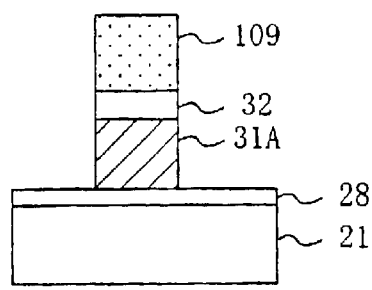
FIGS. 54A to 54H are structural cross-sectional views illustrating the individual process steps of a method for fabricating the memory element in the nonvolatile semiconductor memory device according to the twelfth embodiment.

First, as shown in FIG. 54A, dry etching is performed with respect to the second silicon nitride film 32 and to the polysilicon film 31 by using the mask pattern 109 as a pattern for forming the control gate electrode of the memory element formed on the second silicon nitride film 32, whereby the control gate electrode 31A composed of an n-type polysilicon film and having the upper surface covered with the second silicon dioxide film 32 is formed.

Figure 54E:
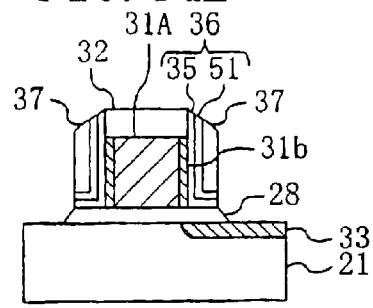
Figure 54B:
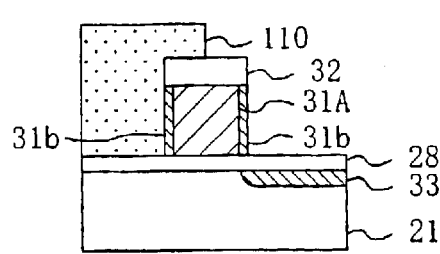

Next, as shown in FIG. 54B, the mask pattern 109 is removed and then hydrogen gas and oxygen gas are introduced into the chamber of the thermal oxidation system in which the temperature is set to about 900° C. to 1100° C. and the pressure is set to about 1000 Pa to 2000 Pa. By thermally oxidizing the control gate electrode 31A with water vapor generated over the semiconductor substrate 21, the silicon dioxide film 31b with a thickness of about 5 nm to 15 nm is formed on each of the side portions of the control gate electrode 31A. Subsequently, the mask pattern 110 having an opening over the drain formation region is formed on the semiconductor substrate 21. By using the formed mask pattern 110, boron (B) ions at a dose of about $5 \times 10^{12}$ cm$^{-2}$ to $1 \times 10^{14}$ cm$^{-2}$ are implanted into the semiconductor substrate 21 with an implant energy of about 5 keV to 15 kev, whereby the first lightly doped p-type impurity diffusion region 33 having a near-surface impurity concentration of about $5 \times 10^{16}$ cm$^{-3}$ to $1 \times 10^{19}$ cm$^{-3}$ and a shallow junction is formed. It is also possible to preliminarily remove the portion of the second thermal oxide film 28 located above the first lightly doped p-type impurity diffusion region 33 by wet etching using hydrofluoric acid and implant the boron (B) ions under the implant conditions described above.

Figure 54F:
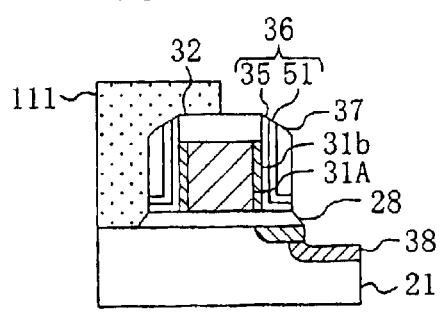
Figure 54C:
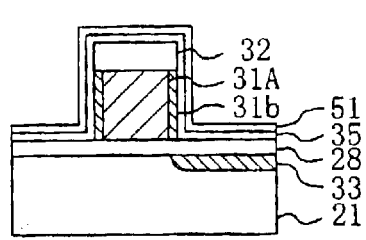

Next, as shown in FIG. 54C, the mask pattern 110 is removed and then the third silicon nitride film 35 and the fourth silicon dioxide film 51 each having a thickness of about 5 nm to 15 nm are deposited successively by CVD over the entire surface of the semiconductor substrate 21 including the second silicon nitride film 32 and the control gate electrode 31A.

Figure 54G:
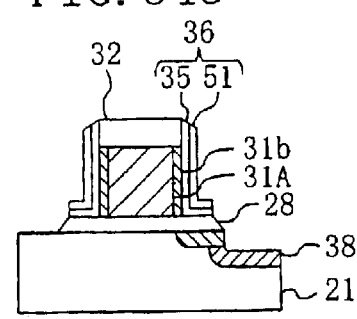
Figure 54D:
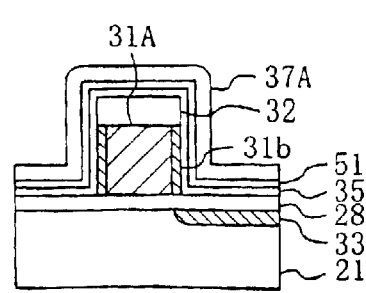

Then, as shown in FIG. 54D, the BPSG film 37A with a thickness of about 40 nm to 100 nm is deposited by CVD over the entire surface of the fourth silicon dioxide film 51.

Then, as shown in FIG. 54E, anisotropic etching is performed to etch back the deposited BPSG film 37A and further remove the fourth silicon dioxide film 51, the third silicon nitride film 35, and the second thermal oxide film 28, thereby exposing the semiconductor substrate 21 and forming the sidewalls 37 on the side surfaces of the control gate electrode 31A via the protective insulating film 36 composed of the third silicon nitride film 35 and the fourth silicon dioxide film 51.

Next, as shown in FIG. 54F, the mask pattern 111 having an opening over the drain region is formed. By using the formed mask pattern 111, the control gate electrode 31A, and the sidewalls 37, dry etching is performed with respect to the upper portion of the semiconductor substrate 21 by reactive-ion etching (RIE), thereby forming the recessed portion 21b at a depth of about 25 nm to 75 nm. The etching may also be performed by CDE instead of RIE.

Next, boron (B) ions at a relatively low dose of about $5 \times 10^{12}$ cm$^{-2}$ to $1 \times 10^{14}$ cm$^{-2}$ are implanted into the semiconductor substrate 21 with an implant energy of about 10 keV to 30 kev by using the mask pattern 111, whereby the second lightly doped p-type impurity diffusion region (not shown) having a near-surface impurity concentration of about $5 \times 10^{16}$ cm$^{-3}$ to $1 \times 10^{19}$ cm$^{-3}$ and a junction slightly deeper than that of the first lightly doped p-type impurity diffusion region 33 is formed. Subsequently, arsenic (As)

ions at a relatively low dose of about $5\times10^{12}$ cm$^{-2}$ to $1\times10^{14}$ cm$^{-2}$ are implanted into the semiconductor substrate 21 with an implant energy of about 20 keV to 50 keV by using the mask pattern 111, whereby the shallow lightly doped n-type impurity diffusion region 38 having an impurity concentration of about $5\times10^{16}$ cm$^{-3}$ to $1\times10^{19}$ cm$^{-3}$ and a junction depth of about 40 nm is formed.

Figure 54H:
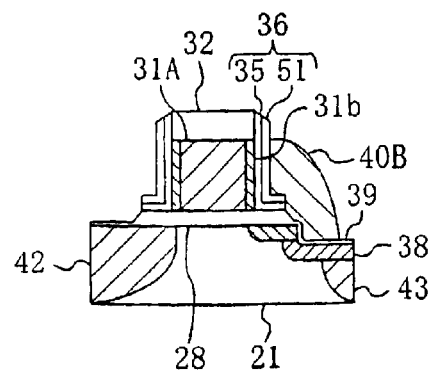

Next, as shown in FIG. 54G, the mask pattern 111 is removed and the sidewalls 37 are further removed by using vapor-phase hydrofluoric acid. Then, as shown in FIG. 54H, hydrogen gas and oxygen gas are introduced into the chamber of the thermal oxidation system in which the temperature is set to about 900° C. to 1100° C. and the pressure is set to about 1000 Pa to 2000 Pa. By thermally oxidizing the semiconductor substrate 21 with water vapor generated thereover, the tunnel insulating film 39 with a thickness of about 6 nm to 15 nm is formed on the exposed surface of the recessed portion 21b of the semiconductor substrate 21. Since the exposed surface of the protective insulating film 36 is covered with the fourth silicon dioxide film 51, the oxidation of the third silicon nitride film 35 of the protective insulating film 36 by the internal-combustion thermal oxidation is prevented and the structure of the ONO film composed of the silicon dioxide film 31b on each of the side portions of the control gate electrode 31A, the third silicon nitride film 35 of the protective insulating film 36, and the fourth silicon dioxide film 51 of the protective insulating film 36 is not damaged.

Next, the polysilicon (DP) film doped with phosphorus (P) and having a thickness of about 120 nm to 200 nm is formed by CVD over the entire surface of the semiconductor substrate 21 including the gate electrode 31A and the protective insulating film 36. Subsequently, the DP film is etched back by anisotropic dry etching using the mask pattern having an opening over the drain region to form a sidewall-like DP film on the side surface of the control gate electrode 31A. Specifically, etching is halted at the time at which the tunnel insulating film 39 is exposed such that the sidewall-like DP film 40A having a height corresponding to about 80% of the height of the control gate electrode 31A, which is about 160 nm in this case, is formed on that one of the side surfaces of the control gate electrode 31A closer to the drain region to cover up the stepped portion of the recessed portion 21b in the semiconductor substrate 21. Then, by dry etching using the mask pattern for masking the sidewall-like DP film, the floating gate electrodes 40B are formed by self alignment from the sidewall-like DP film such that they are separate from each other to correspond to the individual memory elements. Each of the floating gate electrodes 40B is capacitively coupled to the side surface of the control gate electrode 31A closer to the drain region with the protective insulating film 36 interposed therebetween and opposed to the recessed portion 21b in the semiconductor substrate 21 with the tunnel insulating film 39 interposed therebetween.

Next, by using the control gate electrode 31A and the floating gate electrode 40B as a mask, arsenic (As) ions at a relatively high dose of about $5\times10^{13}$ cm$^{-2}$ to $1\times10^{14}$ cm$^{-2}$ are implanted into the semiconductor substrate 21 with an implant energy of about 50 kev. As a result, the source region 42 and the drain region 43 in each of which the near-surface impurity concentration of arsenic is about $5\times10^{19}$ cm$^{-3}$ to $1\times10^{21}$ cm$^{-3}$ are formed.

Although the stepped portion covered up with the floating gate electrode 40B is provided under the floating gate electrode 40B in the semiconductor substrate 21 in the twelfth embodiment such that hot electrons are implanted with high efficiency into the floating gate electrode 40B, the stepped portion may not be provided.

Thus, according to the twelfth embodiment, each of the side surfaces of the control gate electrode 31A is covered with the protective insulating film 36, which prevents the control gate electrode 31A from being damaged by etching during the formation of the floating gate electrode 40B. In addition, the side surface of the control gate electrode 31A closer to the floating gate electrode 40B is not oxidized during the formation of the tunnel insulating film 39.

Since the sidewalls 37 composed of BPSG on the control gate electrode 31A have bottom surfaces which are on the protective insulating film 36 and are not in direct contact with the semiconductor substrate 21, as shown in FIG. 54E, the surface of the semiconductor substrate 21 is not damaged when the sidewalls 37 are removed in the subsequent step. This stabilizes the operation of the memory elements.

In the twelfth embodiment also, each of the elements in the peripheral circuit formation region is formed subsequently to the step of forming the memory elements so that the control gate electrode 31A and the floating gate electrode 40B suffer no etching damage.

Since the tunnel insulating film 39 is formed by the internal-combustion thermal oxidation, accelerated oxidation of the lightly doped n-type impurity diffusion region 38 is suppressed so that the tunnel insulating film 39 has a nearly uniform thickness. Moreover, the quality of the tunnel insulating film 39 formed by the internal-combustion thermal oxidation is equal or superior to the quality of a tunnel insulating film formed in a normal oxygen atmosphere.

Furthermore, the occurrence of a bird's beak in the second thermal oxide film 28 as the gate oxide film and the occurrence of a bird's beak in the lower portion of the side surface of the control gate electrode 31A are suppressed.

The provision of the fourth silicon dioxide film 51 in the outer portion of the protective insulating film 36 not only prevents the oxidation of the third silicon nitride film 35 but also improves the controllability of the thickness of the third silicon nitride film 35. Since the three-layer structure including the protective insulating film 36 and the silicon dioxide film 31b of the control gate electrode 31A is provided, the release of electrons accumulated in the floating gate electrode 15 is suppressed and the reliability of the memory element is improved.

Figure 55:
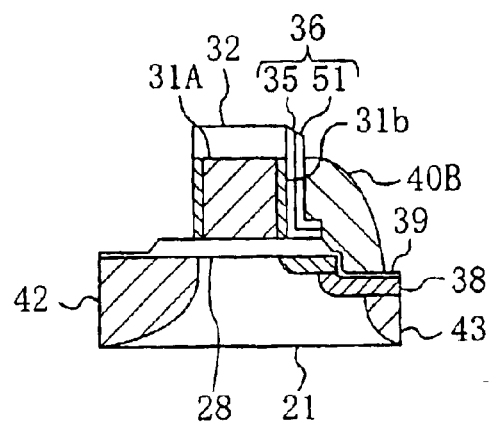
FIG. 55 is a structural cross-sectional view of another example of the memory element in the nonvolatile semiconductor memory device according to the twelfth embodiment.

Although the twelfth embodiment has provided the protective insulating film 36 on each of the side surfaces of the control gate electrode 31A, the protective insulating film 36 located on the side of the control gate electrode 31A opposite to the floating gate electrode 40B need not be provided, as shown in FIG. 55A. In that case, the silicon dioxide film 31a is formed on the side portion of the control gate electrode 31A opposite to the floating gate electrode 40B during the formation of the tunnel insulating film 39 by the internal-combustion thermal oxidation.

Figure 56:
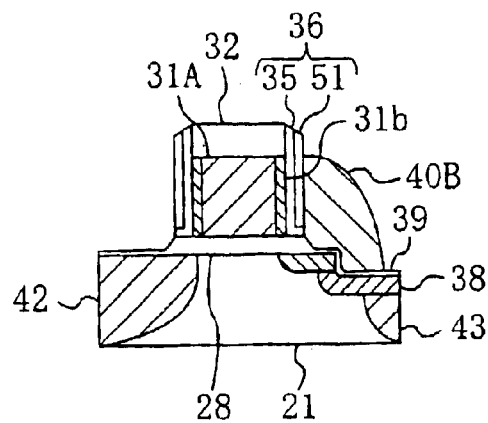
FIG. 56 is a structural cross-sectional view of another example of the memory element in the nonvolatile semiconductor memory device according to the twelfth embodiment.

It is also possible to remove, from the structure shown in FIG. 54G, the sidewalls 37 and further remove the respective portions of the protective insulating film 36 and the second insulating film 28 serving as the gate oxide film which are covered with the bottom surfaces of the sidewalls 37 by anisotropic etching to provide the structure shown in FIG. 56.

Figure 57:
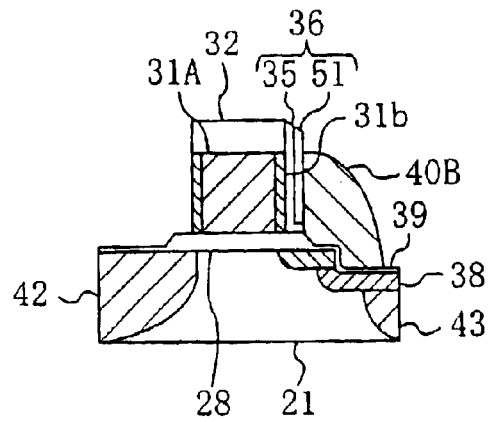
FIG. 57 is a structural cross-sectional view of another example of the memory element in the nonvolatile semiconductor memory device according to the twelfth embodiment.
Figure 58A:
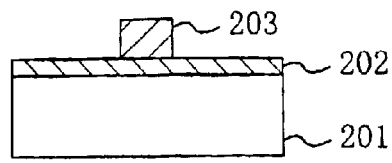
FIGS. 58A to 58H are structural cross-sectional views illustrating the individual process steps of a method for fabricating a memory element in a, conventional split-gate FEEPROM device.
Figure 58E:
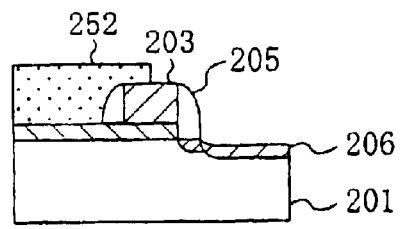
Figure 58B:
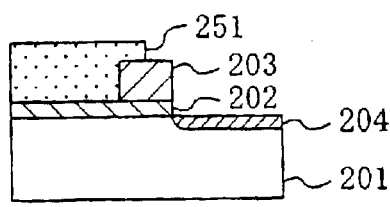
Figure 58F:
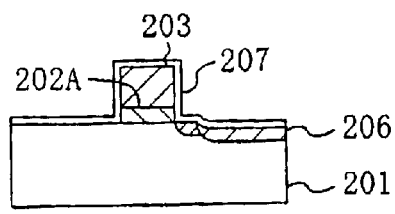
Figure 58C:
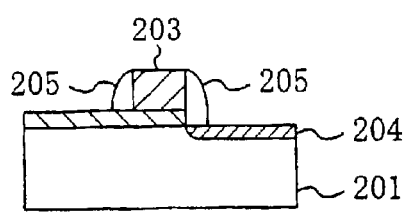
Figure 58G:
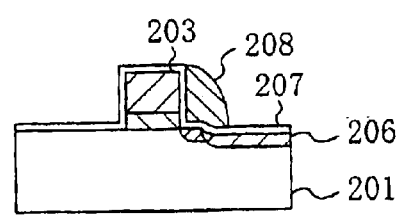
Figure 58D:
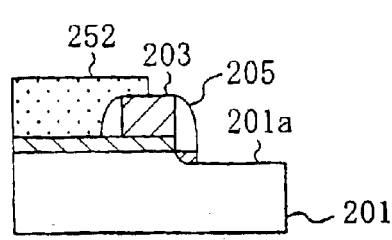
Figure 58H:
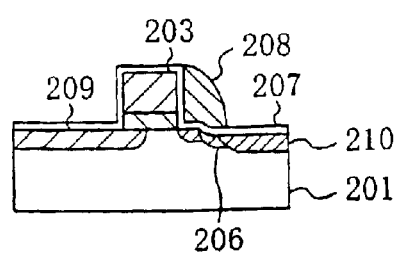

As shown in FIG. 57, it is also possible to remove the protective insulating film 36 located on that one of the side surfaces of the control gate electrode 31A opposite to the floating gate electrode 40B.

In the structure shown in FIGS. 56 and 57, the respective portions of the protective insulating film 36 and the second insulating film 28 which are covered with the bottom surfaces of the sidewalls 37 no more exist. This suppresses the trapping of electrons or holes in the protective insulating film 36 and the second insulating film 28 during a write or erase operation. As a result, the degradation of the operating characteristics of the memory element due to repeated write and erase operations performed with respect to the memory element can be suppressed.

It is also possible to remove, of the protective insulating film 36 provided on each of the side surfaces of the control gate electrode 31A, only the protruding portion which is located on the side opposite to the floating gate electrode 40B. Conversely, it is also possible to remove only the protruding portion of the protective insulating film 36 which is located on the side opposed to the floating gate electrode 40B.

What is claimed is:

1. A method for fabricating a nonvolatile semiconductor memory device, the method comprising:

a control-gate-electrode forming step of forming a first insulating film on a semiconductor substrate, patterning a conductor film formed on the first insulating film, and thereby forming a control gate electrode from the conductor film;

a second-insulating-film depositing step of depositing a second insulating film over the entire surface of the semiconductor substrate including the control gate electrode;

a protective-insulating-film forming step of selectively removing the second insulating film so as to leave a portion of the second insulating film located on each of side surfaces of the control gate electrode and thereby forming, from the second insulating film, a protective insulating film for protecting the control gate electrode;

a gate-insulating-film forming step of selectively removing the first insulating film so as to leave a portion of the first insulating film underlying the control gate electrode and thereby forming a gate insulating film from the first insulating film;

a tunnel-insulating-film forming step of forming, on the semiconductor substrate, a third insulating film serving as a tunnel insulating film;

a floating-gate-electrode forming step of forming by self alignment a floating gate electrode capacitively coupled to one of side surfaces of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

2. The method of claim 1, wherein the tunnel-insulating-film forming step includes the step of forming the third insulating film also on the protective insulating film.

3. The method of claim 1, further comprising, between the control-gate-electrode forming step and the second-insulating-film depositing step, the step of:

introducing hydrogen and oxygen into a space over the heated semiconductor substrate, generating water vapor from the introduced hydrogen and oxygen over the semiconductor substrate, and thereby forming an insulating film on each of side portions of the control gate electrode.

4. The method of claim 3, wherein the protective-insulating-film forming step includes forming the protective insulating film by stacking a plurality of insulating films having different compositions.

5. The method of claim 1, wherein the tunnel-insulating-film forming step includes the step of introducing hydrogen and oxygen into a space over the heated semiconductor substrate, generating water vapor from the introduced hydrogen and oxygen over the semiconductor substrate, and thereby forming the tunnel insulating film, while forming an insulating film having a composition different from a composition of the protective insulating film on a surface of the protective insulating film.

6. The method of claim 1, wherein the second insulating film is a multilayer structure composed of a plurality of stacked insulating films having different compositions.

7. The method of claim 1, wherein the semiconductor substrate has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of:

forming the field-effect transistor in the peripheral circuit formation region after forming the source region and the drain region in the memory circuit formation region.

8. The method of claim 7, wherein the step of forming the control gate electrode in the memory circuit formation region includes the step of forming also a conductor film for forming a gate electrode of the field-effect transistor simultaneously with the formation of the conductor film on the first insulating film.

9. The method of claim 7, wherein the step of forming the control gate electrode in the memory circuit formation region includes the step of patterning also a conductor film for forming a gate electrode of the field-effect transistor simultaneously with the patterning of the conductor film.

10. A method for fabricating a nonvolatile semiconductor memory device, the method comprising:

a control-gate-electrode forming step of forming a first insulating film on a semiconductor substrate, patterning a conductor film formed on the first insulating film, and thereby forming a control gate electrode from the conductor film;

a second-insulating-film depositing step of depositing a second insulating film over the entire surface of the semiconductor substrate including the control gate electrode;

a sidewall forming step of forming sidewalls over the first insulating film and on portions of the second insulating film located on side surfaces of the control gate electrode;

a protective-insulating-film forming step of performing etching with respect to the first and second insulating films by using the sidewalls and the control gate electrode as a mask and thereby forming, from the second insulating film, a protective insulating film for protecting the control gate electrode on each of the side surfaces of the control gate electrode, while forming, from the first insulating film, a gate insulating film under the control gate electrode;

a tunnel-insulating-film forming step of removing the sidewalls and then forming, in a region in which the semiconductor substrate is exposed, a third insulating film serving as a tunnel insulating film;

a floating-gate-electrode forming step of forming by self alignment a floating gate electrode capacitively coupled to one of the side surfaces of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

11. The method of claim 10, wherein the tunnel-insulating-film forming step includes removing the sidewalls and then selectively removing respective portions of the protective insulating film covered with bottom surfaces of the sidewalls.

12. The method of claim 11, wherein the tunnel-insulating-film forming step includes the step of selectively removing the respective portions of the protective insulating film covered with the bottom surfaces of the sidewalls and then selectively removing respective portions of the gate insulating film covered with the bottom surfaces of the sidewalls.

13. The method of claim 10, further comprising, between the protective-insulating-film forming step and the tunnel-insulating-film forming step, the step of:

performing etching with respect to the semiconductor substrate by using the sidewalls as a mask and thereby forming a stepped portion to be covered up with the floating gate electrode in a region of the semiconductor substrate to be formed with the floating gate electrode.

14. The method of claim 10, wherein the tunnel-insulating-film forming step includes the step of forming the third insulating film also on the protective insulating film.

15. The method of claim 10, further comprising, between the control-gate-electrode forming step and the second-insulating-film depositing step, the step of:

introducing hydrogen and oxygen into a space over the heated semiconductor substrate, generating water vapor from the introduced hydrogen and oxygen over the semiconductor substrate, and thereby forming an insulating film on each of side portions of the control gate electrode.

16. The method of claim 15, wherein the protective-insulating-film forming step includes forming the protective insulating film by stacking a plurality of insulating films having different compositions.

17. The method of claim 10, wherein the tunnel-insulating-film forming step includes the step of introducing hydrogen and oxygen into a space over the heated semiconductor substrate, generating water vapor from the introduced hydrogen and oxygen over the semiconductor substrate, and thereby forming the tunnel insulating film, while forming an insulating film having a composition different from a composition of the protective insulating film on a surface of the protective insulating film.

18. The method of claim 10, wherein the second insulating film is a multilayer structure composed of a plurality of stacked insulating films having different compositions.

19. The method of claim 10, wherein the semiconductor substrate has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of:

forming the field-effect transistor in the peripheral circuit formation region after forming the source region and the drain region in the memory circuit formation region.

20. The method of claim 19, wherein the step of forming the control gate electrode in the memory circuit formation region includes the step of forming also a conductor film for forming a gate electrode of the field-effect transistor simultaneously with the formation of the conductor film on the first insulating film.

21. The method of claim 19, wherein the step of forming the control gate electrode in the memory circuit formation region includes the step of patterning also a conductor film for forming a gate electrode of the field-effect transistor simultaneously with the patterning of the conductor film.

22. A method for fabricating a nonvolatile semiconductor memory device, the method comprising:

a control-gate-electrode forming step of forming a first insulating film on a semiconductor substrate, patterning a conductor film formed on the first insulating film, and thereby forming a control gate electrode from the conductor film;

a second-insulating-film depositing step of depositing a second insulating film over the entire surface of the semiconductor substrate including the control gate electrode;

a protective-insulating-film forming step of selectively removing the second insulating film so as to leave a portion of the second insulating film located on one of side surfaces of the control gate electrode and thereby forming, from the second insulating film, a protective insulating film for protecting the one of the side surfaces of the control gate electrode;

a gate-insulating-film forming step of selectively removing the first insulating film so as to leave a portion of the first insulating film underlying the control gate electrode and thereby forming a gate insulating film from the first insulating film;

a tunnel-insulating-film forming step of forming, on the semiconductor substrate, a third insulating film serving as a tunnel insulating film;

a floating-gate-electrode forming step of forming by self alignment a floating gate electrode capacitively coupled to the side surface of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

23. The method of claim 22, wherein the tunnel-insulating-film forming step includes the step of forming the third insulating film also on the protective insulating film.

24. The method of claim 22, further comprising, between the control-gate-electrode forming step and the second-insulating-film depositing step, the step of:

introducing hydrogen and oxygen into a space over the heated semiconductor substrate, generating water vapor from the introduced hydrogen and oxygen over the semiconductor substrate, and thereby forming an insulating film on each of side portions of the control gate electrode.

25. The method of claim 24, wherein the protective-insulating-film forming step includes forming the protective insulating film by stacking a plurality of insulating films having different compositions.

26. The method of claim 22, wherein the tunnel-insulating-film forming step includes the step of introducing hydrogen and oxygen into a space over the heated semiconductor substrate, generating water vapor from the introduced hydrogen and oxygen over the semiconductor substrate, and thereby forming the tunnel insulating film, while forming an insulating film having a composition different from a composition of the protective insulating film on a surface of the protective insulating film.

27. The method of claim 22, wherein the second insulating film is a multilayer structure composed of a plurality of stacked insulating films having different compositions.

28. The method of claim 22, wherein the semiconductor substrate has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of:

forming the field-effect transistor in the peripheral circuit formation region after forming the source region and the drain region in the memory circuit formation region.

29. The method of claim 28, wherein the step of forming the control gate electrode in the memory circuit formation region includes the step of forming also a conductor film for forming a gate electrode of the field-effect transistor simultaneously with the formation of the conductor film on the first insulating film.

30. The method of claim 28, wherein the step of forming the control gate electrode in the memory circuit formation region includes the step of patterning also a conductor film for forming a gate electrode of the field-effect transistor simultaneously with the patterning of the conductor film.

31. A method for fabricating a nonvolatile semiconductor memory device, the method comprising:

a control-gate-electrode forming step of forming a first insulating film on a semiconductor substrate, patterning a conductor film formed on the first insulating film, and thereby forming a control gate electrode from the conductor film;

a second-insulating-film depositing step of depositing a second insulating film over the entire surface of the semiconductor substrate including the control gate electrode;

a sidewall forming step of forming sidewalls over the first insulating film and on portions of the second insulating film located on side surfaces of the control gate electrode;

a protective-insulating-film forming step of performing etching with respect to the first and second insulating films by using the sidewalls and the control gate electrode as a mask and thereby forming, from the second insulating film, a protective insulating film for protecting the control gate electrode on each of the side surfaces of the control gate electrode, while forming, from the first insulating film, a gate insulating film under the control gate electrode;

a protective-insulating-film removing step of removing the sidewalls and then selectively removing the protective insulating film so as to leave a portion of the protective insulating film located on one of the side surfaces of the control gate electrode;

a tunnel-insulating-film forming step of forming, in a region in which the semiconductor substrate is exposed, a third insulating film serving as a tunnel insulating film;

a floating-gate-electrode forming step of forming by self alignment a floating gate electrode capacitively coupled to the side surface of the control gate electrode with the protective insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

32. The method of claim 31, wherein the protective-insulating-film removing step includes the step of removing the sidewalls and then selectively removing respective portions of the protective insulating film covered with bottom surfaces of the sidewalls.

33. The method of claim 32, wherein the protective-insulating-film removing step includes the step of selectively removing the respective portions of the protective insulating film covered with the bottom surfaces of the sidewalls and then selectively removing respective portions of the gate insulating film covered with the bottom surfaces of the sidewalls.

34. The method of claim 31, further comprising, between the protective-insulating-film forming step and the protective-insulating-film removing step, the step of:

performing etching with respect to the semiconductor substrate by using the sidewalls as a mask and thereby forming a stepped portion to be covered up with the floating gate electrode in a region of the semiconductor substrate to be formed with the floating gate electrode.

35. The method of claim 31, wherein the tunnel-insulating-film forming step includes the step of forming the third insulating film also on the protective insulating film.

36. The method of claim 31, further comprising, between the control-gate-electrode forming step and the second-insulating-film depositing step, the step of:

introducing hydrogen and oxygen into a space over the heated semiconductor substrate, generating water vapor from the introduced hydrogen and oxygen over the semiconductor substrate, and thereby forming an insulating film on each of side portions of the control gate electrode.

37. The method of claim 36, wherein the protective-insulating-film forming step includes forming the protective insulating film by stacking a plurality of insulating films having different compositions.

38. The method of claim 31, wherein the tunnel-insulating-film forming step includes the step of introducing hydrogen and oxygen into a space over the heated semiconductor substrate, generating water vapor from the introduced hydrogen and oxygen over the semiconductor substrate, and thereby forming the tunnel insulating film, while forming an insulating film having a composition different from a composition of the protective insulating film on a surface of the protective insulating film.

39. The method of claim 31, wherein the second insulating film is a multilayer structure composed of a plurality of stacked insulating films having different compositions.

40. The method of claim 31, wherein the semiconductor substrate has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of:

forming the field-effect transistor in the peripheral circuit formation region after forming the source region and the drain region in the memory circuit formation region.

41. The method of claim 40, wherein the step of forming the control gate electrode in the memory circuit formation region includes the step of forming also a conductor film for forming a gate electrode of the field-effect transistor simultaneously with the formation of the conductor film on the first insulating film.

42. The method of claim 40, wherein the step of forming the control gate electrode in the memory circuit formation region includes the step of patterning also a conductor film for forming a gate electrode of the field-effect transistor simultaneously with the patterning of the conductor film.

43. A method for fabricating a nonvolatile semiconductor memory device, the method comprising:

a control-gate-electrode forming step of forming a first insulating film on a semiconductor substrate, patterning a conductor film formed on the first insulating film, and thereby forming a control gate electrode from the conductor film;

a second-insulating-film depositing step of depositing a second insulating film over the entire surface of the semiconductor substrate including the control gate electrode;

a protective-insulating-film forming step of selectively removing the second insulating film so as to leave a portion of the second insulating film located on that one of the side surfaces of the control gate electrode opposite to the side surface to be formed with a floating gate electrode and thereby forming, from the second insulating film, a protective insulating film for protecting the control gate electrode;

a gate-insulating-film forming step of selectively removing the first insulating film so as to remove a portion of the first insulating film underlying the control gate electrode and thereby forming a gate insulating film from the first insulating film;

a capacitance-insulating-film forming step of forming a capacitance insulating film on that one of the side surfaces of the control gate electrode to be formed with the floating gate electrode;

a tunnel-insulating-film forming step of forming a tunnel insulating film on the semiconductor substrate;

a floating-gate-electrode forming step of forming by self alignment the floating gate electrode capacitively coupled to the side surface of the control gate electrode with the capacitance insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

44. The method of claim 43, wherein the capacitance-insulating-film forming step and the tunnel-insulating-film forming step are composed of identical steps proceeding concurrently.

45. The method of claim 43, wherein the capacitance-insulating-film forming step or the tunnel-insulating-film forming step includes the step of introducing hydrogen and oxygen into a space over the heated semiconductor substrate, generating water vapor from the introduced hydrogen and oxygen over the semiconductor substrate, and thereby forming the capacitance insulating film or the tunnel insulating film.

46. The method of claim 43, wherein the second insulating film is a multilayer structure composed of a plurality of stacked insulating films having different compositions.

47. The method of claim 43, wherein the semiconductor substrate has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of:

forming the field-effect transistor in the peripheral circuit formation region after forming the source region and the drain region in the memory circuit formation region.

48. The method of claim 47, wherein the step of forming the control gate electrode in the memory circuit formation region includes the step of forming also a conductor film for forming a gate electrode of the field-effect transistor simultaneously with the formation of the conductor film on the first insulating film.

49. The method of claim 47, wherein the step of forming the control gate electrode in the memory circuit formation region includes the step of patterning also a conductor film for forming a gate electrode of the field-effect transistor simultaneously with the patterning of the conductor film.

50. A method for fabricating a nonvolatile semiconductor memory device, the method comprising:

a control-gate-electrode forming step of forming a first insulating film on a semiconductor substrate, patterning a conductor film formed on the first insulating film, and thereby forming a control gate electrode from the conductor film;

a second-insulating-film depositing step of depositing a second insulating film over the entire surface of the semiconductor substrate including the control gate electrode;

a sidewall forming step of forming sidewalls over the first insulating film and on portions of the second insulating film located on side surfaces of the control gate electrode;

a protective-insulating-film forming step of performing etching with respect to the first and second insulating films by using the sidewalls and the control gate electrode as a mask and thereby forming, from the second insulating film, a protective insulating film for protecting the control gate electrode on each of the side surfaces of the control gate electrode, while forming, from the first insulating film, a gate insulating film under the control gate electrode;

a protective-insulating-film removing step of removing the sidewalls and then selectively removing a portion of the protective insulating film located on that one of the side surfaces of the control gate electrode to be formed with a floating gate electrode;

a capacitance-insulating-film forming step of forming a capacitance insulating film on the side surface of the control gate electrode to be formed with the floating gate electrode;

a tunnel-insulating-film forming step of forming a tunnel insulating film in a region in which the semiconductor substrate is exposed;

a floating-gate-electrode forming step of forming by self alignment the floating gate electrode capacitively coupled to the side surface of the control gate electrode with the capacitance insulating film interposed therebetween and opposed to the semiconductor substrate with the tunnel insulating film interposed therebetween; and a source/drain forming step of implanting an impurity into the semiconductor substrate by using the control gate electrode and the floating gate electrode as a mask and thereby forming a source region and a drain region in the semiconductor substrate.

51. The method of claim 50, wherein the protective-insulating-film removing step includes the step of removing the sidewalls and then selectively removing respective portions of the protective insulating film covered with bottom surfaces of the sidewalls.

52. The method of claim 51, wherein the protective-insulating-film removing step includes the step of selectively removing the respective portions of the protective insulating film covered with the bottom surfaces of the sidewalls and then selectively removing respective portions of the gate insulating film covered with the bottom surfaces of the sidewalls.

53. The method of claim 50, further comprising, between the protective-insulating-film forming step and the protective-insulating-film removing step, the step of:

performing etching with respect to the semiconductor substrate by using the sidewalls as a mask and thereby forming a stepped portion to be covered up with the floating gate electrode in a region of the semiconductor substrate to be formed with the floating gate electrode.

54. The method of claim 50, wherein the capacitance-insulating-film forming step and the tunnel-insulating-film forming step are composed of identical steps proceeding concurrently.

55. The method of claim 50, wherein the capacitance-insulating-film forming step or the tunnel-insulating-film forming step includes the step of introducing hydrogen and oxygen into a space over the heated semiconductor substrate, generating water vapor from the introduced hydrogen and oxygen over the semiconductor substrate, and thereby forming the capacitance insulating film or the tunnel insulating film.

56. The method of claim 50, wherein the second insulating film is a multilayer structure composed of a plurality of stacked insulating films having different compositions.

57. The method of claim 50, wherein the semiconductor substrate has a memory circuit formation region including the source region and the drain region and a peripheral circuit formation region to be formed with a peripheral circuit containing a field-effect transistor for generating and outputting a drive signal to the control gate electrode, the floating gate electrode, the source region, or the drain region, the method further comprising the step of:

forming the field-effect transistor in the peripheral circuit formation region after forming the source region and the drain region in the memory circuit formation region.

58. The method of claim 57, wherein the step of forming the control gate electrode in the memory circuit formation region includes the step of forming also a conductor film for forming a gate electrode of the field-effect transistor simultaneously with the formation of the conductor film on the first insulating film.

59. The method of claim 57, wherein the step of forming the control gate electrode in the memory circuit formation region includes the step of patterning also a conductor film for forming a gate electrode of the field-effect transistor simultaneously with the patterning of the conductor film.

* * * * *